United States Patent
Yano et al.

(10) Patent No.: US 11,485,824 B2
(45) Date of Patent: Nov. 1, 2022

(54) THERMOSETTING SILICON-CONTAINING COMPOUND, COMPOSITION FOR FORMING A SILICON-CONTAINING FILM, AND PATTERNING PROCESS

(71) Applicant: SHIN-ETSU CHEMICAL CO., LTD., Tokyo (JP)

(72) Inventors: Toshiharu Yano, Joetsu (JP); Ryo Mitsui, Joetsu (JP); Kazunori Maeda, Joetsu (JP); Tsutomu Ogihara, Joetsu (JP); Seiichiro Tachibana, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 95 days.

(21) Appl. No.: 16/732,687

(22) Filed: Jan. 2, 2020

(65) Prior Publication Data
US 2020/0216670 A1    Jul. 9, 2020

(30) Foreign Application Priority Data
Jan. 9, 2019 (JP) .............................. JP2019-001763

(51) Int. Cl.
| | |
|---|---|
| *C08G 77/18* | (2006.01) |
| *G03F 7/075* | (2006.01) |
| *C08G 77/00* | (2006.01) |
| *C08G 77/08* | (2006.01) |
| *C08G 77/28* | (2006.01) |
| *C08L 83/06* | (2006.01) |
| *G03F 7/42* | (2006.01) |
| *H01L 21/033* | (2006.01) |

(52) U.S. Cl.
CPC ............. *C08G 77/80* (2013.01); *C08G 77/08* (2013.01); *C08G 77/18* (2013.01); *C08G 77/28* (2013.01); *C08L 83/06* (2013.01); *G03F 7/0752* (2013.01); *G03F 7/426* (2013.01); *H01L 21/0337* (2013.01)

(58) Field of Classification Search
CPC ..................................................... C08G 77/80
USPC ......................................................... 528/43
See application file for complete search history.

(56) References Cited

U.S. PATENT DOCUMENTS

| | | | | |
|---|---|---|---|---|
| 5,260,398 | A * | 11/1993 | Liao ...................... | C07F 7/0838 528/15 |
| 8,859,189 | B2 * | 10/2014 | Ogihara ................ | G03F 7/2041 430/322 |
| 2009/0136869 | A1 | 5/2009 | Ogihara et al. | |
| 2010/0003622 | A1 | 1/2010 | Matsumaru et al. | |
| 2010/0086870 | A1 | 4/2010 | Ogihara et al. | |
| 2010/0086872 | A1 | 4/2010 | Ogihara et al. | |
| 2012/0052685 | A1 | 3/2012 | Ogihara et al. | |
| 2012/0276483 | A1 | 11/2012 | Ogihara et al. | |
| 2013/0034963 | A1 | 2/2013 | Chung et al. | |
| 2013/0210236 | A1 | 8/2013 | Ogihara et al. | |
| 2013/0280912 | A1 | 10/2013 | Ogihara et al. | |
| 2015/0004791 | A1 | 1/2015 | Ogihara et al. | |
| 2015/0357204 | A1 | 12/2015 | Ogihara et al. | |
| 2016/0096978 | A1 | 4/2016 | Tachibana et al. | |
| 2016/0276152 | A1 | 9/2016 | Tachibana et al. | |

(Continued)

FOREIGN PATENT DOCUMENTS

| | | | |
|---|---|---|---|
| CN | 106398723 | A * | 2/2017 |
| CN | 111944149 | * | 11/2020 |
| EP | 2518562 | A2 | 10/2012 |

(Continued)

OTHER PUBLICATIONS

Machine translation of CN 111944149 (no date).*

(Continued)

*Primary Examiner* — Marc S Zimmer
(74) *Attorney, Agent, or Firm* — Oliff PLC

(57) ABSTRACT

A thermosetting silicon-containing compound contains one or more of structural units shown by the following general formulae (Sx-1), (Sx-2), and (Sx-3):

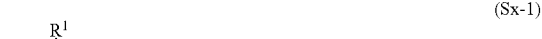

(Sx-1)

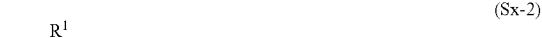

(Sx-2)

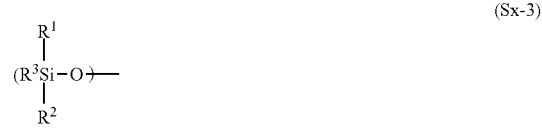

(Sx-3)

where $R^1$ represents a monovalent organic group containing both a phenyl group optionally having a substituent and a non-aromatic ring having 3 to 10 carbon atoms; and $R^2$, $R^3$ each represent the $R^1$ or a monovalent organic group having 1 to 30 carbon atoms. Thus, the present invention provides a thermosetting silicon-containing compound usable in a silicon-containing resist underlayer film material capable of achieving contradictory properties of having both alkaline developer resistance and improved solubility in an alkaline stripping liquid containing no hydrogen peroxide.

8 Claims, 1 Drawing Sheet

(56) References Cited

U.S. PATENT DOCUMENTS

| | | |
|---|---|---|
| 2017/0154766 A1 | 6/2017 | Ogihara et al. |
| 2018/0267402 A1 | 9/2018 | Hatakeyama et al. |

FOREIGN PATENT DOCUMENTS

| | | |
|---|---|---|
| JP | 2008-033174 A | 2/2008 |
| JP | 2009-126940 A | 6/2009 |
| JP | 2010-085893 A | 4/2010 |
| JP | 2010-085912 A | 4/2010 |
| JP | 2012-053253 A | 3/2012 |
| JP | 2013-167669 A | 8/2013 |
| JP | 2013-224279 A | 10/2013 |
| JP | 2015-028145 A | 2/2015 |
| JP | 2016-074774 A | 5/2016 |
| JP | 2016-177262 A | 10/2016 |
| KR | 2012-0122944 A | 11/2012 |
| KR | 2017-0062395 A | 6/2017 |
| TW | 201605770 A | 2/2016 |
| TW | 201839510 A | 11/2018 |

OTHER PUBLICATIONS

Machine translation of CN 106398723 into English (no date).*
May 15, 2020 Extended European Search Report in European Patent Application No. 20151022.9.
Jan. 19, 2021 Office Action issued in Taiwanese Patent Application No. 109100388.
Apr. 22, 2021 Office Action issued in Korean Patent Application No. 10-2020-0002584.
M. Maenhoudt et al, "Double Patterning Scheme for Sub-0.25 kl Single Damascene Structures at NA=0.75. I=193nm", Optical Microlithography XVIII, Proceedings of SPIE vol. 5754, pp. 1508-1518, 2005.
Fritze et al., "Nanofabrication with Deep-Ultraviolet Lithography and Resolution Enhancements", American Vacuum Society, J. Vac. ScI. Technol. B. 17(6). Nov./Dec. 1999.
Kono et al., "Implementation of Immersion Lithography to NAND/CMOS Device Manufacturing" Toshiba Leading Innovation, pp. 1-24, 2007.

* cited by examiner

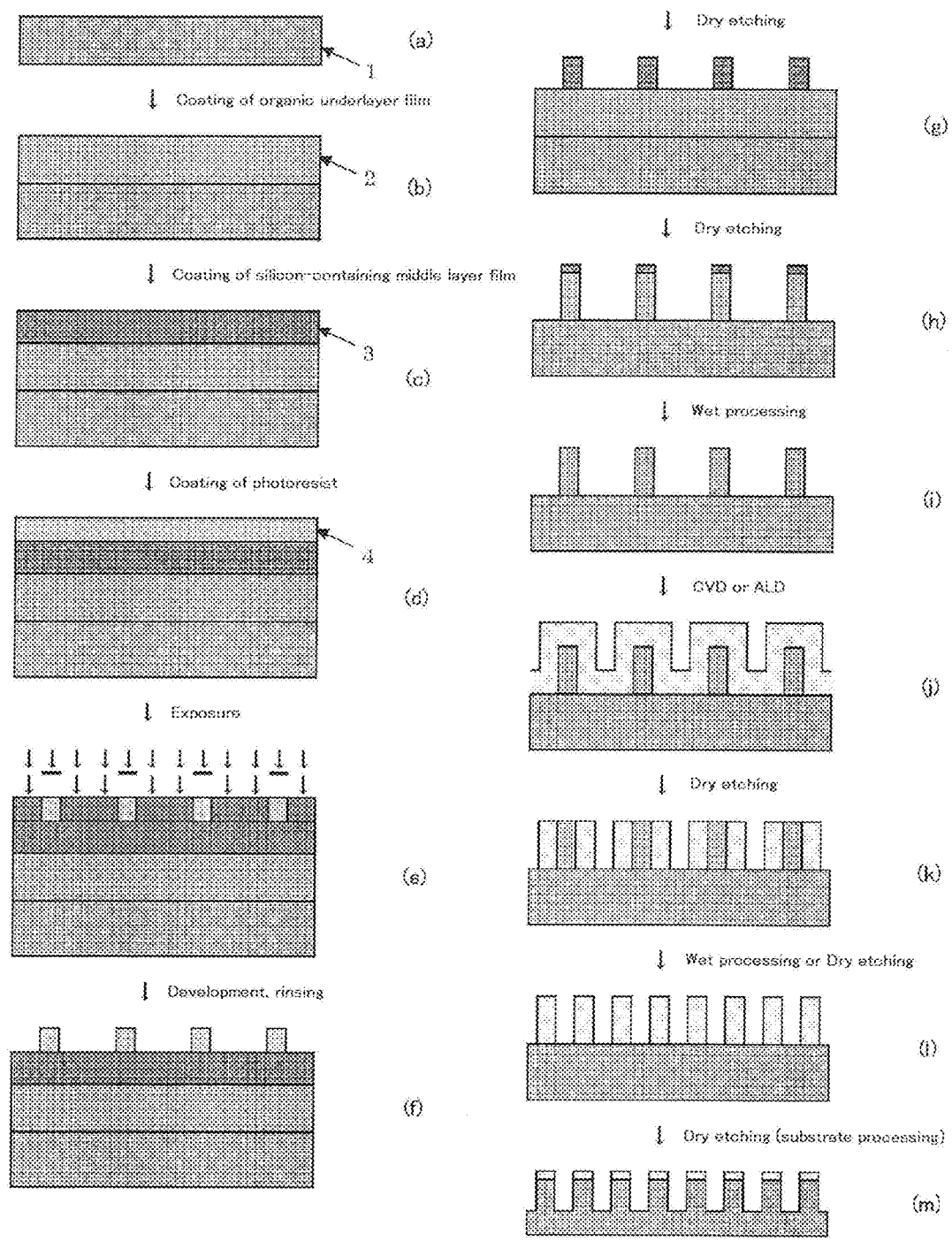

THERMOSETTING SILICON-CONTAINING COMPOUND, COMPOSITION FOR FORMING A SILICON-CONTAINING FILM, AND PATTERNING PROCESS

TECHNICAL FIELD

The present invention relates to: a thermosetting silicon-containing compound for forming a coating-type silicon-containing film used in lithography in processes of manufacturing semiconductor devices and the like; a composition containing the thermosetting silicon-containing compound; and a patterning process using this composition.

BACKGROUND ART

In photo-exposure widely employed in 1980s, a g-beam (436 nm) or an i-beam (365 nm) of a mercury lamp had been utilized as a light source of exposure light used in the resist patterning. As a means for further miniaturization, shifting to exposure light having shorter wavelength was considered effective. Hence, for the mass production processes of DRAM (Dynamic Random Access Memory) with 64 M bits (work size of 0.25 µm or less) in 1990s and later ones, a KrF excimer laser having a shorter wavelength (248 nm) has been utilized in place of the i-beam (365 nm) as the exposure light source.

However, for production of DRAMs with integration of 256 M and 1 G or more which require further finer processing technologies (work size of 0.2 µm or less), a light source having a shorter wavelength is necessary. Thus, a photolithography using an ArF excimer laser (193 nm) has been investigated seriously over a decade. At first, it was expected that the ArF lithography would be applied to the fabrication of 180 nm-node devices. However, the KrF excimer lithography was continuously employed until the mass production of 130 nm-node devices. The full-fledged application of the ArF lithography started from the 90 nm-node. Further, the mass production of 65 nm-node devices is now underway by combining the ArF lithography with a lens having an increased numerical aperture (NA) of 0.9. In pursuit of further shortening of the exposure light wavelength for the next 45 nm-node devices, $F_2$ lithography with 157 nm wavelength became a candidate. Nevertheless, there are many problems in the $F_2$ lithography: increased cost for a scanner due to use of large quantities of expensive $CaF_2$ single crystal for a projection lens; extremely poor durability of a soft pellicle, which leads to change of an optical system due to introduction of a hard pellicle; decrease in etching resistance of a resist film; and so forth. Because of these problems, development of the $F_2$ lithography was suspended, and the ArF immersion lithography was introduced.

In the ArF immersion lithography, water having a refractive index of 1.44 is introduced between a projection lens and a wafer by a partial fill method, thereby enabling high speed scanning. Thus, mass production of the 45 nm-node devices is now underway by using a lens with a NA of 1.3.

For the 32 nm-node lithography technology, lithography with a vacuum extreme-ultraviolet beam (EUV) of 13.5 nm wavelength is considered as a candidate. Problems of the EUV lithography include a higher output power of the laser, a higher sensitivity of the resist film, a higher resolution, a lower line edge roughness (LER), a non-defect MoSi laminate mask, a lower aberration of the reflective mirror, and so forth. Hence, there are innumerable problems to be solved. Development of the immersion lithography with a high refractive index, which is another candidate for the 32 nm-node, was suspended because the transmittance of LUAG, a candidate for a high-refractive-index lens, is low and because the refractive index of the liquid could not reach an aimed value of 1.8. Accordingly, in the photo exposure used as a general technology, the resolution based on the wavelength of a light source is approaching to its inherent limit.

Hence, recently, a double patterning process has drawn an attention as one miniaturization technology, in which a pattern is formed by a first photo-exposure and development; then, a pattern is formed by a second photo-exposure exactly in the space of the first pattern (Non Patent Document 1). Many processes have been proposed as double patterning methods. For example, there is a method (1) in which a photoresist pattern with a line-and-space interval of 1:3 is formed by a first photo-exposure and development; an underlying hard mask is processed by dry etching; another hard mask is formed thereon; in the space portion formed by the first photo-exposure, a line pattern is formed by photo-exposure and development for a photoresist film; and then, the hard mask is dry-etched to form a line-and-space pattern having a half width of the first pattern pitch. There is also another method (2) in which a photoresist pattern with a space-and-line interval of 1:3 is formed by a first photo-exposure and development; an underlying hard mask is processed by dry etching, and coated with a photoresist film; the remaining part of the hard mask is subjected to photo-exposure for a second space pattern; and then, the hard mask is dry-etched. In both of these methods, the hard mask is processed twice by dry etching.

In the former method, the hard mask needs to be formed twice. In the latter method, one layer of the hard mask is enough, but a trench pattern needs to be formed in which resolution is more difficult to achieve than a line pattern. Moreover, in the latter method, a negative resist material may be used to form the trench pattern. In this method, high-contrast light may be used as in a case of forming a line using a positive development pattern. However, a negative resist material has a lower dissolution contrast than a positive resist material. Thus, in comparison between a case of forming a line with a positive resist material and a case of forming a trench pattern of the same dimension with a negative resist material, the use of a negative resist material results in a lower resolution. In the latter method, a thermal flow method is applicable in which a wide trench pattern is formed using a positive resist material, and the trench pattern is then shrunk by heating the substrate; alternatively, a RELACS method is applicable in which a trench pattern after development is coated with a water-soluble film, and the trench is shrunk by heating and crosslinking of the resist film surface. These methods however have disadvantages of deterioration of a proximity bias and a low throughput due to the further complicated process.

In both of the former and latter methods, the substrate needs to be etched twice. This causes problems of lower throughput as well as pattern deformation and misalignment by the two etchings.

To perform the etching only once, there is a method in which a negative resist material is used in the first photo-exposure and a positive resist material is used in the second photo-exposure. There is another method in which a positive resist material is used in the first photo-exposure, and a negative resist material dissolved in a higher alcohol that has 4 or more carbon atoms but does not dissolve the positive resist material is used in the second photo-exposure. In these methods, the resolution is lowered due to the use of the negative resist material having a low resolution.

As another method, a method has been proposed in which patterns formed by a first photo-exposure and development are treated with a reactive metal compound to insolubilize the patterns; then, second patterns are newly formed between the first patterns by photo-exposure and development (Patent Document 1).

The most critical problem in such double patterning is the overlay accuracy of the first and the second patterns. Variation of the line dimensions depends on the magnitude of the position displacement. Thus, for example, to form 32-nm lines with 10% accuracy, the overlay accuracy within 3.2 nm is necessary. Because the overlay accuracy of a current scanner is about 8 nm, a substantial improvement in the accuracy is necessary.

Because of the overlay accuracy problem of a scanner and the difficulty to divide one pattern into two, a method is investigated by which a pitch is halved in a single photo-exposure. For example, a sidewall spacer method has been proposed in which a pitch is halved by forming films on both sides of a line pattern sidewall (Non Patent Document 2). As this sidewall spacer method, there have been proposed: a spacer space method in which a hard mask of a resist underlayer and a film embedded in a space between films attached on sidewalls of the hard mask are used as an etching pattern; and a spacer line method in which films attached on sidewalls of a hard mask of a resist underlayer are used as an etching pattern (Non Patent Document 3).

As the sidewall spacer method, another method has been proposed in which sidewalls of $SiO_2$, α-Si, α-C, or the like are formed to a core pattern by a CVD method, and then the core pattern is removed by dry etching, thereby forming the sidewall pattern, so that the pattern pitch is halved. However, in this case, the heating temperature of 150° C. or higher is necessary to form the sidewalls. Accordingly, when the resist pattern formed by photo-exposure is used as the core, the pattern is collapsed at such a high temperature; thus, the core strength is insufficient for the spacer. Hence, the smoothness of the formed pattern is poor in comparison with the original resist pattern.

Accordingly, the resulting resist pattern is not directly utilized as a core pattern. Instead, a core material made of $CVD-SiO_2$ or CVD-C is used, and the resist pattern is transferred to this core material by dry etching. Then, sidewalls are formed in the core material having the transferred pattern. Subsequently, the core material is removed, so that a pattern having a halved pattern pitch can be formed. In this event, $CVD-SiO_2$ and CVD-C have quite high strength and favorable properties as the core material. However, the sidewall spacer method with a CVD method has problems of throughput, difficulty in planarizing the substrate, and so forth.

CITATION LIST

Patent Literature

Patent Document 1: Japanese Unexamined Patent Application Publication No. 2008-33174

Non Patent Literature

Non Patent Document 1: Proc. SPIE, Vol. 5754, p. 1508 (2005)
Non Patent Document 2: J. Vac. Sci. Technol., B17 (6), November/December 1999
Non Patent Document 3: Fourth Symposium on Liquid Immersion (2007), Presentation No.: PR-01, Title: Implementation of immersion lithography to NAND/CMOS device manufacturing

SUMMARY OF INVENTION

Technical Problem

Generally, a polysiloxane compound is delaminated by washing using a fluoride ion-containing stripping liquid or an alkaline stripping liquid. So far, the present inventors have provided compositions for forming a silicon-containing resist underlayer film for 3-layer resist which have favorable wet delamination performance with an alkaline stripping liquid of ammonia hydrogen peroxide water (aqueous solution of hydrogen peroxide containing ammonia), what is called SC1, for example, in Japanese Unexamined Patent Application Publication Nos. 2010-85893, 2010-85912, 2012-53253, 2015-28145, 2016-74774, 2016-177262, and so on. Nevertheless, after dry etching, when a silicon-containing material remaining on an upper portion of an underlayer film pattern is removed with SC1, the yield is sometimes decreased due to deterioration of a substrate by hydrogen peroxide, depending on the substrate material. For this reason, the materials of the silicon-containing resist underlayer film desirably have high release characteristics even with a stripping liquid containing no hydrogen peroxide. Similarly, regarding a fluoride ion-containing stripping liquid also, substrate materials that may be corroded with a fluoride ion-containing stripping liquid cannot be used, so that the process application range is narrow.

Hence, there have been demands for a material having high release characteristics with an alkaline stripping liquid containing no hydrogen peroxide. To meet the demands, the present inventors have conducted numerous studies and found a phenomenon in which an improvement in the release characteristics with an alkaline stripping liquid without applying hydrogen peroxide increases the solubility in an alkaline developer used in the development of an upper layer resist, consequently stripping off the resist pattern from a resist underlayer film.

An object of the present invention is to provide a thermosetting silicon-containing compound which is usable in a material for forming a silicon-containing film, and which enables the material to have contradictory properties of alkaline developer resistance and improved solubility in an alkaline stripping liquid containing no hydrogen peroxide; and a composition for forming a silicon-containing film and a patterning process which use the thermosetting silicon-containing compound.

Solution to Problem

To achieve the object, the present invention provides a thermosetting silicon-containing compound comprising one or more of structural units shown by the following general formulae (Sx-1), (Sx-2), and (Sx-3):

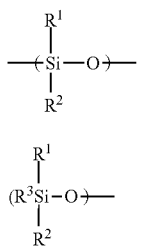
(Sx-2)

(Sx-3)

wherein $R^1$ represents a monovalent organic group containing both a phenyl group optionally having a substituent, and a non-aromatic ring having 3 to 10 carbon atoms; and $R^2$ and $R^3$ each represent the $R^1$ or a monovalent organic group having 1 to 30 carbon atoms.

Such a thermosetting silicon-containing compound is usable in a composition for forming a silicon-containing film such that the resulting silicon-containing resist middle layer film (underlayer film) material is capable of achieving contradictory properties of having both alkaline developer resistance and improved solubility in an alkaline stripping liquid containing no hydrogen peroxide.

The $R^1$ is preferably a monovalent organic group shown by the following general formula (Sx-R1):

(Sx-R1)

wherein $R^{11}$ represents a single bond or any of structures shown by the following formula (1); $R^{12}$ represents any of structures having rings shown by the following formula (2); $R^{13}$ represents a single bond or any of structures shown by the following formula (3); $R^{14}$ represents a single bond or any of structures shown by the following formula (4); $R^{15}$ represents a phenyl group optionally having a substituent; given that when both $R^{13}$ and $R^{14}$ are single bonds, $R^{15}$ is directly bonded to $R^{12}$; when $R^{14}$ is a single bond, a part of $R^{13}$ bonded to $R^{15}$ is only a carbon atom (but not carbon of a carbonyl group) or a silicon atom,

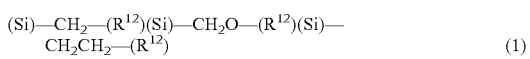
(1)

wherein (Si) and ($R^{12}$) do not constitute $R^{11}$,

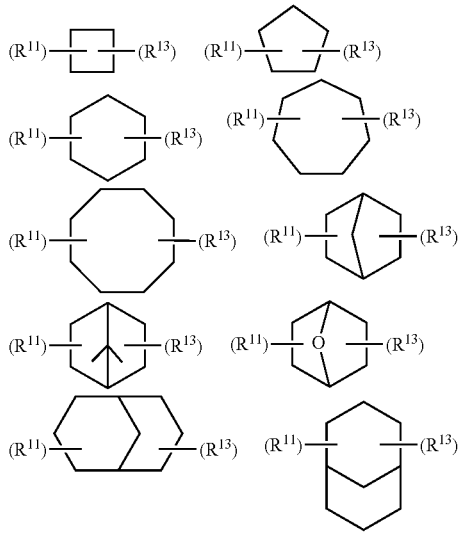
(2)

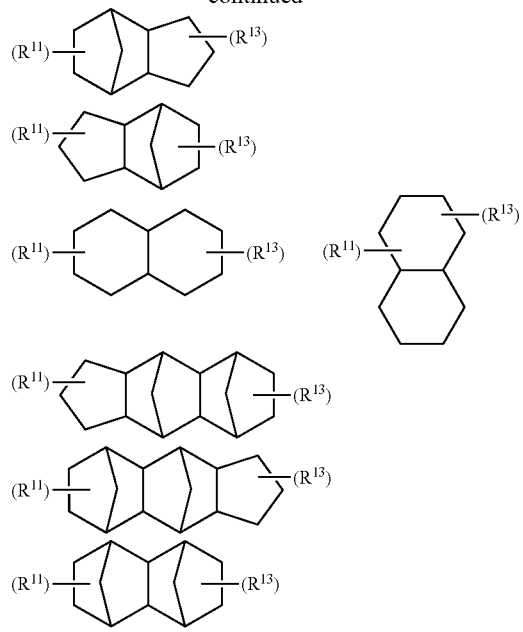

wherein ($R^{11}$) and ($R^{13}$) do not constitute $R^{12}$,

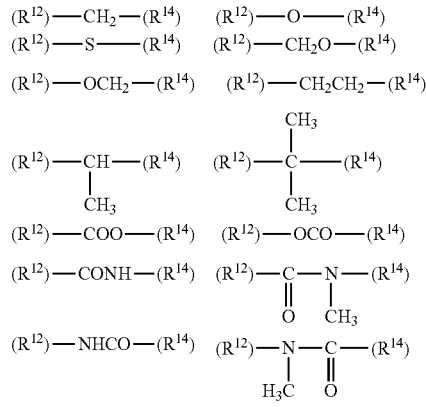
(3)

wherein ($R^{12}$) and ($R^{14}$) do not constitute $R^{13}$, and

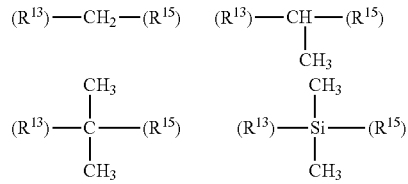
(4)

wherein ($R^{13}$) and ($R^{15}$) do not constitute $R^{14}$.

Such a structure makes it possible to further enhance the effects of the present invention.

Moreover, the present invention provides a composition for forming a silicon-containing film, comprising:
the above-described thermosetting silicon-containing compound; and
a crosslinking catalyst.

Such a composition containing the inventive thermosetting silicon-containing compound is a silicon-containing resist middle layer film (underlayer film) material capable of achieving contradictory properties of having both alkaline developer resistance and improved solubility in an alkaline stripping liquid containing no hydrogen peroxide.

Here, the crosslinking catalyst is preferably a sulfonium salt, an iodonium salt, a phosphonium salt, an ammonium salt, an alkaline metal salt, or a polysiloxane having a structure partially containing any of a sulfonium salt, an iodonium salt, a phosphonium salt, and an ammonium salt.

In the inventive composition for forming a silicon-containing film, such crosslinking catalysts are usable.

Preferably, the inventive composition for forming a silicon-containing film further comprises at least one compound shown by the following general formula (P-0):

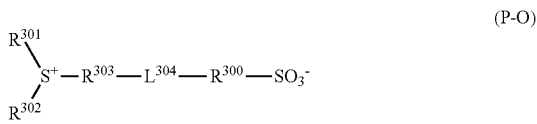

wherein $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom; $R^{303}$ represents a linear, branched, or cyclic divalent hydrocarbon group having 1 to 20 carbon atoms optionally substituted with a hetero atom or optionally containing a hetero atom; $R^{301}$ and $R^{302}$, or $R^{301}$ and $R^{303}$, are optionally bonded to each other to form a ring with a sulfur atom in the formula; and $L^{304}$ represents a single bond or a linear, branched, or cyclic divalent hydrocarbon group having 1 to 20 carbon atoms optionally substituted with a hetero atom or optionally containing a hetero atom.

In this case, the compound shown by the general formula (P-0) is preferably a compound shown by the following general formula (P-1):

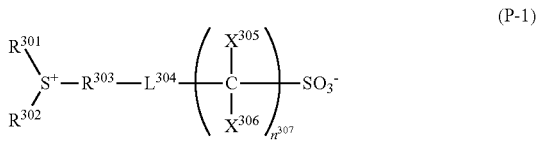

wherein $X^{305}$ and $X^{306}$ each independently represent a hydrogen atom, a fluorine atom, or a trifluoromethyl group, but not all of $X^{30}$'s and $X^{306}$'s are hydrogen atoms simultaneously; $n^{307}$ represents an integer of 1 to 4; and $R^{301}$, $R^{302}$, $R^{303}$, and $L^{304}$ are as defined above.

An acid generator as described above in combination with the inventive thermosetting silicon-containing compound can make a silicon-containing resist middle layer film (underlayer film) which is capable of contributing to the formation of an upper layer resist having a rectangular cross section without degrading the solubility in an alkaline stripping liquid.

Moreover, the present invention provides a patterning process comprising steps of:
(1) forming on a body to be processed, an organic underlayer film, a silicon-containing middle layer film made from the above-described composition for forming a silicon-containing film thereon, and further an upper layer resist film thereon;
(2) subjecting the upper layer resist film to exposure and development to form an upper layer resist pattern;
(3) transferring the upper layer resist pattern to the silicon-containing middle layer film by dry etching using the upper layer resist pattern as a mask, and further transferring the upper layer resist pattern to the organic underlayer film by dry etching using the silicon-containing middle layer film having the transferred upper layer resist pattern as a mask while a portion of the silicon-containing middle layer film is left on an upper portion of the organic underlayer film to form an organic underlayer film pattern;
(4) removing the silicon-containing middle layer film remaining on the upper portion of the organic underlayer film pattern with a stripping liquid;
(5) forming an inorganic silicon film made of polysilicon, amorphous silicon, silicon oxide, silicon nitride, silicon oxynitride, silicon carbide, or a composite material thereof by a CVD method or an ALD method to cover the organic underlayer film pattern;
(6) removing a portion of the inorganic silicon film by dry etching to expose the upper portion of the organic underlayer film pattern; and
(7) removing the organic underlayer film pattern to form an inorganic silicon film pattern whose pattern pitch is ½ of that of the upper layer resist pattern.

The inventive composition for forming a silicon-containing film can be used in such a patterning process.

Additionally, in the step (4), the stripping liquid preferably contains one or both of a fluoride ion and a nitrogen-containing cation.

Moreover, the body to be processed is preferably a semiconductor device substrate, or the semiconductor device substrate coated with a metal film, an alloy film, a metal carbide film, a metal oxide film, a metal nitride film, a metal oxycarbide film, or a metal oxynitride film.

Further, the metal of the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

The inventive patterning process may be methods as described above.

Advantageous Effects of Invention

In the silicon-containing resist middle layer film (underlayer film) having an alicyclic structure obtained by using the inventive composition for forming a silicon-containing film, the alicyclic structure prevents a developing solution from intruding between the resist pattern and the silicon-containing resist middle layer film, making it possible to prevent the resist pattern from collapsing. Further, there is another feature as follows. Specifically, after the pattern is transferred to the middle layer film, the resulting silicon-containing middle layer film is porous because the alicyclic structure in the silicon-containing middle layer film is removed by dry etching. This porosity can facilitate the delamination removal even with a diluted alkaline stripping liquid.

Furthermore, high etching selectivity is obtained between the silicon-containing middle layer film obtained from the inventive composition for forming a silicon-containing film and an organic material, so that a photoresist pattern to be formed can be successively transferred from the silicon-containing middle layer film to an organic underlayer film or CVD organic hard mask by dry etching process. Particularly, as the semiconductor-device manufacturing process progresses toward miniaturization recently, a photoresist film tends to be formed thinner to prevent pattern collapse after development, thereby making it difficult to transfer a pattern to a resist underlayer film. In contrast, the use of the inventive composition for forming a silicon-containing film makes it possible to suppress deformation of a photoresist pattern during dry etching and transfer this pattern to a substrate with high precision, even when a thin photoresist film is used as an etching mask.

BRIEF DESCRIPTION OF DRAWINGS

FIG. 1 is a schematic illustration showing an example of a patterning process according to the present invention.

DESCRIPTION OF EMBODIMENTS

As described above, it has been desired to develop: a thermosetting silicon-containing compound which is usable in a material for forming a silicon-containing film and which enables the material to have contradictory properties of alkaline developer resistance and improved solubility in an alkaline stripping liquid containing no hydrogen peroxide; and a composition for forming a silicon-containing film and a patterning process which use the thermosetting silicon-containing compound.

The present inventors have earnestly studied to achieve the above object and consequently found that introducing an alicyclic structure into a conventional silicon-containing resist middle layer film (underlayer film) can achieve solubility in an alkaline stripping liquid containing no hydrogen peroxide after dry etching, while ensuring the resistance to an alkaline developer.

Specifically, it is speculated that an upper layer resist pattern is stripped off during photo-exposure by a developing solution that intrudes between the upper layer resist pattern and a silicon-containing middle layer film. Hence, to prevent a developing solution from intruding at the interface between the resist pattern and the middle layer film during the exposure and development, an alicyclic structure has been introduced. Thereby, the hydrophobic nature of the alicyclic structure suppresses the intrusion of a developing solution, making it possible to form a resist pattern having favorable adhesiveness. Meanwhile, after the pattern is transferred to an organic underlayer film, the alicyclic structure, which is an organic component of the silicon-containing middle layer film, has been removed by a dry etching gas against the organic underlayer film. After the removal, fine pores derived from the alicyclic structure are formed in the silicon-containing middle layer film. These pores exhibit an effect of increasing the surface area of the silicon-containing middle layer film, and accelerate the contact with an alkaline stripping liquid, thereby enabling improvement of the release performance. These findings have led to the completion of the present invention.

Specifically, the present invention is a thermosetting silicon-containing compound comprising one or more of structural units shown by the following general formulae (Sx-1), (Sx-2), and (Sx-3):

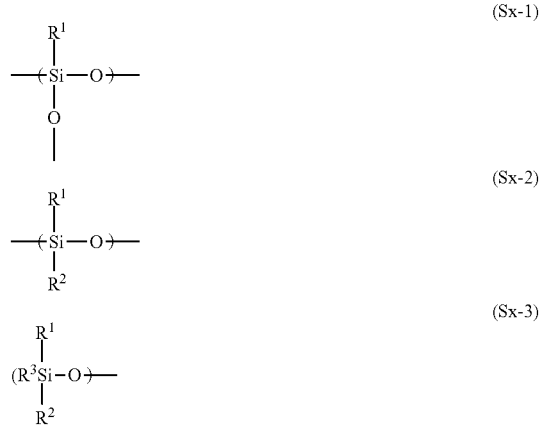

wherein $R^1$ represents a monovalent organic group containing both a phenyl group optionally having a substituent, and a non-aromatic ring having 3 to 10 carbon atoms; and $R^2$ and $R^3$ each represent the $R^1$ or a monovalent organic group having 1 to 30 carbon atoms.

Hereinafter, the present invention will be described in detail, but the present invention is not limited thereto.

<Thermosetting Silicon-Containing Compound>

The inventive thermosetting silicon-containing compound contains one or more of structural units shown by the general formulae (Sx-1), (Sx-2), and (Sx-3). Moreover, in the general formulae (Sx-1), (Sx-2), and (Sx-3), $R^1$ is preferably a monovalent organic group shown by the following general formula (Sx-R1).

$$—R^1=—R^{11}-R^{12}-R^{13}-R^{14}-R^{15} \quad (Sx\text{-}R1)$$

In the formula, $R^{11}$ represents a single bond or any of structures shown by the following formula (1); $R^{12}$ represents any of structures having rings shown by the following formula (2); $R^{13}$ represents a single bond or any of structures shown by the following formula (3); $R^{14}$ represents a single bond or any of structures shown by the following formula (4); and $R^{15}$ represents a phenyl group optionally having a substituent. Nevertheless, when both $R^{13}$ and $R^{14}$ are single bonds, $R^{15}$ is directly bonded to $R^{12}$; when $R^{14}$ is a single bond, a part of $R^{13}$ bonded to $R^{15}$ is only a carbon atom (but not carbon of a carbonyl group) or a silicon atom.

In this formula, (Si) and ($R^{12}$) do not constitute $R^{11}$.

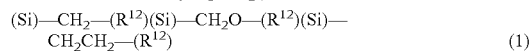

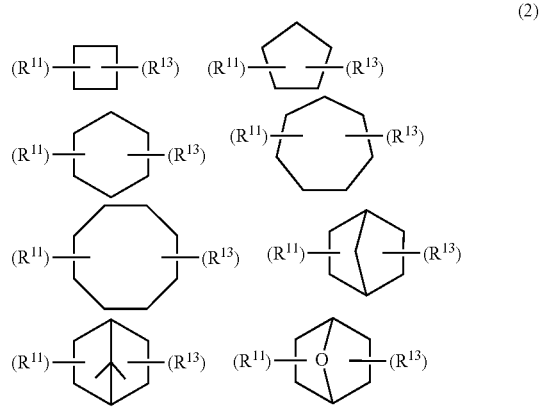

-continued

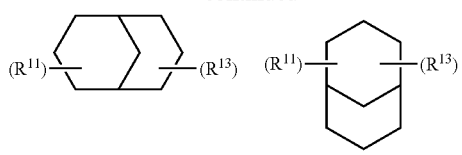
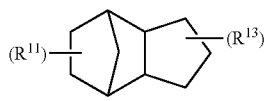
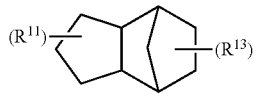
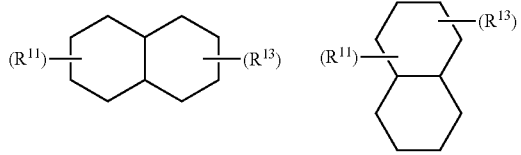
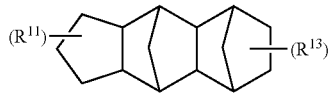
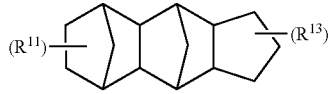
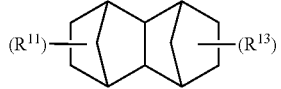

In this formula, $(R^{11})$ and $(R^{13})$ do not constitute $R^{12}$.

(3)

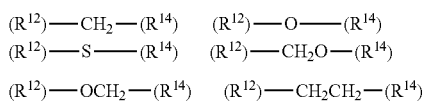
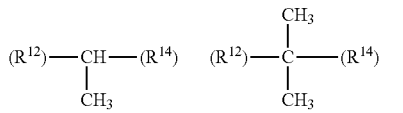
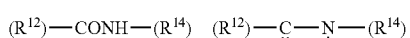
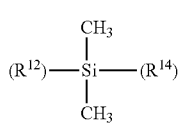

In this formula, $(R^{12})$ and $(R^{14})$ do not constitute $R^{13}$.

(4)

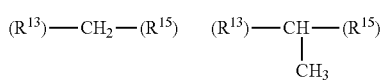

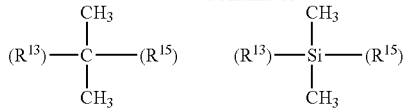

In this formula, $(R^{13})$ and $(R^{15})$ do not constitute $R^4$.

Moreover, in the general formula (Sx-R1), $R^{15}$ is not particularly limited as long as it is a phenyl group optionally having a substituent, but preferably has any of the following structures, for example.

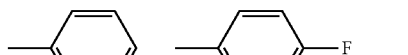
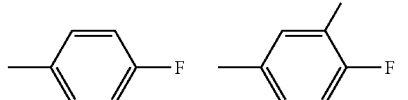
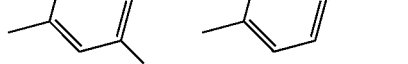
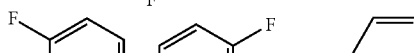
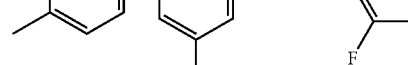
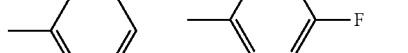
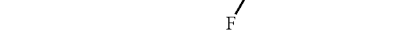

In the inventive thermosetting silicon-containing compound, examples of the monovalent organic group $R^1$ in (Sx-1), (Sx-2), and (Sx-3) include structures of the following formulae.

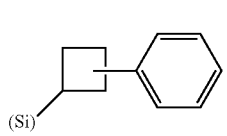
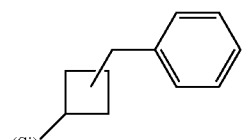
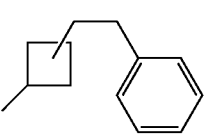
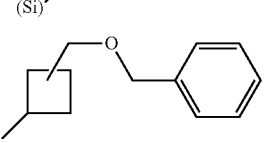
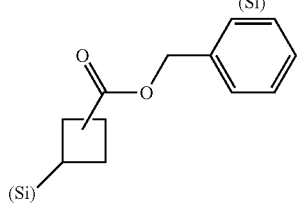

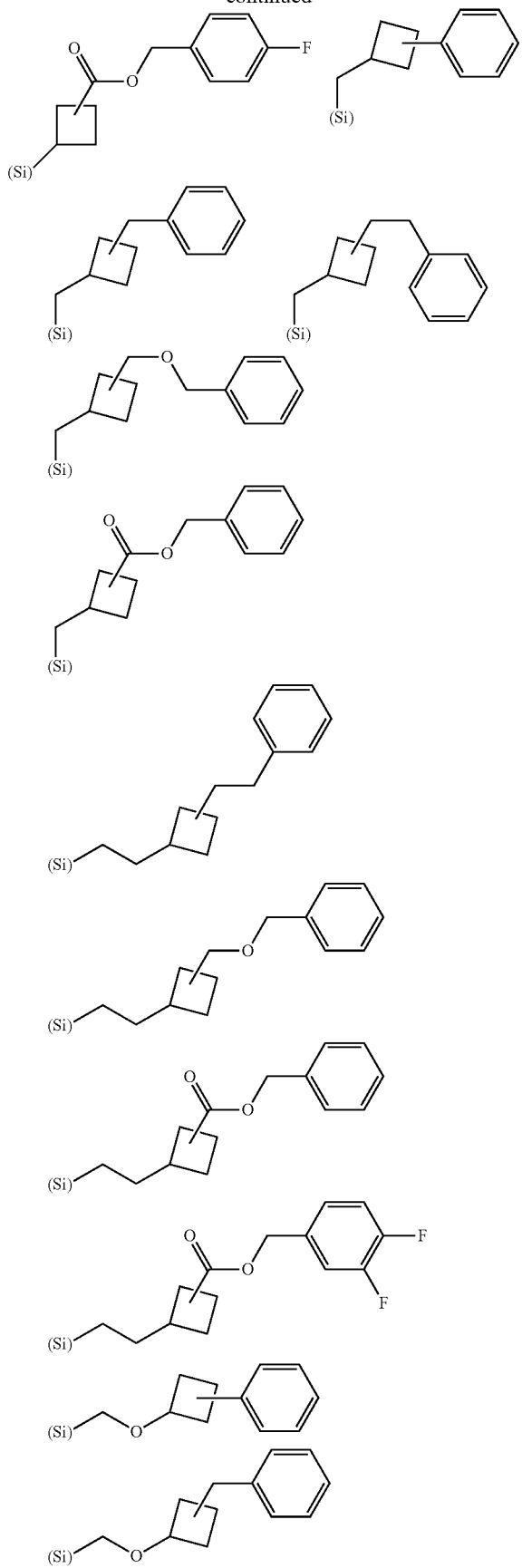
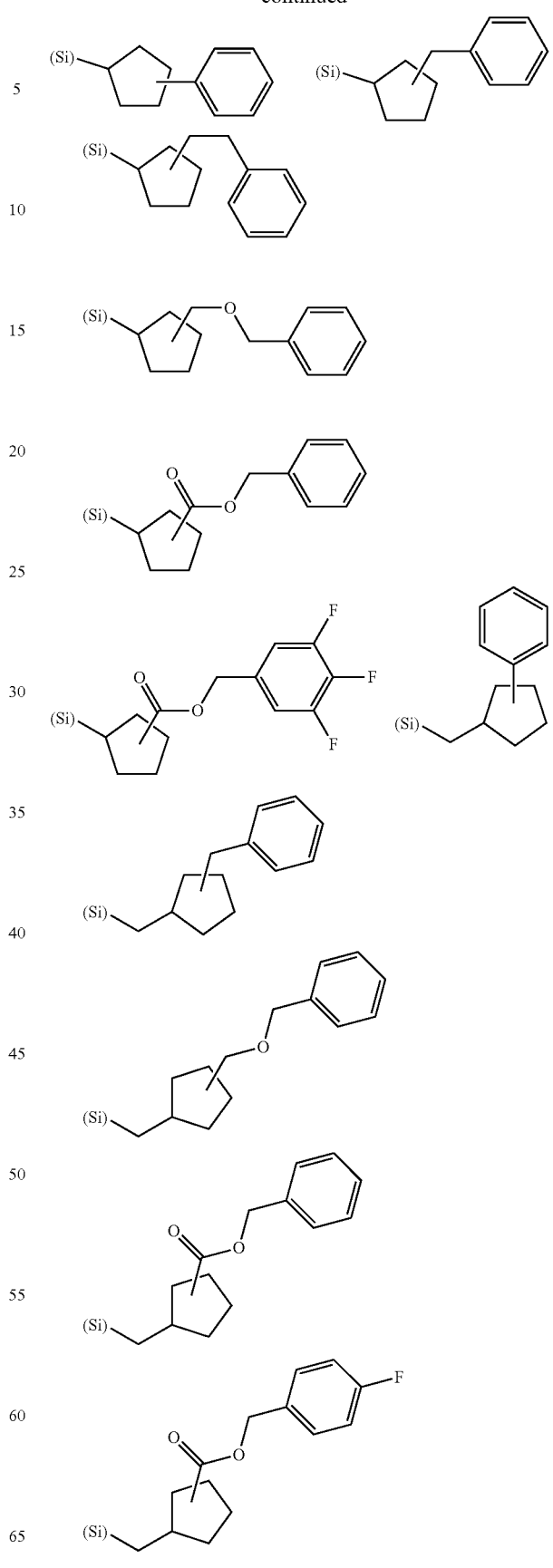

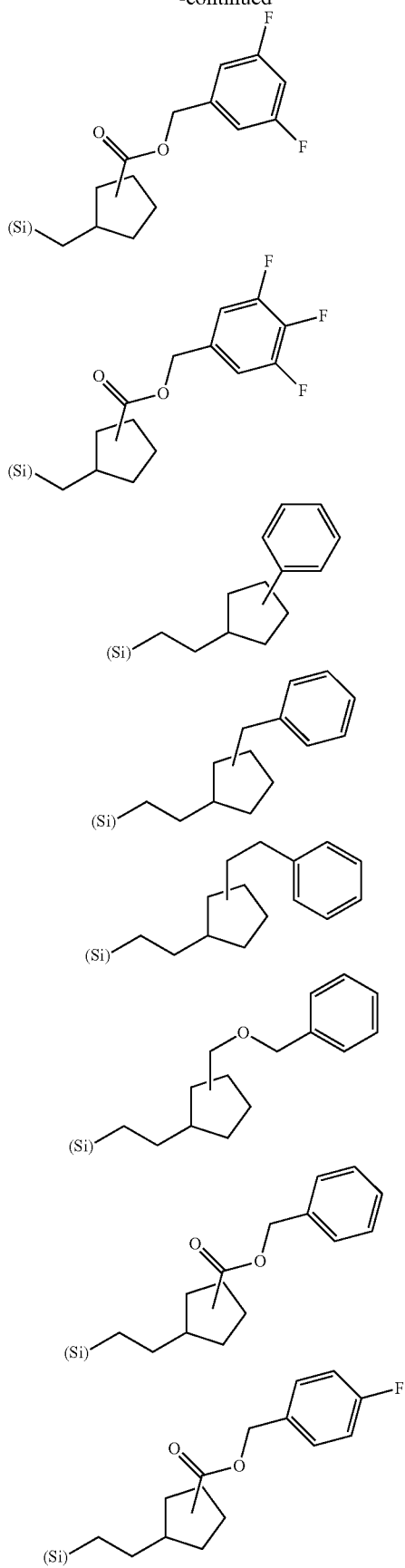
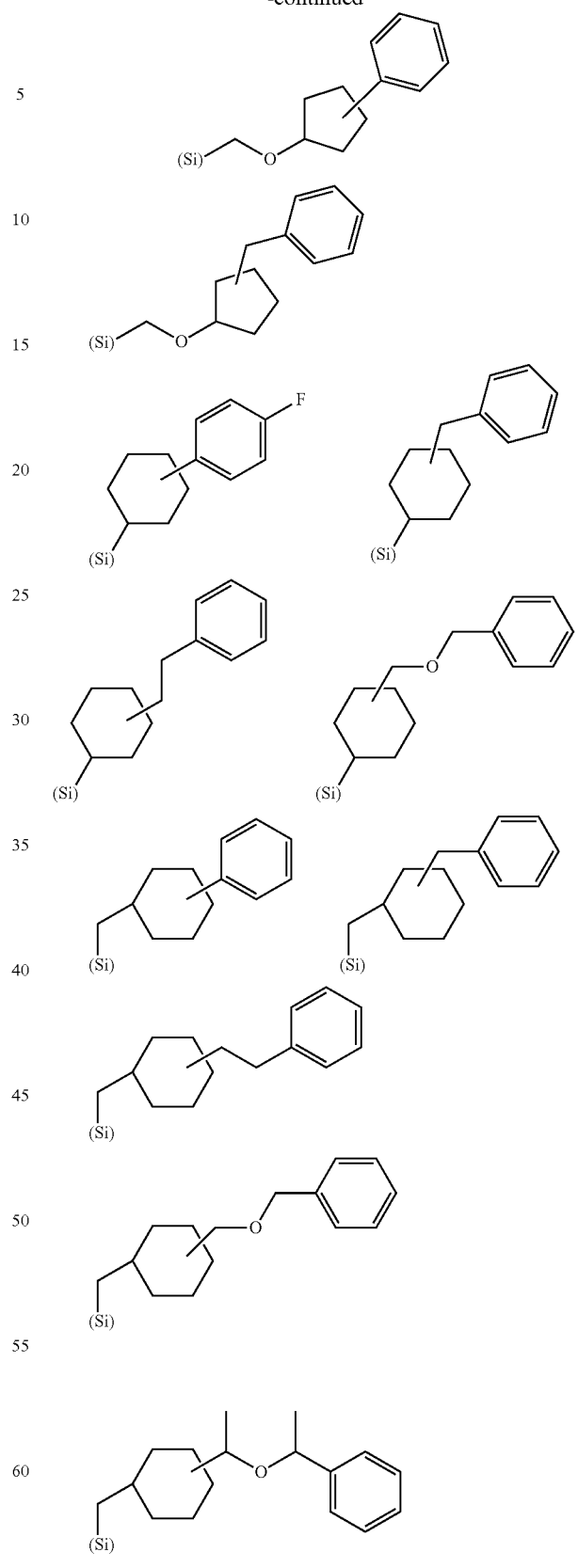
In these formulae, (Si) is depicted to show a bonding position, and does not constitute $R^1$.

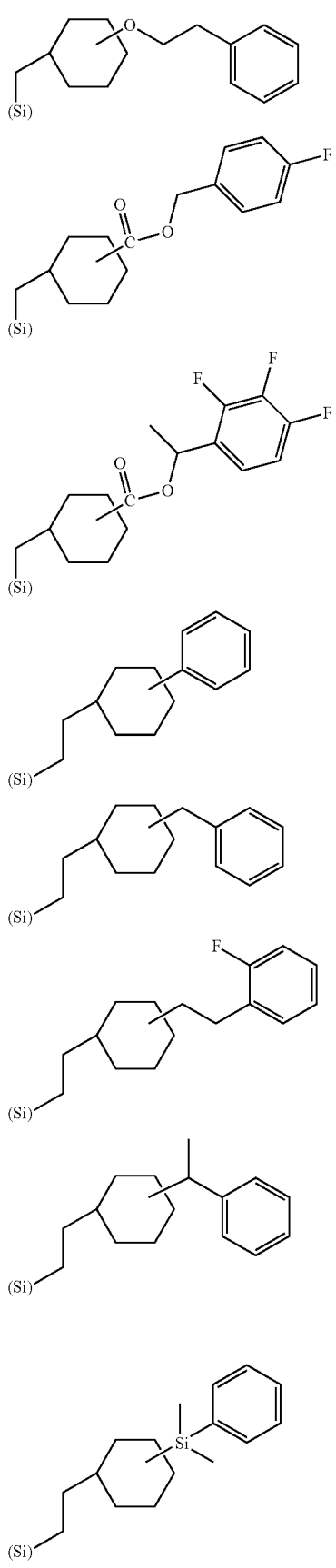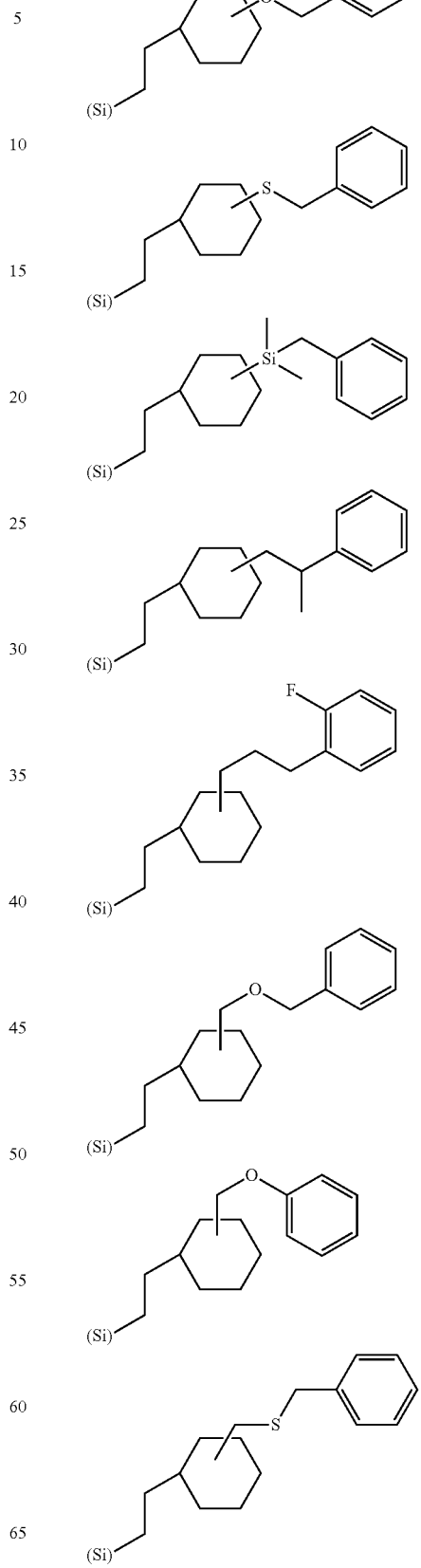

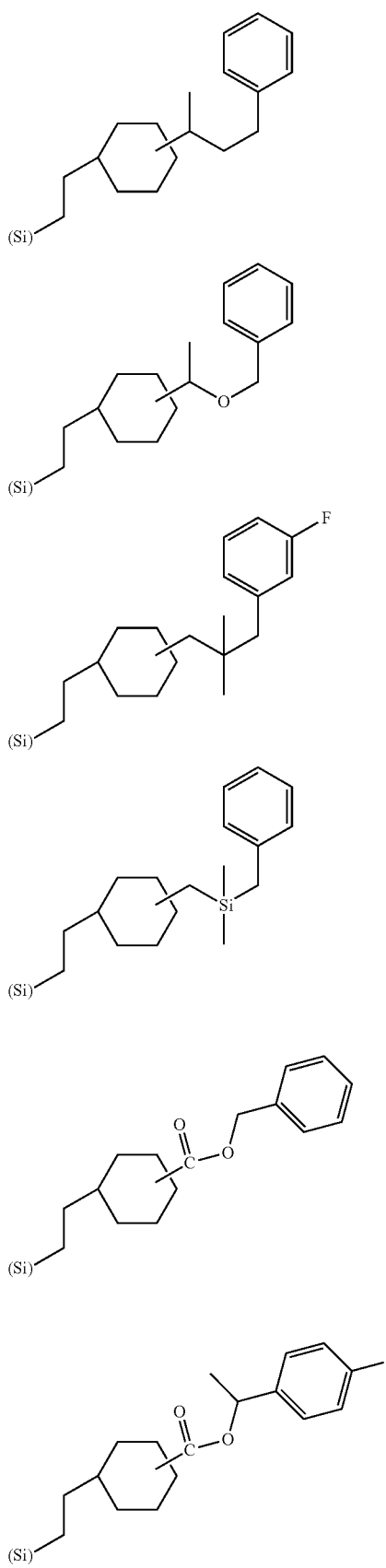
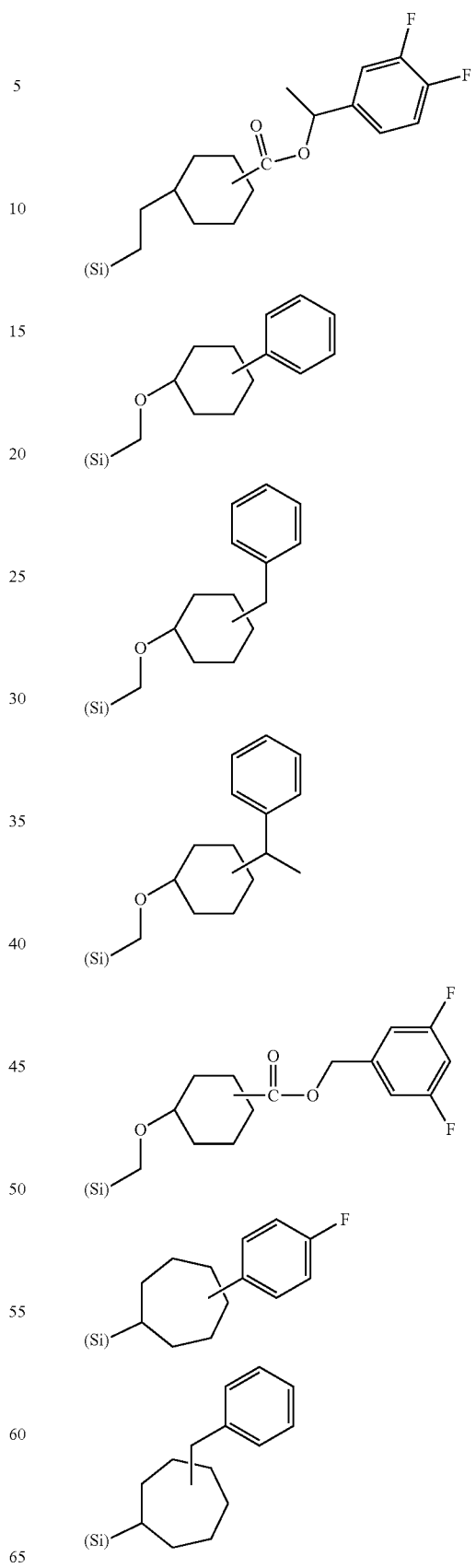

-continued
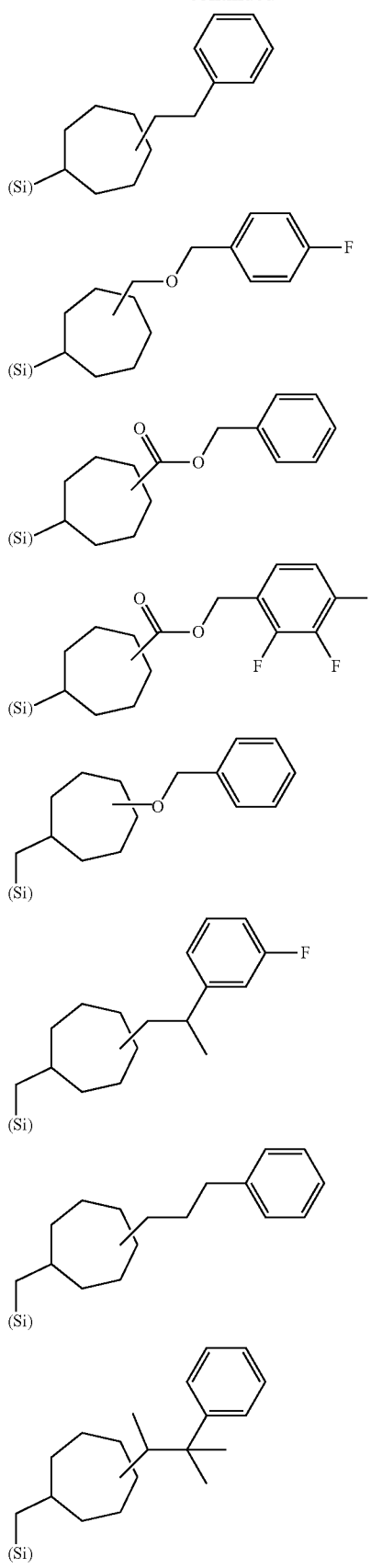
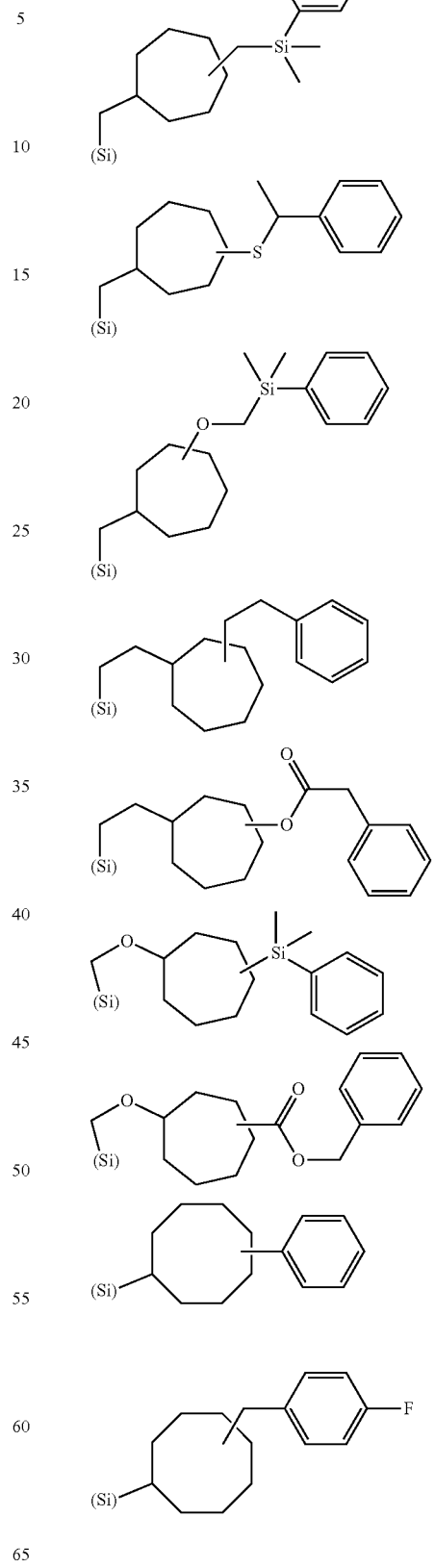
In these formulae, (Si) is depicted to show a bonding position, and does not constitute $R^1$.

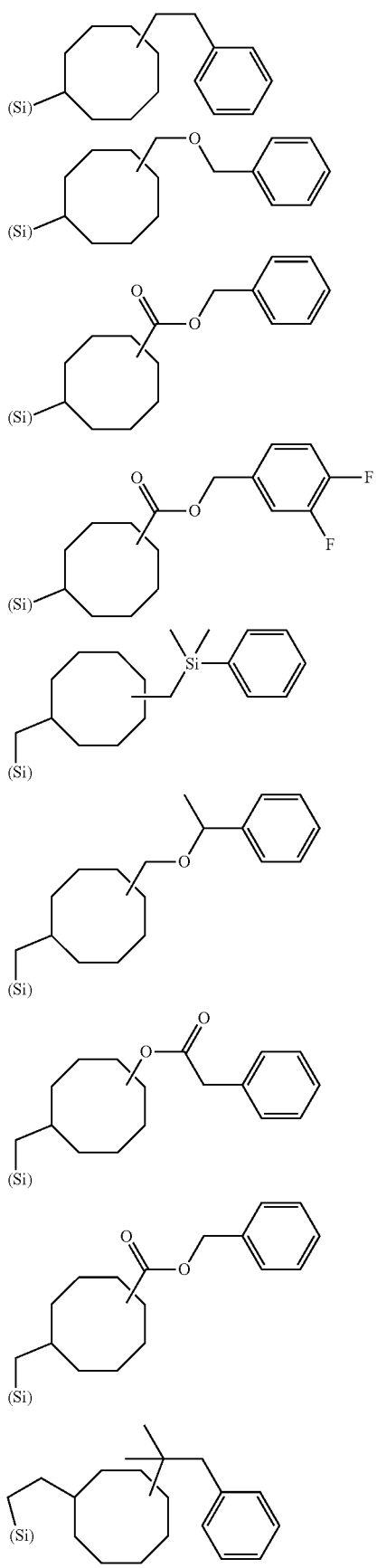
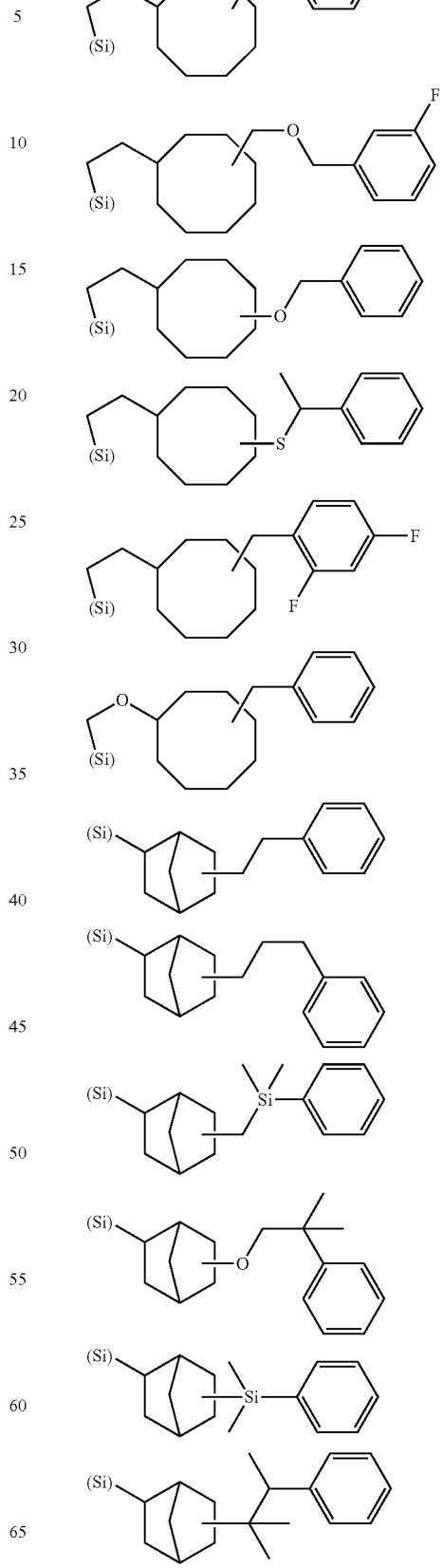

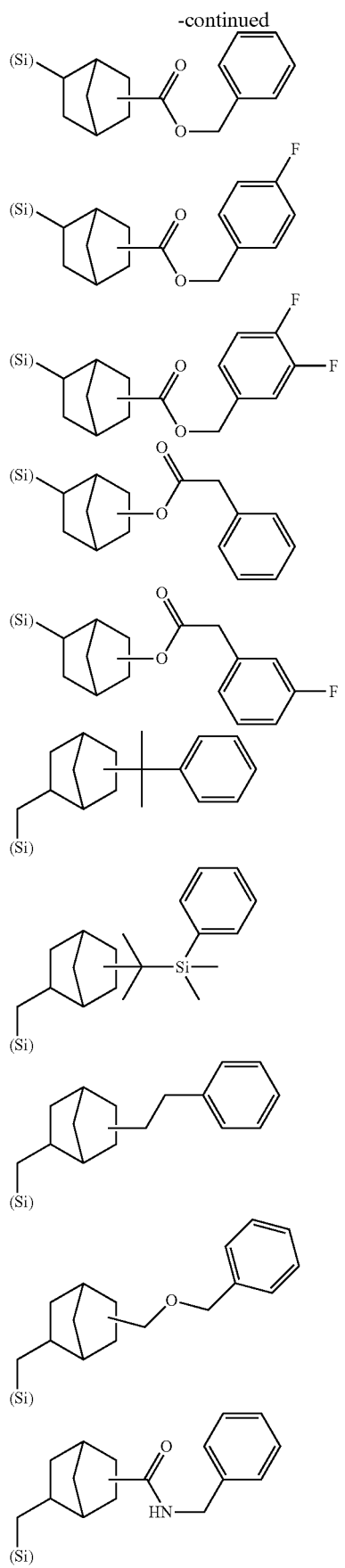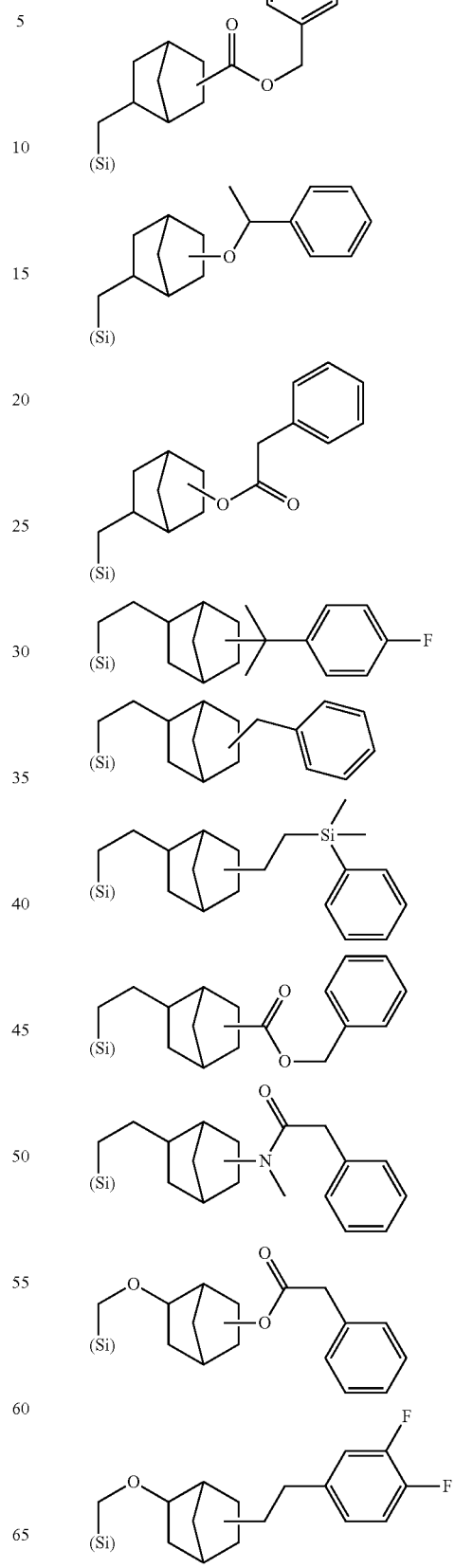

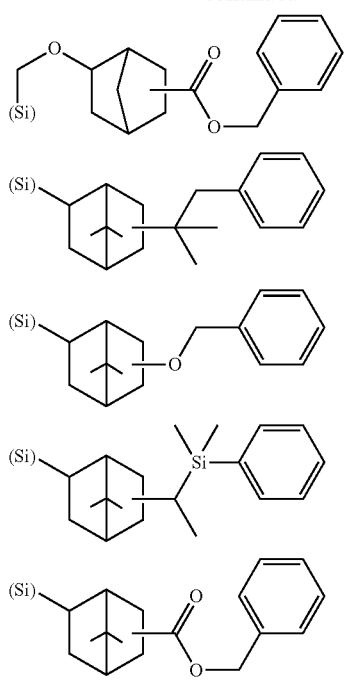
In these formulae, (Si) is depicted to show a bonding position, and does not constitute R[1].
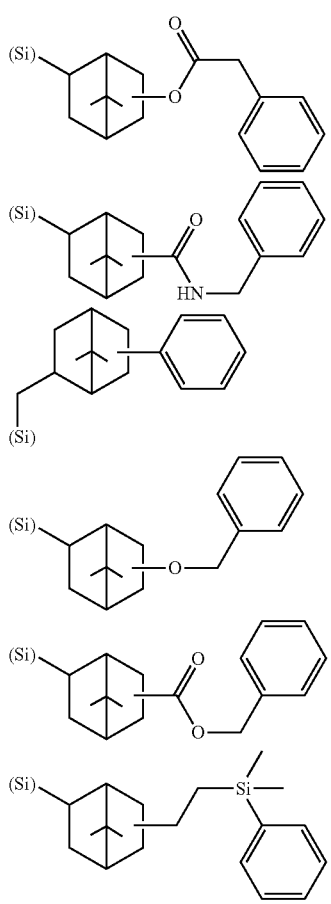
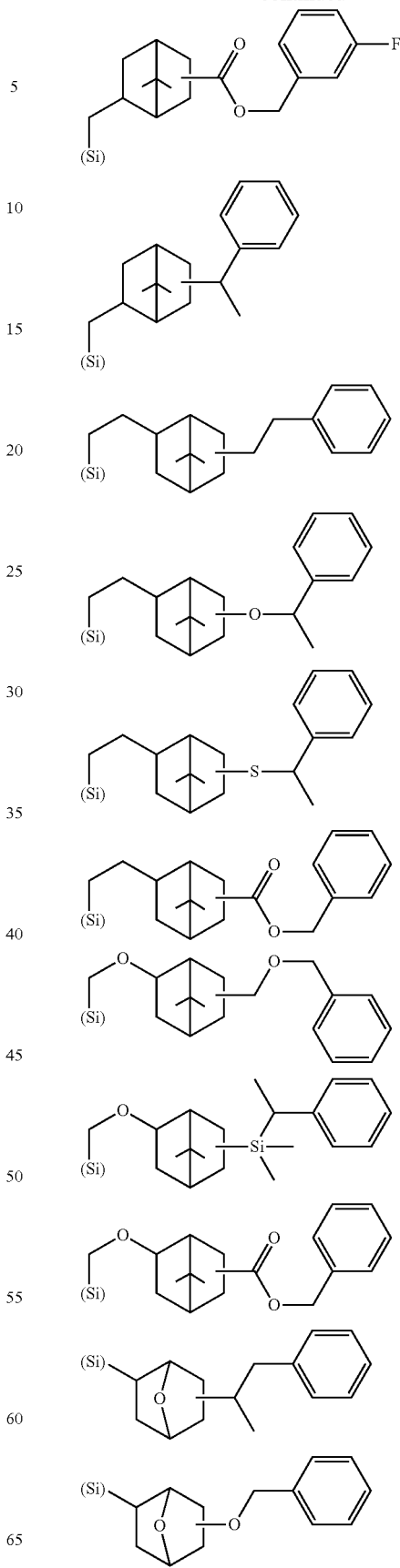

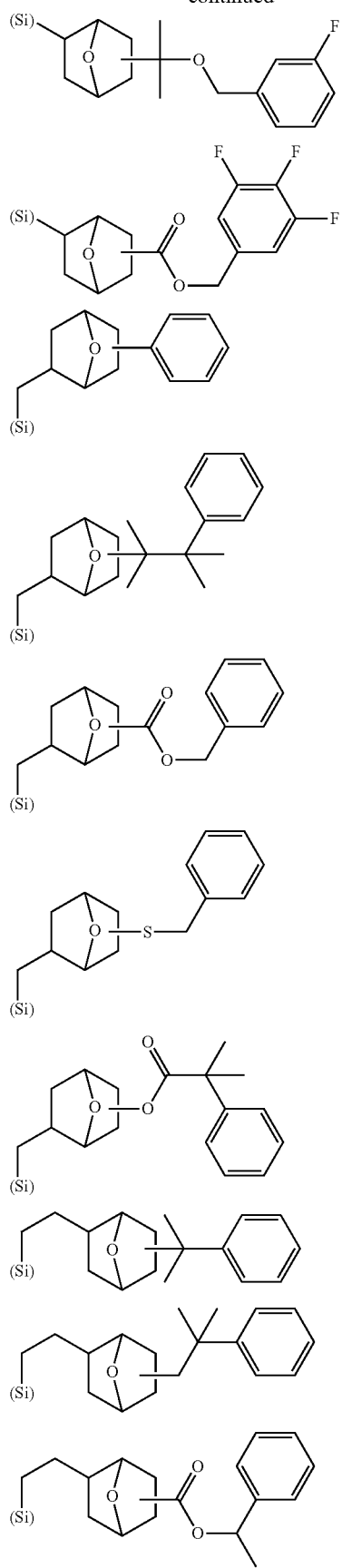
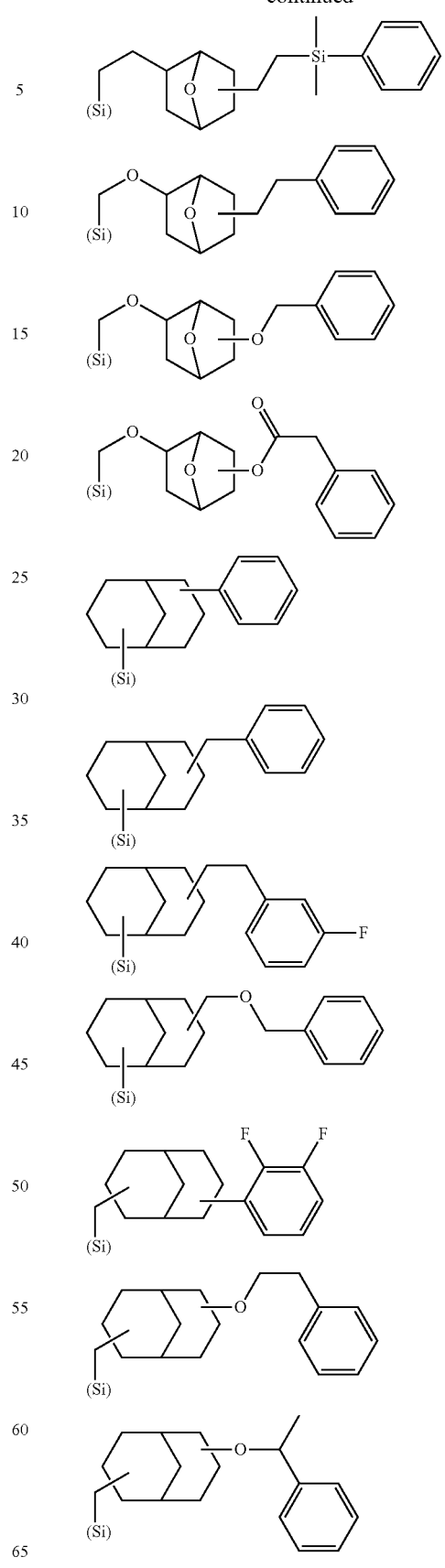

-continued
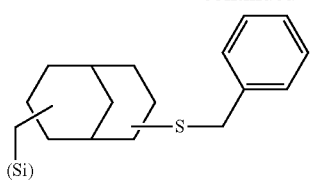
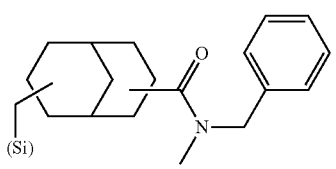
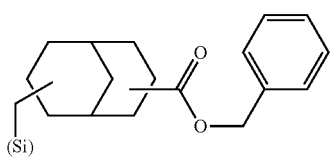
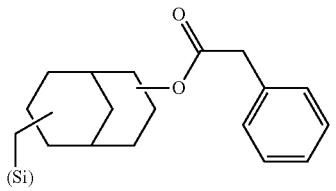
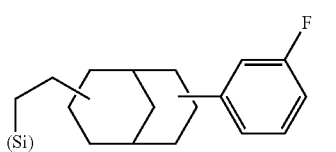
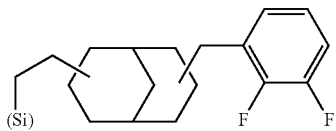
In these formulae, (Si) is depicted to show a bonding position, and does not constitute $R^1$.
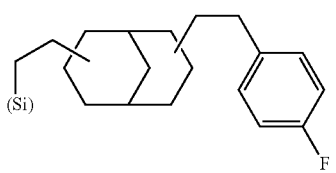
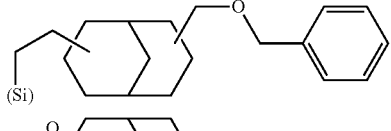
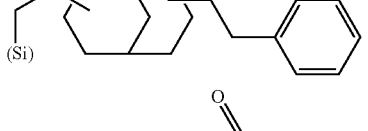
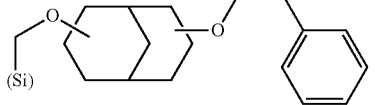
-continued
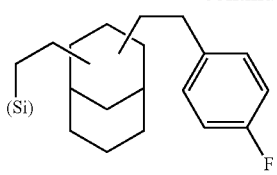
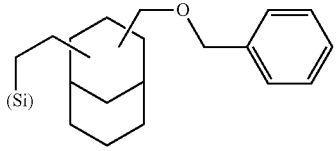
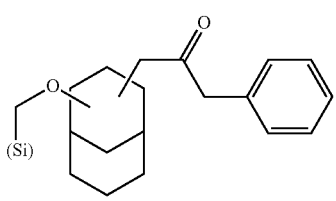
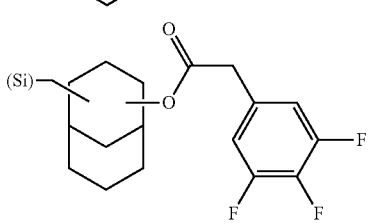
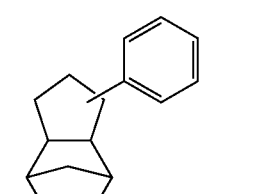
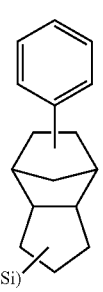

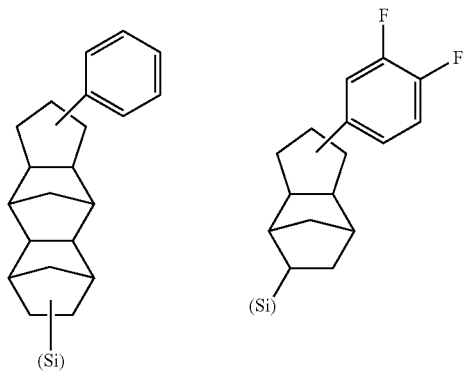
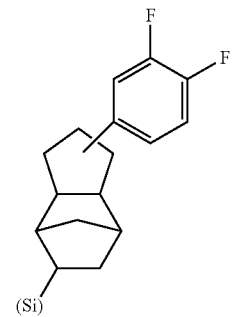
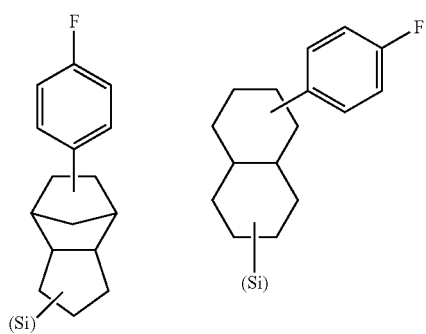
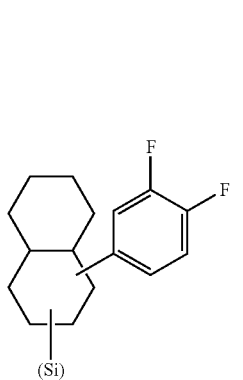
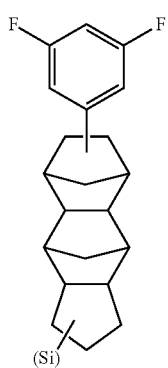
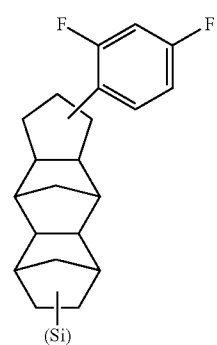
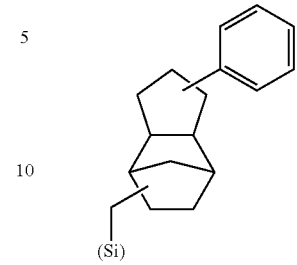
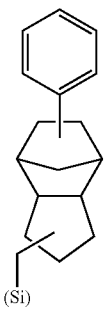
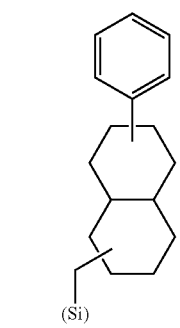
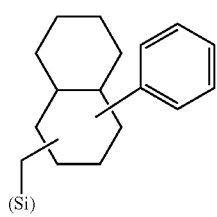
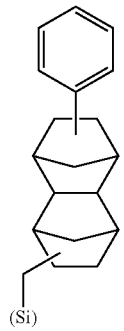
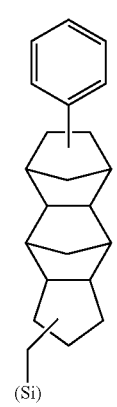
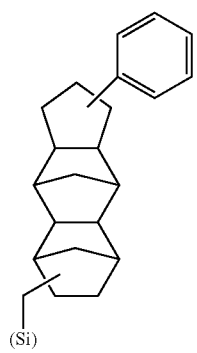
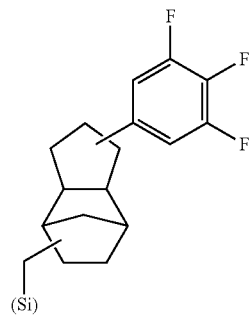

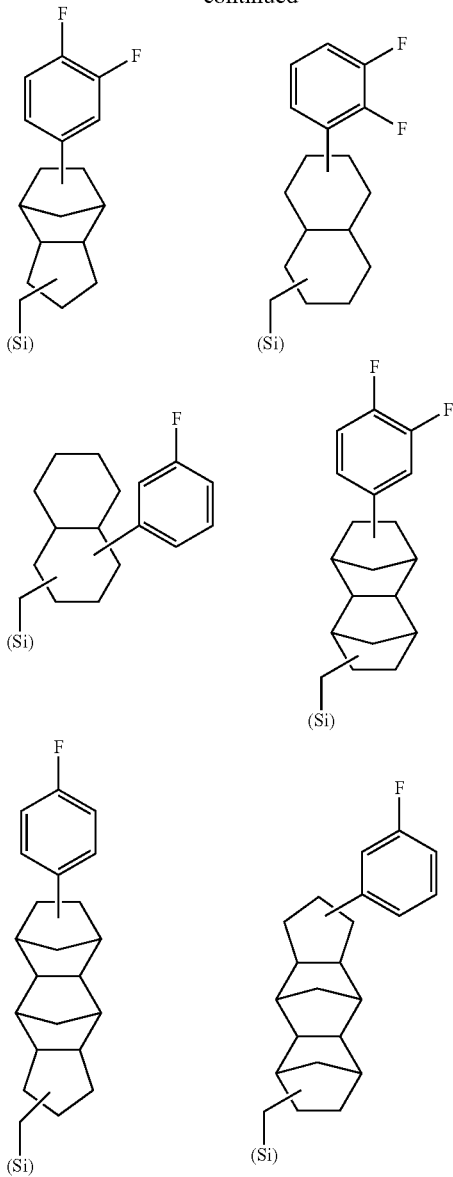

In these formulae, (Si) is depicted to show a bonding position, and does not constitute $R^1$.

A hydrolysable monomer used as a raw material for forming the inventive thermosetting silicon-containing compound is not particularly limited as long as the structural units shown by (Sx-1) to (Sx-3) can be formed. Specifically, the hydrolysable monomer has, on a silicon atom, the foregoing $R^1$ and a hydrolysable group(s) of one, two, or three among chlorine, bromine, iodine, an acetoxy group, a methoxy group, an ethoxy group, a propoxy group, a butoxy group, and so forth; further, the hydrolysable monomer may have a monovalent organic group(s) having 1 to 30 carbon atoms as $R^2$ and/or $R^3$ on the silicon atom.

Further, the inventive thermosetting silicon-containing compound (Sx) can be produced by hydrolysis condensation of the aforementioned hydrolysable monomer, or optionally a mixture thereof containing the following hydrolysable monomer (Sm).

The hydrolysable monomer (Sm) is not particularly limited. Examples thereof include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t- butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl) dimethoxysilane, bis(bicycloheptyl)diethoxysilane, bis (bicycloheptyl)dipropoxysilane, bis(bicycloheptyl) diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, and the like.

Among the aforementioned compounds, more preferable examples include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, and the like.

Other examples of the monovalent organic group shown by $R^2$ and $R^3$ include organic groups having one or more carbon-oxygen single bonds or carbon-oxygen double bonds; specifically, organic groups having one or more groups selected from the group consisting of cyclic ether groups, ester groups, alkoxy groups, and a hydroxy group.

Examples of the organic groups include ones shown by the following general formula (Sm-R).

$$(P-Q_1-(S)_{v1}-Q_2-)_u-(T)_{v2}-Q_3-(S_2)_{v3}-Q_4- \quad \text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent —$C_qH_{(2q-p)}P_p$—, where P is as defined above, "p" represents an integer of 0 to 3, and "q" represents an integer of 0 to 10, provided that q=0 means a single bond; "u" represents an integer of 0 to 3; $S_1$ and $S_2$ each independently represent —O—, —CO—, —OCO—, —COO—, or —OCOO—. v1, v2, and v3 each independently represent 0 or 1. In addition to these, T represents a divalent atom other than carbon, or a divalent group of an alicyclic, aromatic, or heterocyclic ring. As T, examples of the alicyclic, aromatic, or heterocyclic ring optionally containing a hetero atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

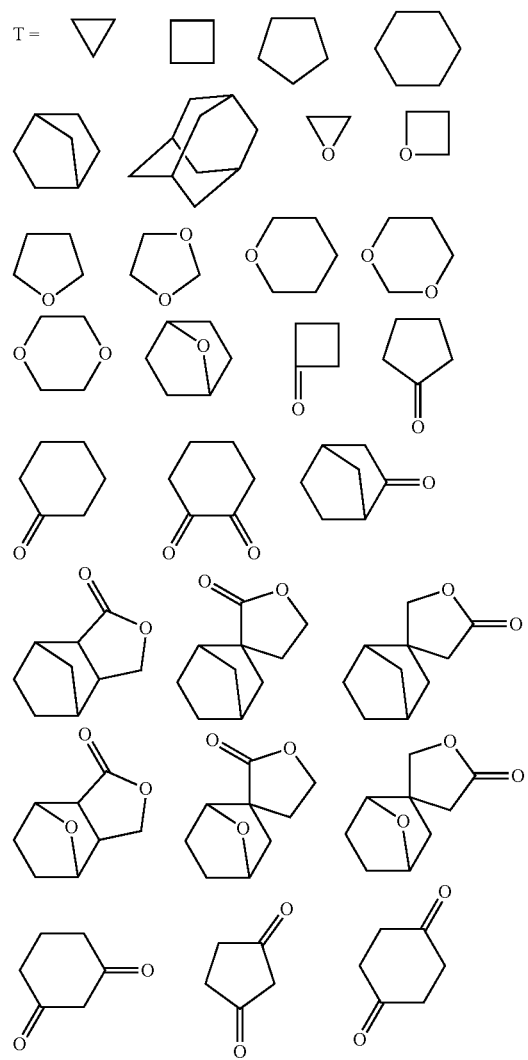

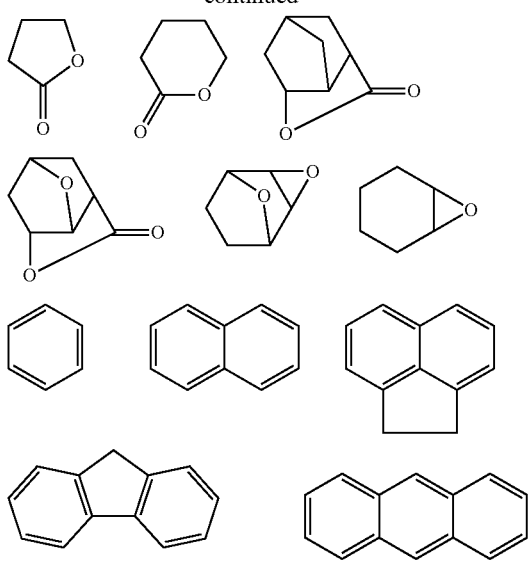
Preferable examples of the organic groups having one or more carbon-oxygen single bonds or carbon-oxygen double bonds in the general formula (Sm-R) include the following. Note that, in the following formulae, (Si) is depicted to show a bonding site to Si.
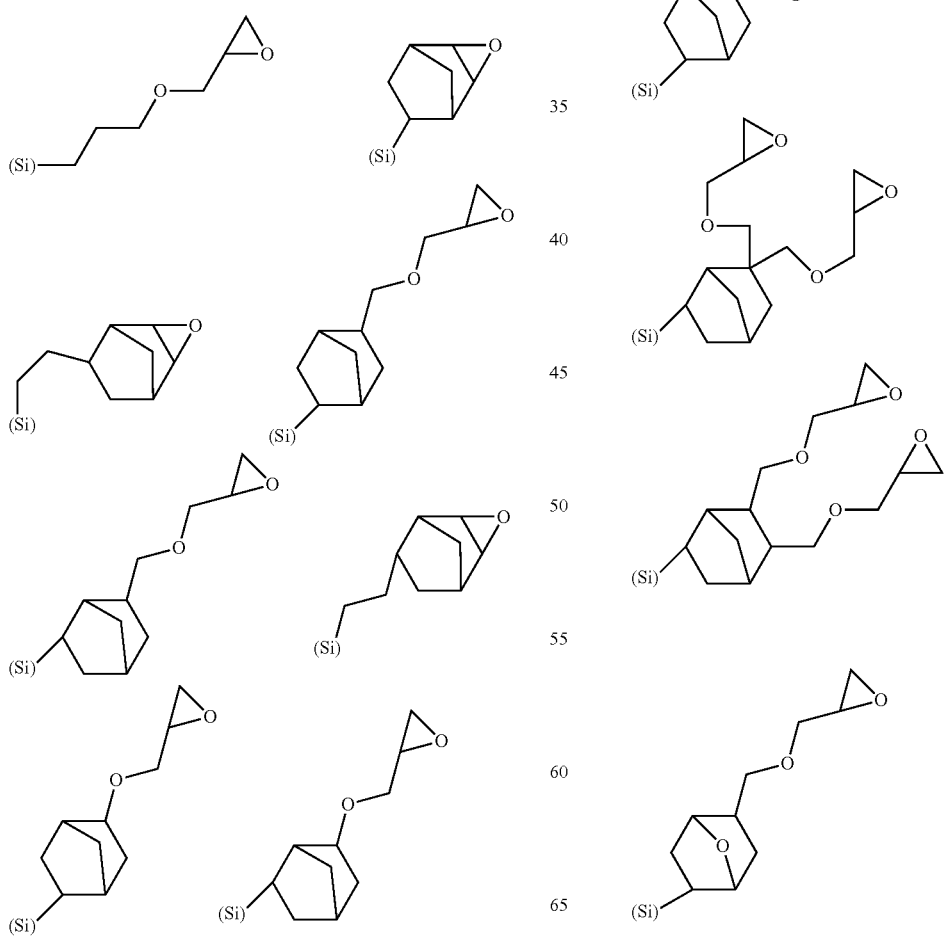
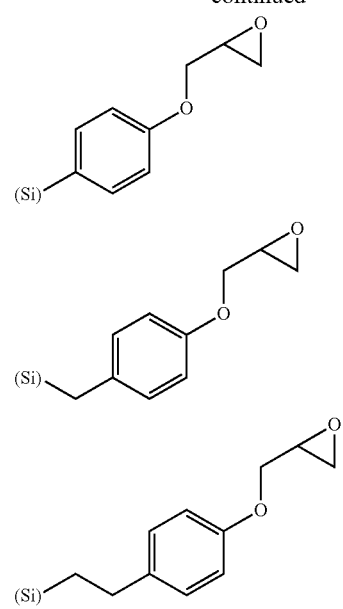

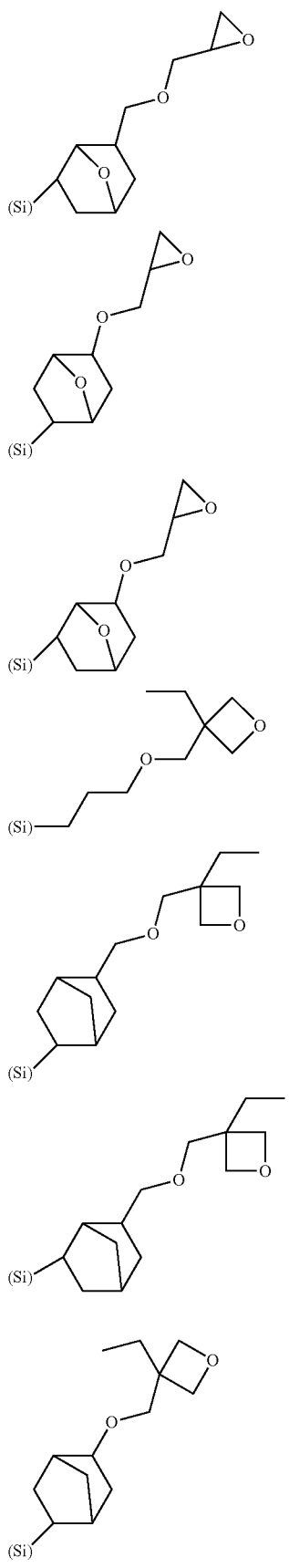
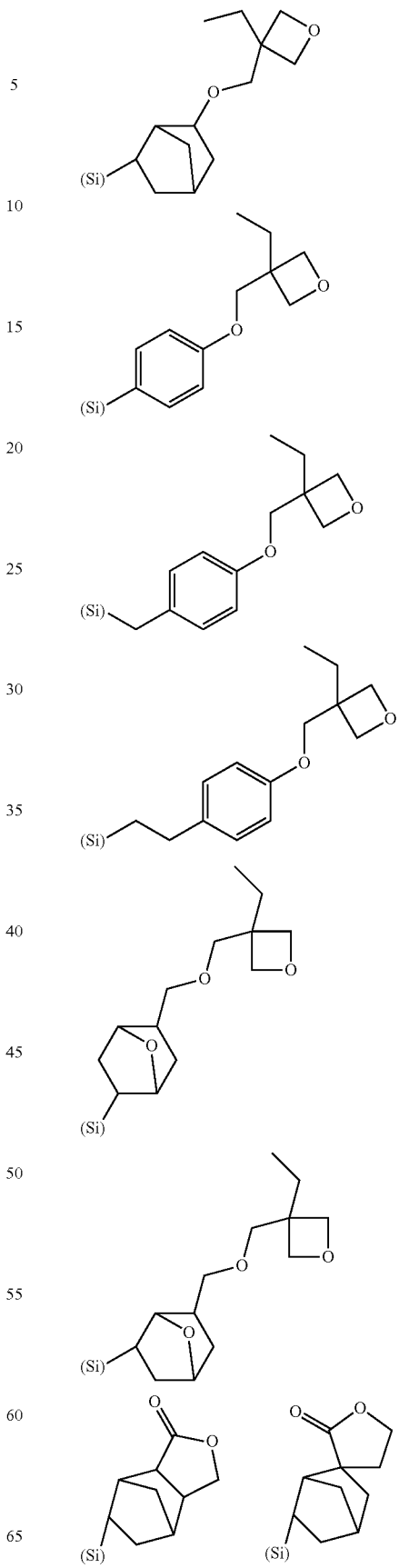

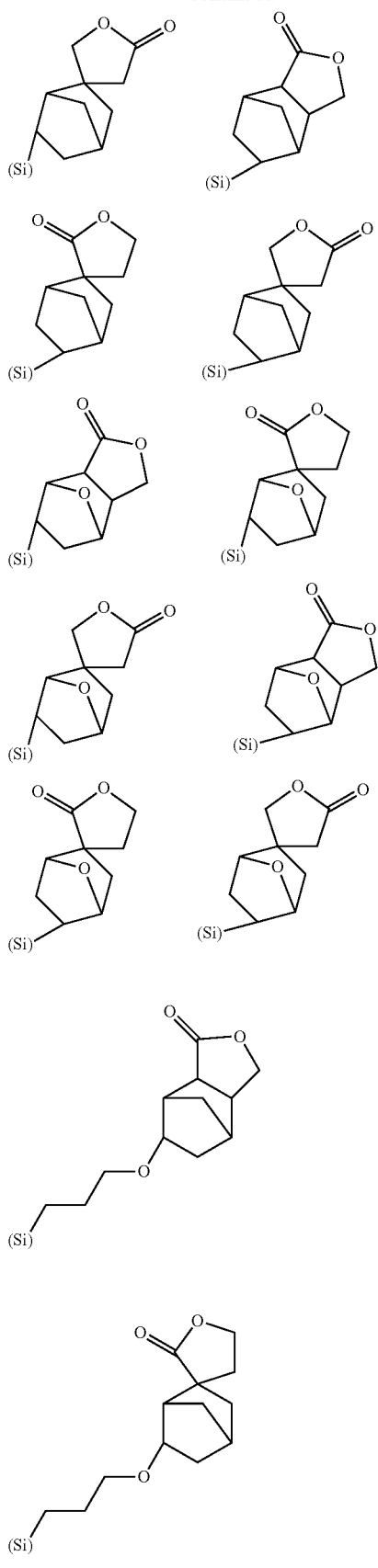
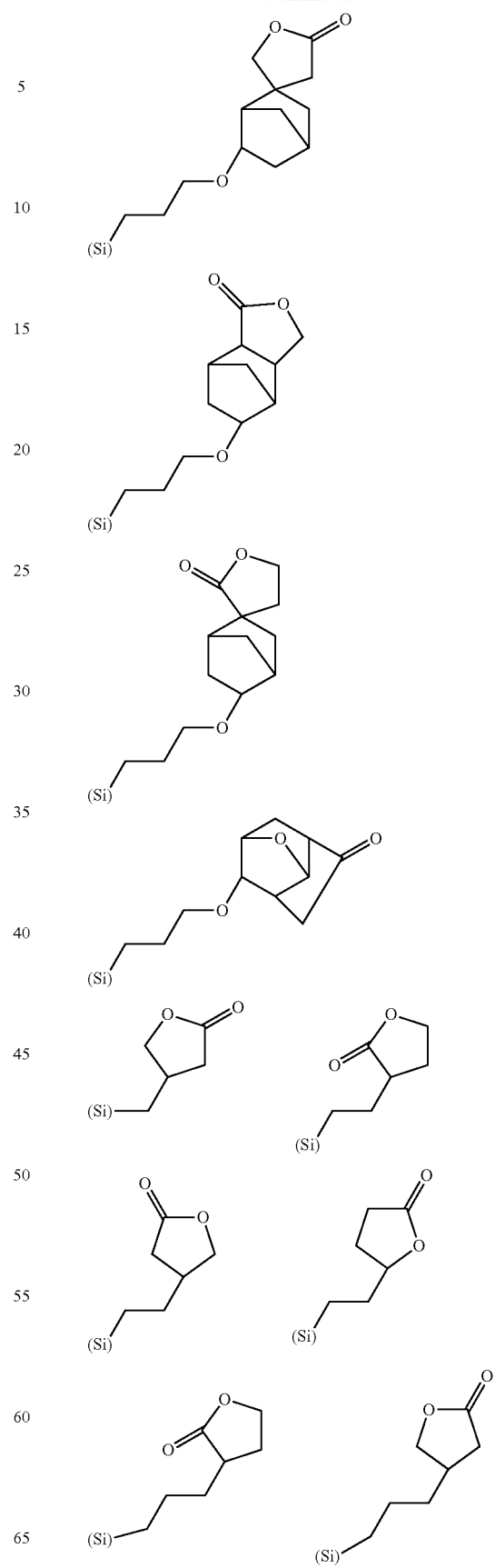

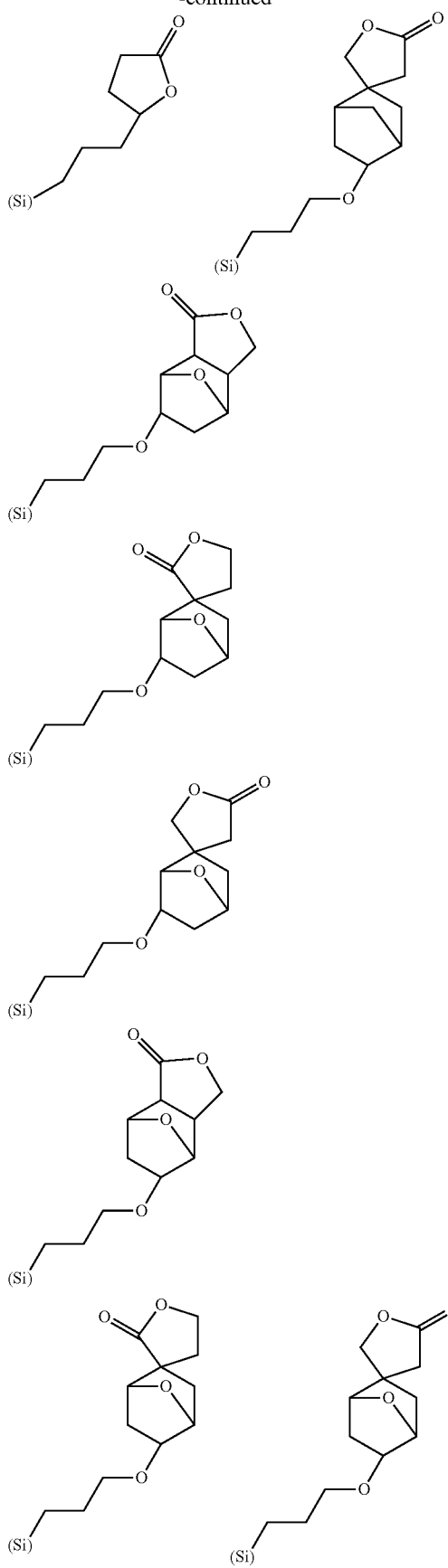
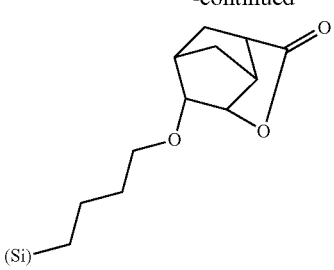
In these formulae, (Si) is depicted to show a bonding position, and does not constitute $R^2$ or $R^3$.
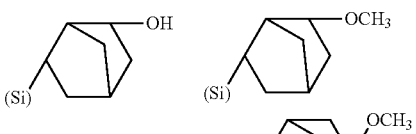
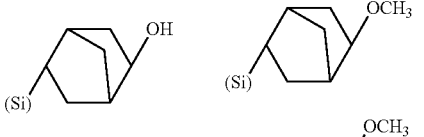
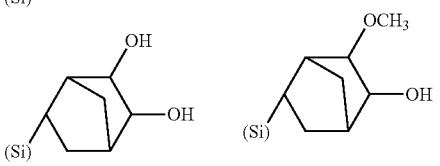
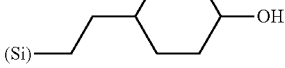
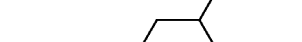
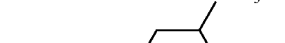
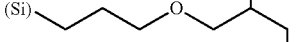
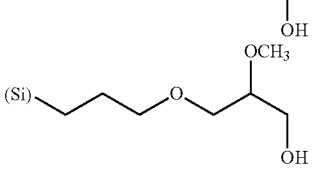

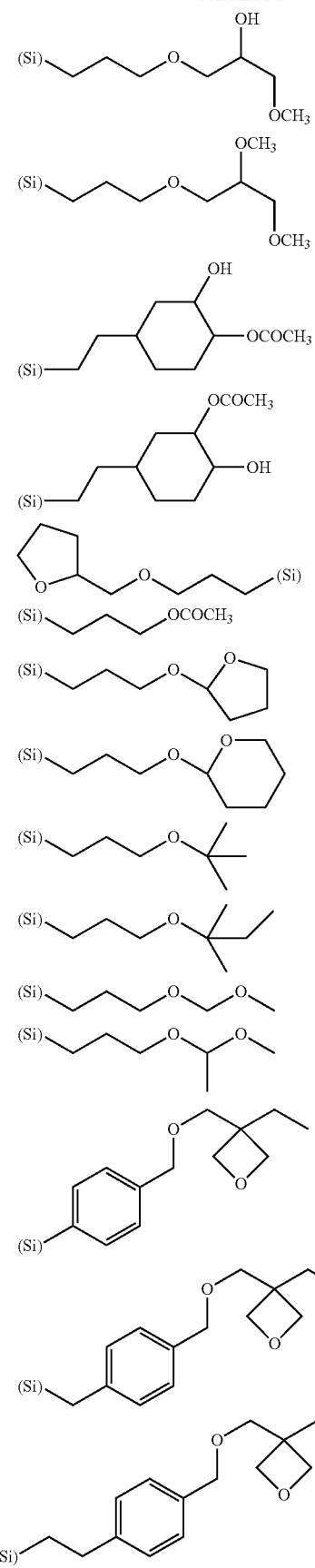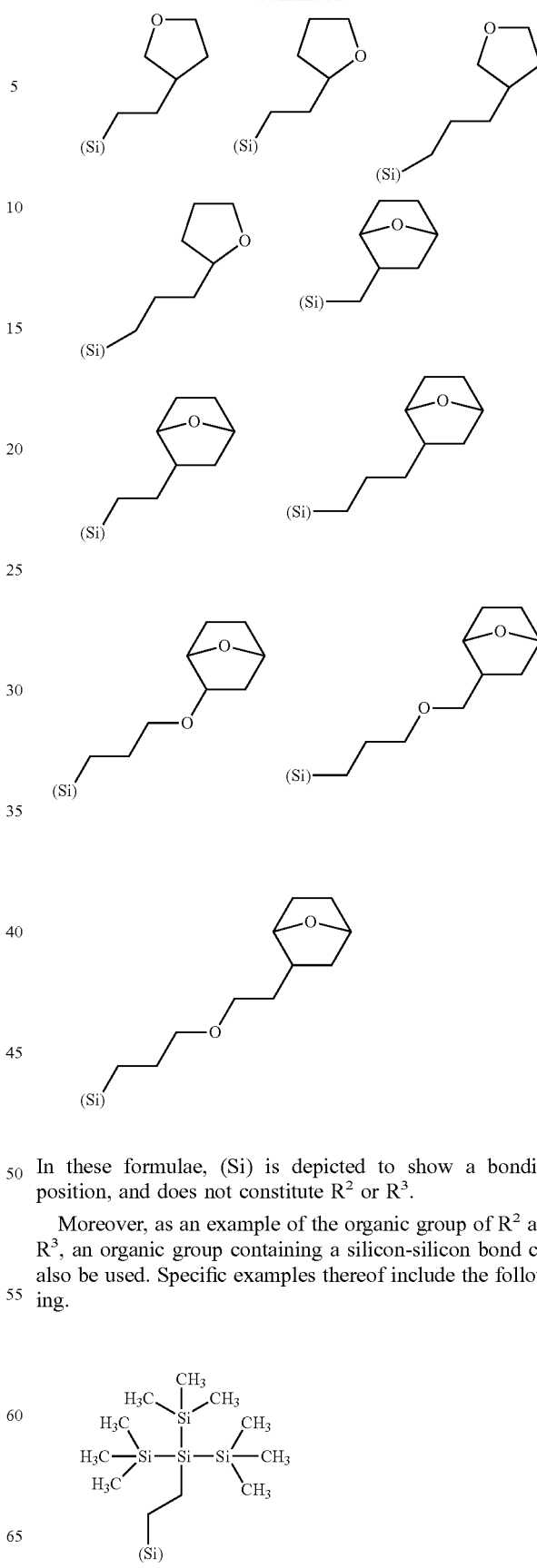
In these formulae, (Si) is depicted to show a bonding position, and does not constitute $R^2$ or $R^3$.
Moreover, as an example of the organic group of $R^2$ and $R^3$, an organic group containing a silicon-silicon bond can also be used. Specific examples thereof include the following.

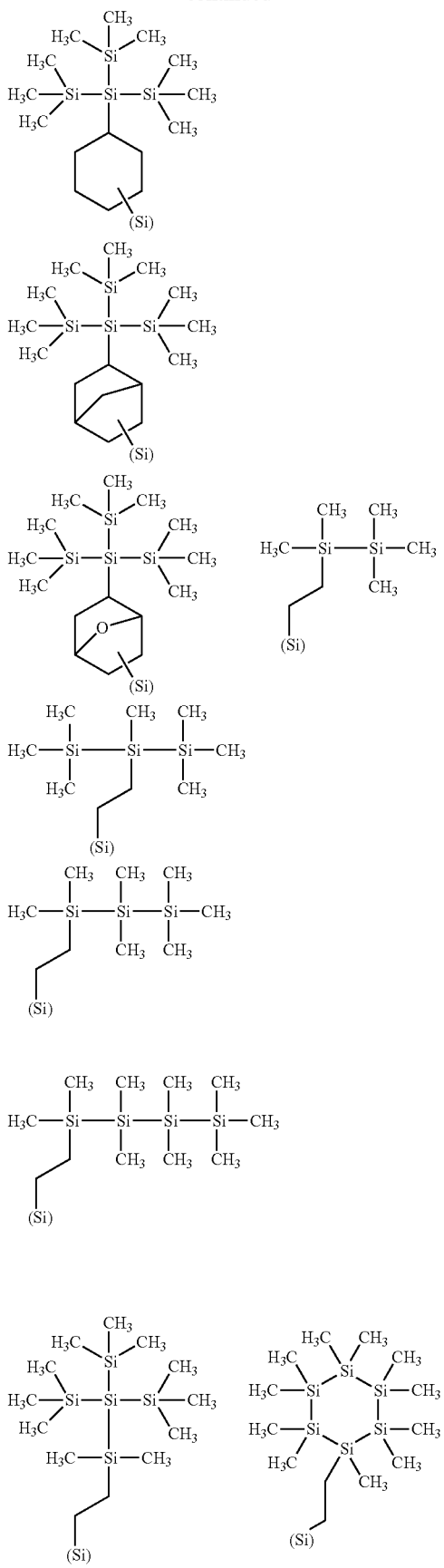
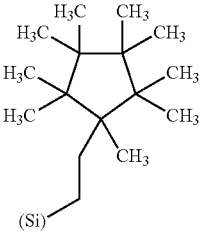

In these formulae, (Si) is depicted to show a bonding position, and does not constitute $R^2$ or $R^3$.

Further, as an example of the organic group of $R^2$ and $R^3$, an organic group having a protective group that is decomposed with an acid can also be used. Specific examples thereof include organic groups shown from paragraphs (0058) to (0059) of Japanese Unexamined Patent Application Publication No. 2013-167669; and organic groups obtained from silicon compounds shown in paragraph (0060) of Japanese Unexamined Patent Application-Publication No. 2013-224279.

Furthermore, as an example of the organic group of $R^2$ and $R^3$, an organic group having a fluorine atom can also be used. Specific examples thereof include organic groups obtained from silicon compounds shown from paragraphs (0062) to (0063) of Japanese Unexamined Patent Application Publication No. 2012-53253.

[Method for Synthesizing Silicon-Containing Compound (Sx)]

(Synthesis Method 1: Acid Catalyst)

The inventive silicon-containing compound (Sx) can be produced by hydrolysis condensation of the monomer containing $R^1$ as a substituent (the monomer for forming the structural units (Sx-1) to (Sx-3)), or a mixture of the monomer containing $R^1$ as a substituent with the monomer (Sm) (hereinafter, the two may be collectively referred to as monomer) in the presence of an acid catalyst.

Examples of the acid catalyst used in this event include organic acids such as formic acid, acetic acid, oxalic acid, and maleic acid; hydrofluoric acid, hydrochloric acid, hydrobromic acid, sulfuric acid, nitric acid, perchloric acid, phosphoric acid, methanesulfonic acid, benzenesulfonic acid, toluenesulfonic acid, and the like. The catalyst can be used in an amount of $1\times10^{-6}$ to 10 mol, preferably $1\times10^{-5}$ to 5 mol, more preferably $1\times10^{-4}$ to 1 mol, relative to 1 mol of the monomer.

When the silicon-containing compound is obtained from these monomers by the hydrolysis condensation, water is preferably added in an amount of 0.01 to 100 mol, more preferably 0.05 to 50 mol, further preferably 0.1 to 30 mol, per mol of the hydrolysable substituent bonded to the monomer. When the amount is 100 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

The organic solvent which can be added to the catalyst aqueous solution or with which the monomer can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, and the like.

Among these solvents, water-soluble solvents are preferable. Examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, and the like. Among these, particularly preferable is one having a boiling point of 100° C. or less.

Note that the organic solvent is used in an amount of preferably 0 to 1,000 ml, particularly preferably 0 to 500 ml, relative to 1 mol of the monomer. When the organic solvent is used in a small amount, only a small reaction vessel is required and economical.

Then, if necessary, neutralization reaction of the catalyst is carried out to obtain a reaction mixture aqueous solution. In this event, the amount of an alkaline substance usable for the neutralization is preferably 0.1 to 2 equivalents relative to the acid used as the catalyst. This alkaline substance may be any substance as long as it shows alkalinity in water.

Subsequently, by-products such as alcohol produced by the hydrolysis condensation reaction are preferably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. In this case, it is difficult to accurately know the amount of alcohol to be removed, but it is desirable to remove about 80 mass % or more of the produced alcohol, etc.

Next, the acid catalyst used in the hydrolysis condensation may be removed from the reaction mixture. As a method for removing the acid catalyst, the silicon-containing compound is mixed with water, and the silicon-containing compound is extracted with an organic solvent. Preferably, the organic solvent used in this event is capable of dissolving the silicon-containing compound, and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, and the like. However, the combination is not limited thereto.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the silicon-containing compound solution may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the silicon-containing compound solution. This washing procedure may be performed by putting both the silicon-containing compound solution and water into the same container, followed by stirring and then leaving to stand to separate the aqueous layer. The washing may be performed once or more, preferably once to approximately five times because washing ten times or more does not always produce the full washing effects thereof.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-washing operation, a part of the silicon-containing compound escapes into the aqueous layer, so that substantially the same effect as fractionation operation is obtained in some cases. Hence, the number of water-washing operations and the amount of washing water may be appropriately selected in view of the catalyst removal effect and the fractionation effect.

To a solution of either the silicon-containing compound with the acid catalyst still remaining or the silicon-containing compound with the acid catalyst having been removed, a final solvent may be added for solvent exchange under reduced pressure to obtain a desired silicon-containing compound solution. In this event, the temperature during the solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the silicon-containing compound may become unstable by the solvent exchange. This occurs due to incompatibility of the silicon-containing compound with the final solvent. Thus, in order to prevent this phenomenon, a monohydric, dihydric, or polyhydric alcohol having cyclic ether substituent as shown in paragraphs (0181) to (0182) of Japanese Unexamined Patent Application Publication No. 2009-126940 may be added as a stabilizer. The alcohol may be added in an amount of 0 to 25 parts by mass, preferably 0 to 15 parts by mass, more preferably 0 to 5 parts by mass, based on 100 parts by mass of the silicon-containing compound in the solution before the solvent exchange. When the alcohol is added, the amount is preferably 0.5 parts by mass or more. If necessary, the monohydric, dihydric, or polyhydric alcohol having cyclic ether substituent may be added to the solution before the solvent exchange operation.

If the silicon-containing compound is concentrated above a certain concentration, the condensation reaction may further progress, so that the silicon-containing compound becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the silicon-containing compound solution is preferably an alcohol-based solvent, particularly preferably monoalkyl ether derivatives such as ethylene glycol, diethylene glycol, triethylene glycol, propylene glycol, dipropylene glycol, and butanediol. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, and the like.

When these solvents are used as the main component, a non-alcohol-based solvent can also be added as an adjuvant solvent. Examples of the adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

As an alternative reaction operation using an acid catalyst, water or a water-containing organic solvent is added to the monomer or an organic solvent solution of the monomer to start the hydrolysis reaction. In this event, the catalyst may be added to the monomer or the organic solvent solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

When the organic solvent is used, a water-soluble solvent is preferable. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The organic solvent is used in an amount of preferably 0 to 1,000 ml, particularly preferably 0 to 500 ml, relative to 1 mol of the monomer. When the organic solvent is used in a small amount, only a small reaction vessel is required and economical. The obtained reaction mixture may be subjected to post-treatment by the same procedure as mentioned above to obtain a silicon-containing compound.

(Synthesis Method 2: Alkali Catalyst)

Alternatively, the silicon-containing compound (Sx) can be produced by hydrolysis condensation of the monomer containing $R^1$ as a substituent and the monomer (Sm) in the presence of an alkali catalyst. Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, and the like. The catalyst can be used in an amount of $1\times10^{-6}$ mol to 10 mol, preferably $1\times10^{-5}$ mol to 5 mol, more preferably $1\times10^{-4}$ mol to 1 mol, relative to 1 mol of the silicon monomer.

When the silicon-containing compound is obtained from the monomer by the hydrolysis condensation, water is preferably added in an amount of 0.1 to 50 mol per mol of the hydrolysable substituent bonded to the monomer. When the amount is 50 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

As the organic solvent which can be added to the alkali catalyst aqueous solution or with which the monomer can be diluted, the same organic solvents exemplified as the organic solvents which can be added to the acid catalyst aqueous solution are preferably used. Note that the organic solvent is used in an amount of preferably 0 to 1,000 ml relative to 1 mol of the monomer because the reaction can be performed economically.

Then, if necessary, neutralization reaction of the catalyst is carried out to obtain a reaction mixture aqueous solution. In this event, the amount of an acidic substance usable for the neutralization is preferably 0.1 to 2 equivalents relative to the alkaline substance used as the catalyst. This acidic substance may be any substance as long as it shows acidity in water.

Subsequently, by-products such as alcohol produced by the hydrolysis condensation reaction are preferably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In this case, it is difficult to accurately know the amount of alcohol to be removed, but it is desirable to remove about 80 mass % or more of the produced alcohol.

Next, to remove the catalyst used in the hydrolysis condensation, the silicon-containing compound may be extracted with an organic solvent. Preferably, the organic solvent used in this event is capable of dissolving the silicon-containing compound, and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Next, to remove the alkali catalyst used in the hydrolysis condensation, the silicon-containing compound may be extracted with an organic solvent. Preferably, the organic solvent used in this event is capable of dissolving the silicon-containing compound, and achieves two-layer separation when mixed with water. Further, it is also possible to use a mixture of a water-soluble organic solvent and a slightly-water-soluble organic solvent.

As concrete examples of the organic solvent used for removing the alkali catalyst, it is possible to use the aforementioned organic solvents specifically exemplified for the acid catalyst removal or the same mixture of the water-soluble organic solvent and the water-insoluble organic solvent.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the silicon-containing compound solution may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the silicon-containing compound solution. This washing procedure may be performed by putting both the silicon-containing compound solution and water into the same container, followed by stirring and then leaving to stand to separate the aqueous layer. The washing may be performed once or more, preferably once to approximately five times because washing ten times or more does not always produce the full washing effects thereof.

To the washed silicon-containing compound solution, a final solvent may be added for solvent exchange under reduced pressure to obtain a desired silicon-containing compound solution. In this event, the temperature during the solvent exchange is preferably 0 to 100° C., more preferably 10 to 90° C., further preferably 15 to 80° C., depending on the kinds of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the silicon-containing compound solution is preferably an alcohol-based solvent, particularly preferably a monoalkyl ether of ethylene glycol, diethylene glycol, triethylene glycol, etc. and a monoalkyl ether of propylene glycol, dipropylene glycol, etc. Specifically, preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, diacetone alcohol, and the like.

As an alternative reaction operation using an alkali catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

The organic solvent usable for the organic solution of the monomer or the water-containing organic solvent is preferably a water-soluble solvent. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The molecular weight of the silicon-containing compound obtained by the above synthesis method 1 or 2 can be adjusted not only through the selection of the monomers, but also through reaction condition control during the polymerization. If a silicon-containing compound having a weight average molecular weight exceeding 100,000 is used, foreign matters or coating spots are generated in some cases. It is preferable to use the silicon-containing compound having a weight average molecular weight of 100,000 or less, more preferably 200 to 50,000, further preferably 300 to 30,000. Regarding data on the weight average molecular weight, the molecular weight is expressed in terms of polystyrene which is obtained by gel permeation chromatography (GPC) using a refractive index (RI) detector, tetrahydrofuran as an eluent, and polystyrene as a reference substance.

The inventive silicon-containing compound can be produced from the above-described hydrolysable monomer(s) under the conditions using the acid or alkali catalyst.

Furthermore, a polysiloxane derivative produced from a mixture of these hydrolysable monomers with a hydrolysable metal compound shown by the following general formula (Mm) under the conditions using the acid or alkali catalyst can be used as a component of the inventive composition for forming a silicon-containing film.

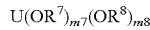

$$U(OR^7)_{m7}(OR^8)_{m8} \quad (Mm)$$

In the formula, $R^7$ and $R^6$ each represent an organic group having 1 to 30 carbon atoms; m7+m8 represents the same number as a valence determined by the kind of U; m7 and m8 each represent an integer of 0 or more; and U represents an element belonging to the group III, IV, or V in the periodic table, except for carbon and silicon.

Examples of the hydrolysable metal compound (Mm) used in this event include the following.

When U is boron, examples of the compound shown by the general formula (Mm) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, and the like.

When U is aluminum, examples of the compound shown by the general formula (Mm) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxy(ethyl acetoacetate), aluminum dibutoxy(ethyl acetoacetate), aluminum propoxy bis(ethyl acetoacetate), aluminum butoxy bis(ethyl acetoacetate), aluminum 2,4-pentanedionate, aluminum 2,2,6,6-tetramethyl-3,5-heptanedionate, and the like.

When U is gallium, examples of the compound shown by the general formula (Mm) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxy(ethyl acetoacetate), gallium dibutoxy(ethyl acetoacetate), gallium propoxy bis (ethyl acetoacetate), gallium butoxy bis(ethyl acetoacetate), gallium 2,4-pentanedionate, gallium 2,2,6,6-tetramethyl-3,5-heptanedionate, and the like.

When U is yttrium, examples of the compound shown by the general formula (Mm) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxy(ethyl acetoacetate), yttrium dibutoxy(ethyl acetoacetate), yttrium propoxy bis (ethyl acetoacetate), yttrium butoxy bis(ethyl acetoacetate), yttrium 2,4-pentanedionate, yttrium 2,2,6,6-tetramethyl-3,5-heptanedionate, and the like.

When U is germanium, examples of the compound shown by the general formula (Mm) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, and the like.

When U is titanium, examples of the compound shown by the general formula (Mm) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis(ethyl acetoacetate), titanium dipropoxy bis(2,4-pentanedionate), titanium dibutoxy bis(2,4-pentanedionate), and the like.

When U is hafnium, examples of the compound shown by the general formula (Mm) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bis(ethyl acetoacetate), hafnium dibutoxy bis(ethyl acetoacetate), hafnium dipropoxy bis(2,4-pentanedionate), hafnium dibutoxy bis(2,4-pentanedionate), and the like.

When U is tin, examples of the compound shown by the general formula (Mm) include, as monomers, methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like.

When U is arsenic, examples of the compound shown by the general formula (Mm) include, as monomers, methoxy arsenic, ethoxy arsenic, propoxy arsenic, butoxy arsenic, phenoxy arsenic, and the like.

When U is antimony, examples of the compound shown by the general formula (Mm) include, as monomers, methoxy antimony, ethoxy antimony, propoxy antimony, butoxy antimony, phenoxy antimony, antimony acetate, antimony propionate, and the like.

When U is niobium, examples of the compound shown by the general formula (Mm) include, as monomers, methoxy niobium, ethoxy niobium, propoxy niobium, butoxy niobium, phenoxy niobium, and the like.

When U is tantalum, examples of the compound shown by the general formula (Mm) include, as monomers, methoxy tantalum, ethoxy tantalum, propoxy tantalum, butoxy tantalum, phenoxy tantalum, and the like.

When U is bismuth, examples of the compound shown by the general formula (Mm) include, as monomers, methoxy bismuth, ethoxy bismuth, propoxy bismuth, butoxy bismuth, phenoxy bismuth, and the like.

When U is phosphorus, examples of the compound shown by the general formula (Mm) include, as monomers, trimethyl phosphate, triethyl phosphate, tripropyl phosphate, trimethyl phosphite, triethyl phosphite, tripropyl phosphite, diphosphorous pentaoxide, and the like.

When U is vanadium, examples of the compound shown by the general formula (Mm) include, as monomers, vanadium oxide bis(2,4-pentanedionate), vanadium 2,4-pentanedionate, vanadium tributoxide oxide, vanadium tripropoxide oxide, and the like.

When U is zirconium, examples of the compound shown by the general formula (Mm) include, as monomers, methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), and the like.

<Composition for Forming Silicon-Containing Film>

Moreover, the present invention provides a composition for forming a silicon-containing film, containing the above-described inventive thermosetting silicon-containing compound and a crosslinking catalyst. Hereinafter, raw materials that can be blended into the inventive composition for forming a silicon-containing film will be described.

(Crosslinking Catalyst)

In the present invention, a crosslinking catalyst (Xc) may be blended into the composition for forming a silicon-containing film. An example of the blendable crosslinking catalyst includes a compound shown by the following general formula (Xc0):

$$L_aH_bA \quad \text{(Xc0)}$$

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilic counter ion.

Examples of the crosslinking catalyst used in the present invention as specific (Xc0) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, and the like.

Examples of the sulfonium salt (Xc-1), the iodonium salt (Xc-2), and the phosphonium salt (Xc-3) include the following.

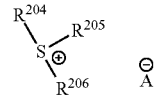
(Xc-1)

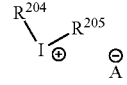
(Xc-2)

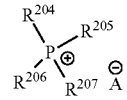
(Xc-3)

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. $A^-$ represents a non-nucleophilic counter ion.

Moreover, an example of the ammonium salt (Xc-4) includes the following.

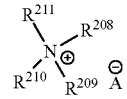
(Xc-4)

In the formula, $R^{208}$, $R^{209}$, $R^{210}$, and $R^{211}$ are the same as $R^{204}$, $R^{205}$, $R^{206}$, and $R^{207}$, or may be each a hydrogen atom. $R^{208}$ and $R^{209}$, or $R^{208}$, $R^{209}$ and $R^{210}$, may form a ring; when a ring is formed, $R^{208}$ and $R^{209}$, or $R^{208}$, $R^{209}$ and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be identical to or different from one another. Specifically, examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, and the like, and also include a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, and the like; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(l-naphthyl)-2-oxoethyl group, and a 2-(2-naphthyl)-2-oxoethyl group; and the like.

Examples of the non-nucleophilic counter ion $A^-$ include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, and the like.

Examples of the alkaline metal salt include salts of lithium, sodium, potassium, cesium, magnesium, and calcium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, and the like.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, and the like.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoro methanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, and the like.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, and the like.

Specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium trifluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium trifluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethylphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenylammonium formate, benzyldimethylphenylammonium acetate, benzyldimethylphenylammonium propionate, benzyldimethylphenylammonium butanoate, benzyldimethylphenylammonium benzoate, benzyldimethylphenylammonium phthalate, benzyldimethylphenylammonium isophthalate, benzyldimethylphenylammonium terephthalate, benzyldimethylphenylammonium salicylate, benzyldimethylphenylammonium trifluoromethanesulfonate, benzyldimethylphenylammonium trifluoroacetate, benzyldimethylphenylammonium monochloroacetate, benzyldimethylphenylammonium dichloroacetate, benzyldimethylphenylammonium trichloroacetate, benzyldimethylphenylammonium hydroxide, benzyldimethylphenylammonium nitrate, benzyldimethylphenylammonium chloride, benzyldimethylphenylammonium bromide, benzyldimethylphenylammonium iodide, benzyldimethylphenylammonium methanesulfonate, benzyldimethylphenylammonium monomethylsulfate, benzyldimethylphenylammonium oxalate, benzyldimethylphenylammonium malonate, benzyldimethylphenylammonium maleate, benzyldimethylphenylammonium fumarate, benzyldimethylphenylammonium citraconate, benzyldimethylphenylammonium citrate, benzyldimethylphenylammonium carbonate, bisbenzyldimethylphenylammonium oxalate, bisbenzyldimethylphenylammonium malonate, bisbenzyldimethylphenylammonium maleate, bisbenzyldimethylphenylammonium fumarate, bisbenzyldimethylphenylammonium citraconate, bisbenzyldimethylphenylammonium citrate, bisbenzyldimethylphenylammonium carbonate, and the like.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, and the like.

In the present invention, a polysiloxane (Xc-10) having a structure partially containing any of the sulfonium salt, the iodonium salt, the phosphonium salt, and the ammonium salt may be blended as the crosslinking catalyst (Xc) into the composition for forming a silicon-containing film.

As a raw material for producing (Xc-10) used here, it is possible to employ a compound shown by the following general formula (Xm):

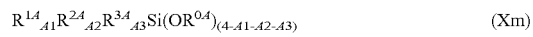

$$R^{1A}{}_{A1}R^{2A}{}_{A2}R^{3A}{}_{A3}Si(OR^{OA})_{(4-A1-A2-A3)} \quad (Xm)$$

where $R^{OA}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other(s) of $R^{1A}$, $R^{2A}$, and $R^{3A}$ represent a hydrogen atom or a monovalent organic group having 1 to 30 carbon atoms; and A1, A2, and A3 each represent 0 or 1, given that $1 \leq A1+A2+A3 \leq 3$.

Here, examples of $R^{OA}$ include a methyl group, an ethyl group, an n-propyl group, an iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

An example of Xm includes the following general formula (Xm-1), which shows a hydrolysable silicon compound having a structure partially containing a sulfonium salt:

where $R^{SA1}$ and $R^{SA2}$ each represent a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, a halogen atom, or the like. Moreover, $R^{SA1}$ and $R^{SA2}$ may form a ring together with a sulfur atom bonded to $R^{SA1}$ and $R^{SA2}$; when a ring is formed, $R^{SA1}$ and $R^{SA2}$ each represent an alkylene group having 1 to 6 carbon atoms. $R^{SA3}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Examples of X⁻ include hydroxide ion, fluoride ion, chloride ion, bromide ion, iodide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, methanesulfonate ion, benzenesulfonate ion, toluenesulfonate ion, monomethylsulfate ion, hydrogen sulfate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and the like.

Specific examples of the compound shown by the general formula (Xm-1) include the following.

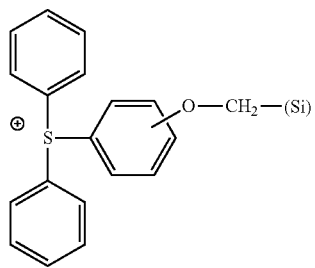

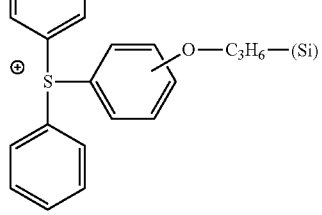

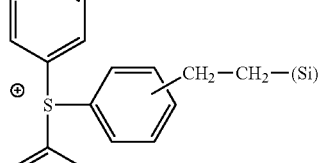

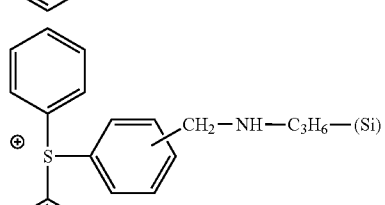

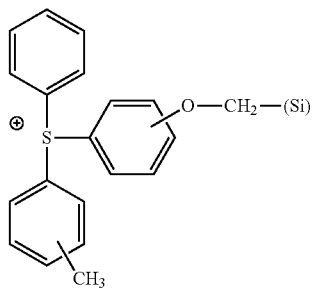

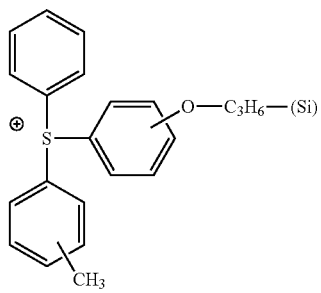

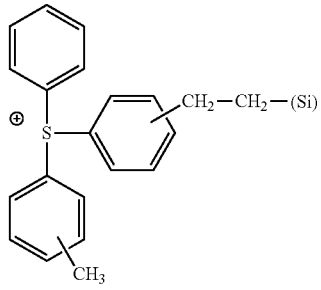

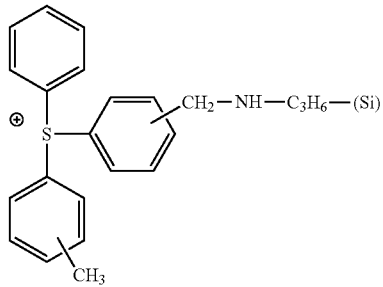

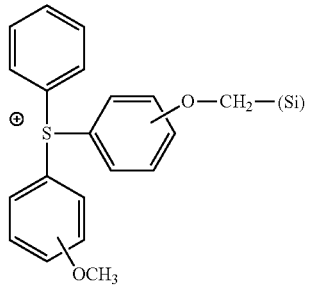

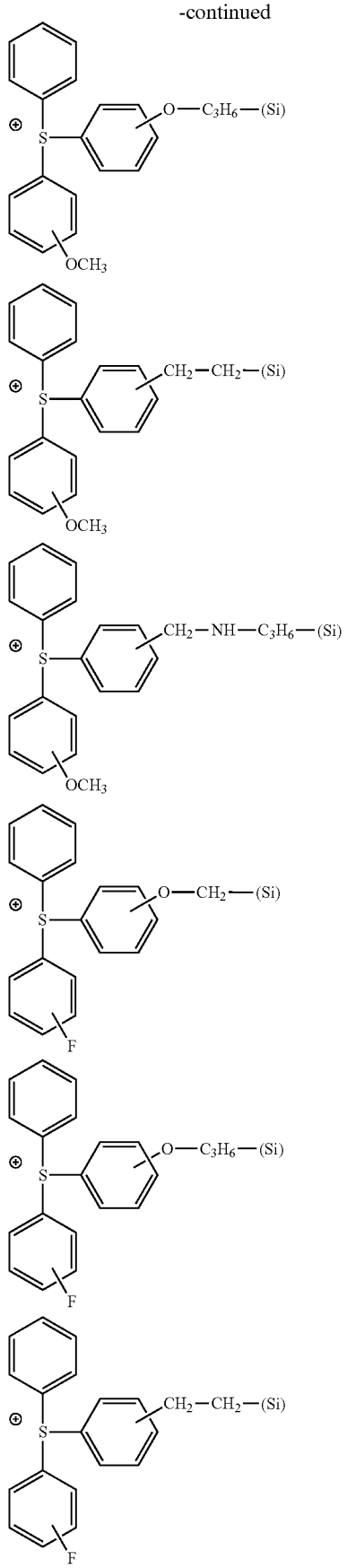
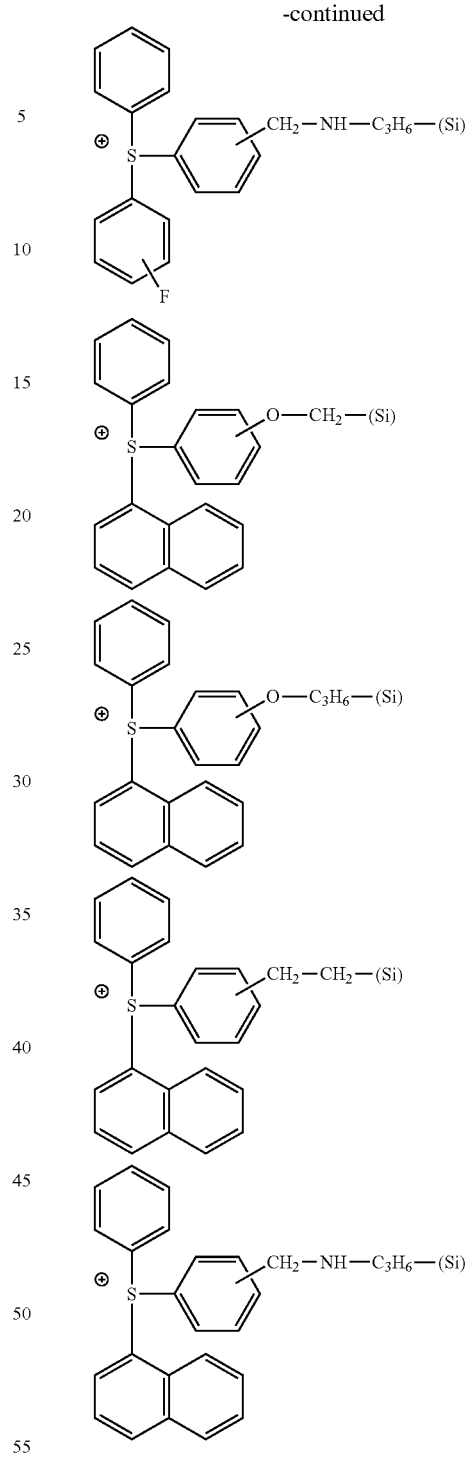
For example, a hydrolysable silicon compound having a structure partially containing an iodonium salt can be shown by the following general formula (Xm-2):
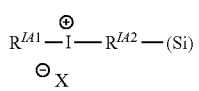

where $R^{IA1}$ represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or an aryloxoalkyl group having 7 to 20 carbon atoms; some or all of hydrogen atoms of these groups are optionally substituted with an alkoxy group, an amino group, an alkylamino group, a halogen atom, or the like. $R^{IA2}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like. $X^-$ is as defined above.

Specific examples of the compound shown by the general formula (Xm-2) include the following.

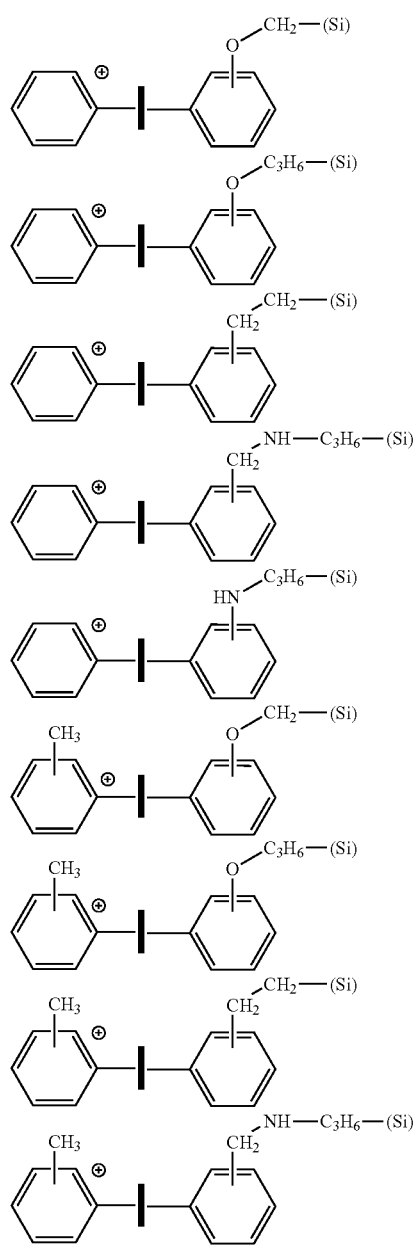

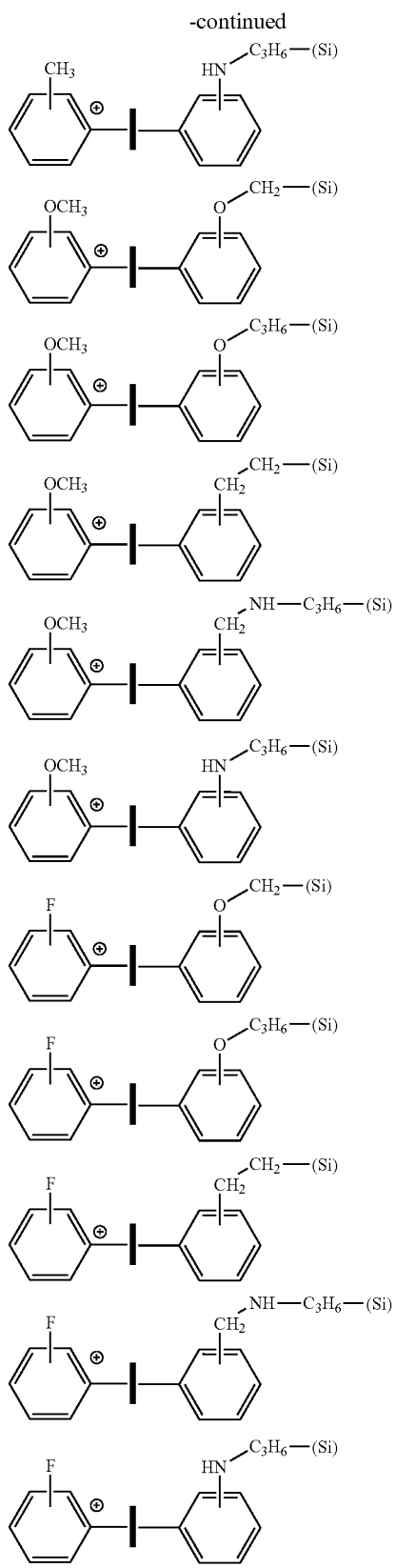

For example, a hydrolysable silicon compound having a structure partially containing a phosphonium salt can be shown by the following general formula (Xm-3):

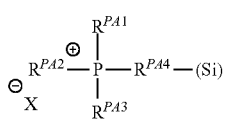

(Xm-3)

where $R^{PA1}$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or an aryloxoalkyl group having 7 to 20 carbon atoms; some or all of hydrogen atoms of these groups are optionally substituted with an alkoxy group, an amino group, an alkylamino group, a halogen atom, or the like. Moreover, $R^{PA1}$ and $R^{PA2}$ may form a ring together with a phosphorus atom bonded to $R^{PA1}$ and $R^{PA2}$; when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like. $X^-$ is as defined above.

Specific examples of the compound shown by the general formula (Xm-3) include the following.

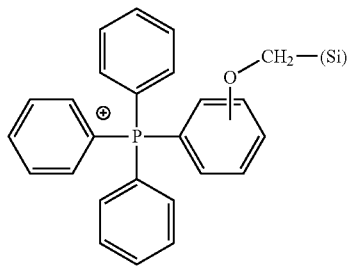

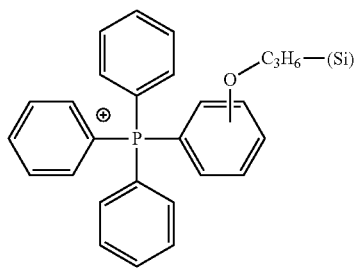

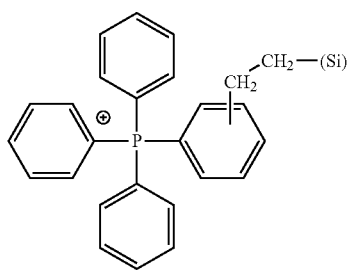

-continued

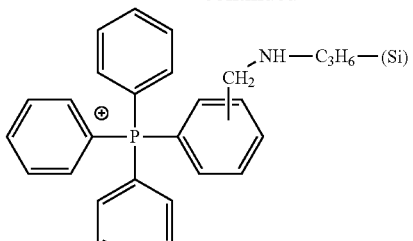

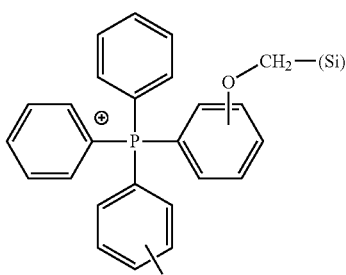

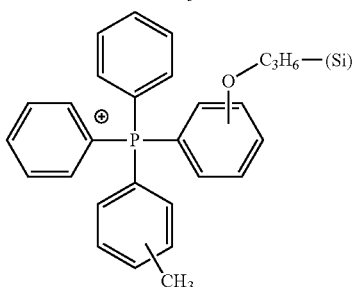

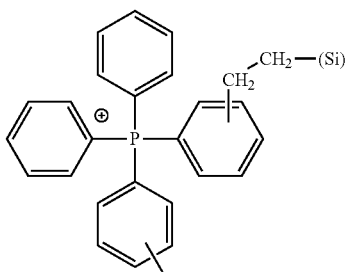

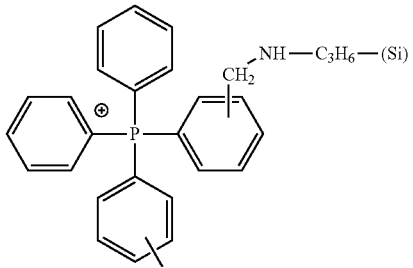

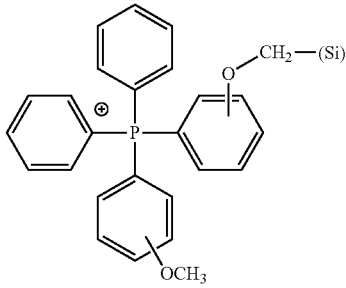

75
-continued
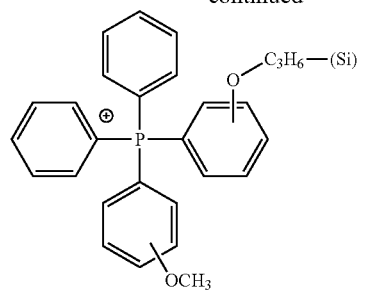
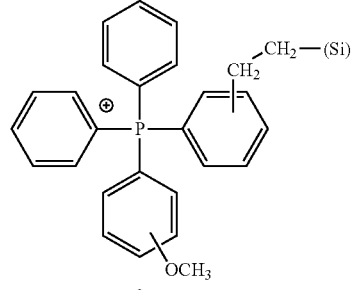
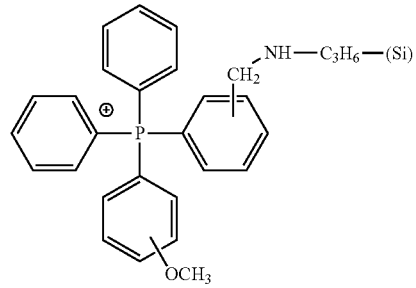
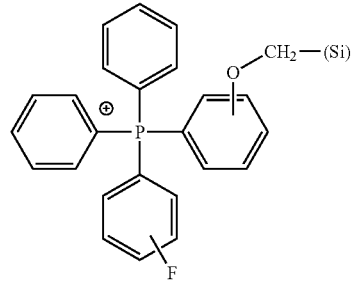
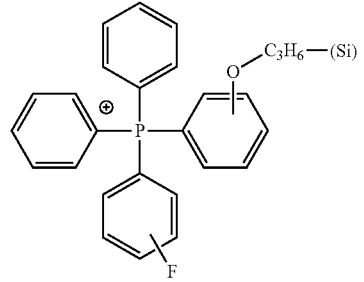
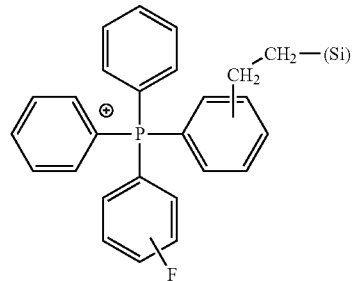
76
-continued
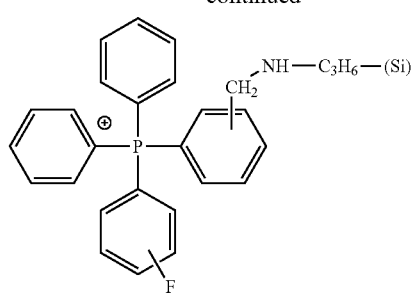
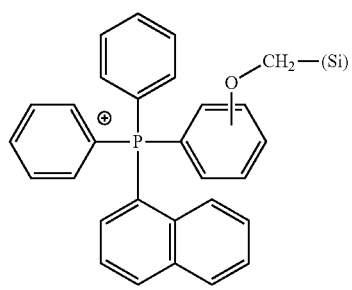
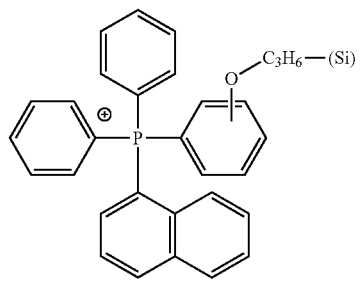
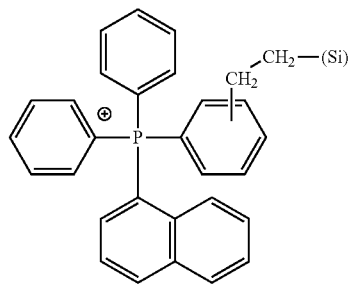
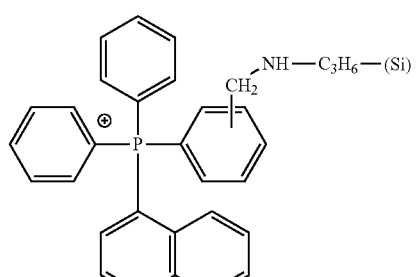
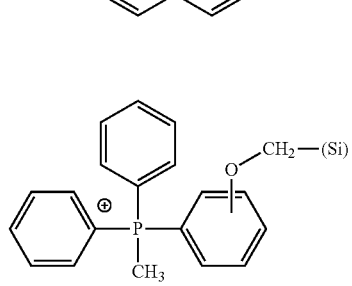

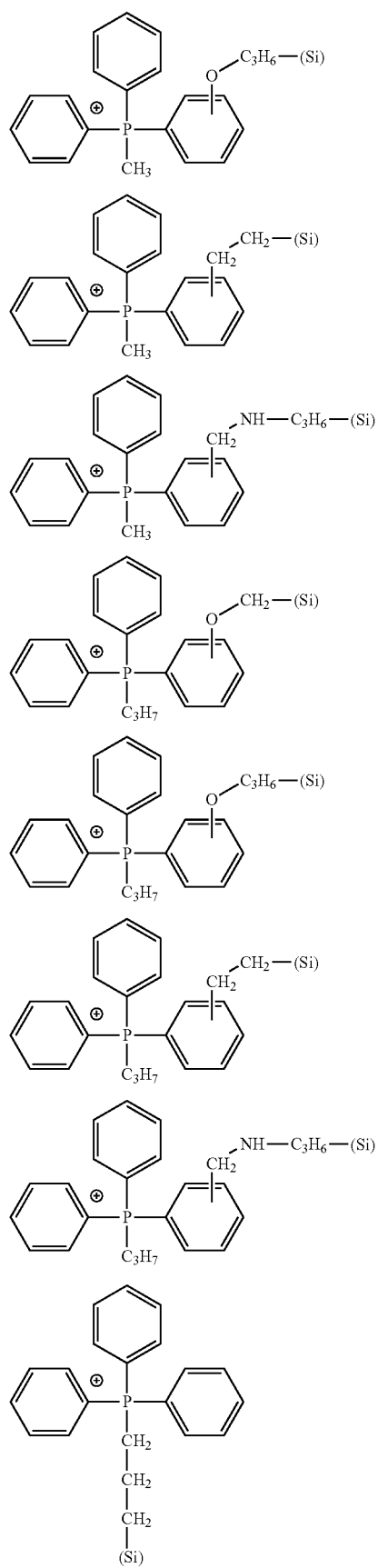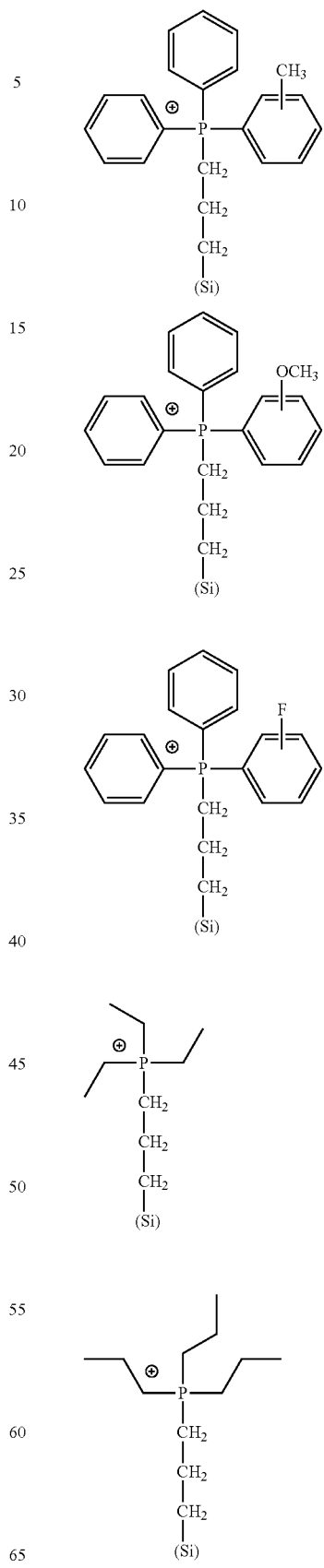

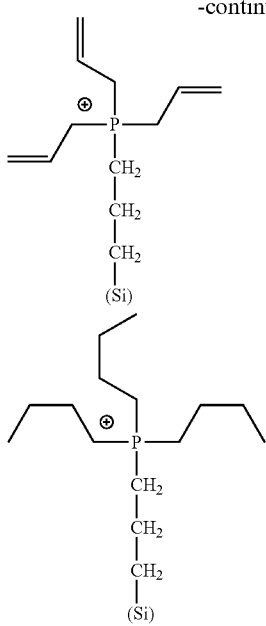

For example, a hydrolysable silicon compound having a structure partially containing an ammonium salt can be shown by the following general formula (Xm-4):

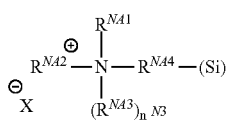
(Xm-4)

where $R^{NA1}$, $R^{NA2}$, and $R^{NA3}$ each represent hydrogen or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; when a ring is formed, $R^{NA1}$ and $R^{NA2}$ each represent an alkylene group having 1 to 6 carbon atoms or a cyclic heterocyclic ring or heteroaromatic ring containing nitrogen. $R^{NA4}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$, form a cyclic structure which further contains unsaturated nitrogen; $n^{NA3}=0$; in the other cases, $n^{NA3}=1$. $X^-$ is as defined above.

Specific examples of the compound shown by the general formula (Xm-4) include the following.

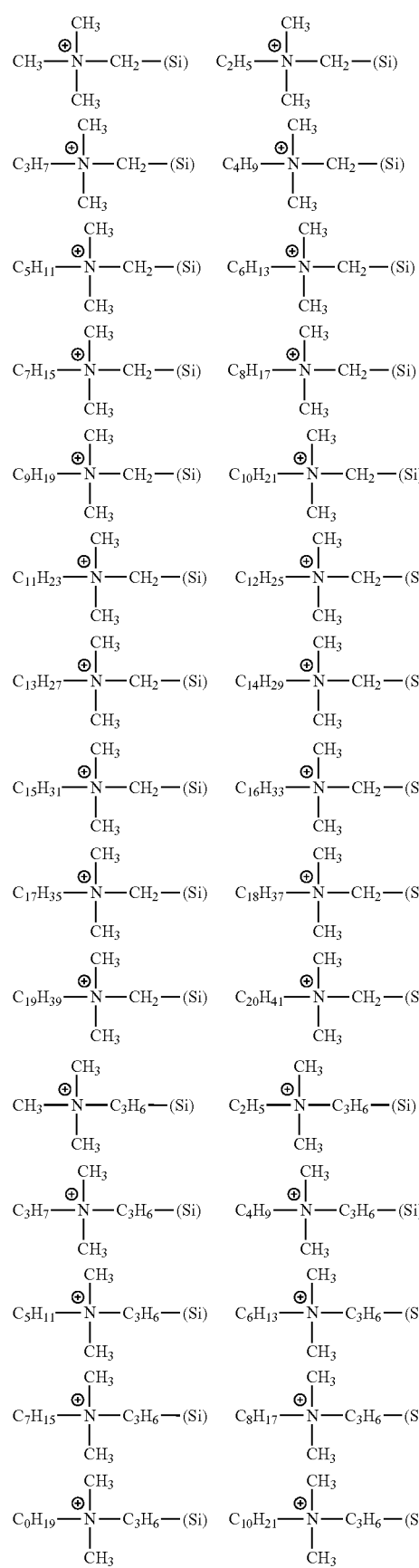

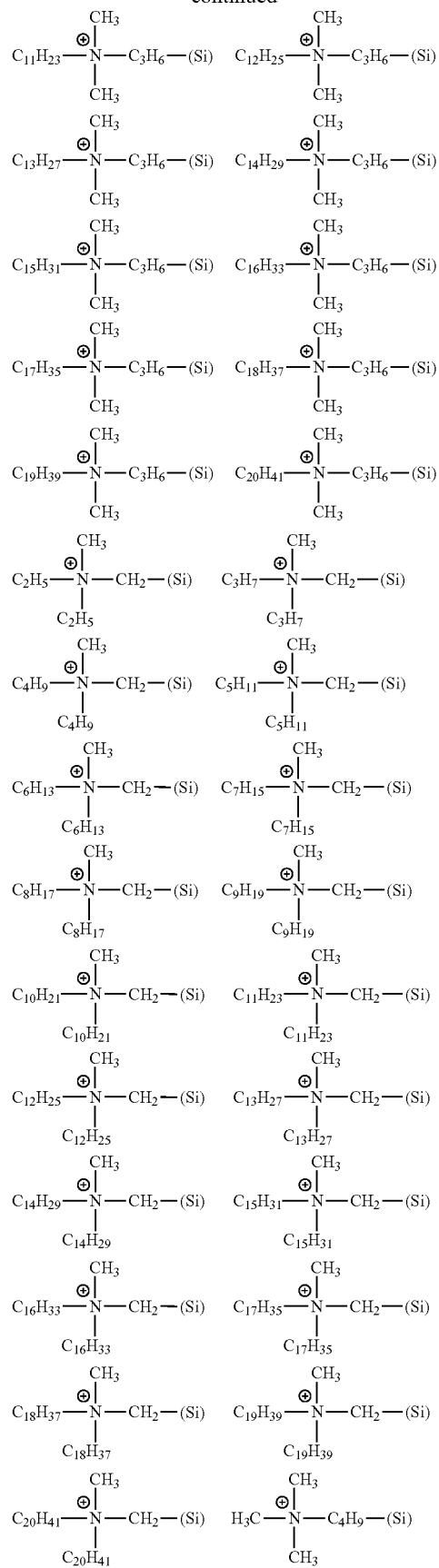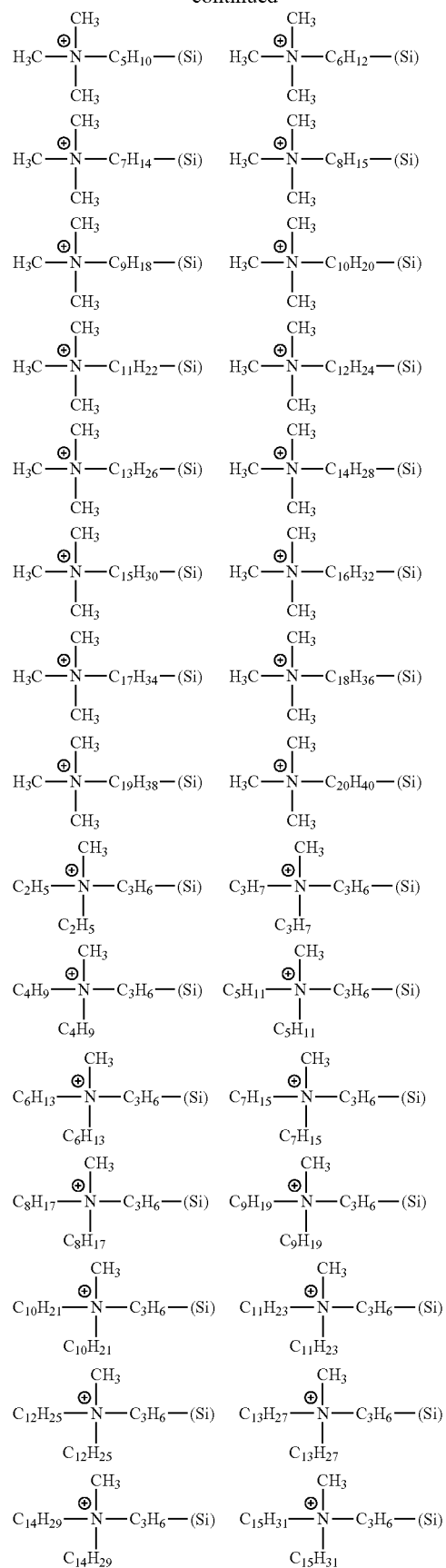

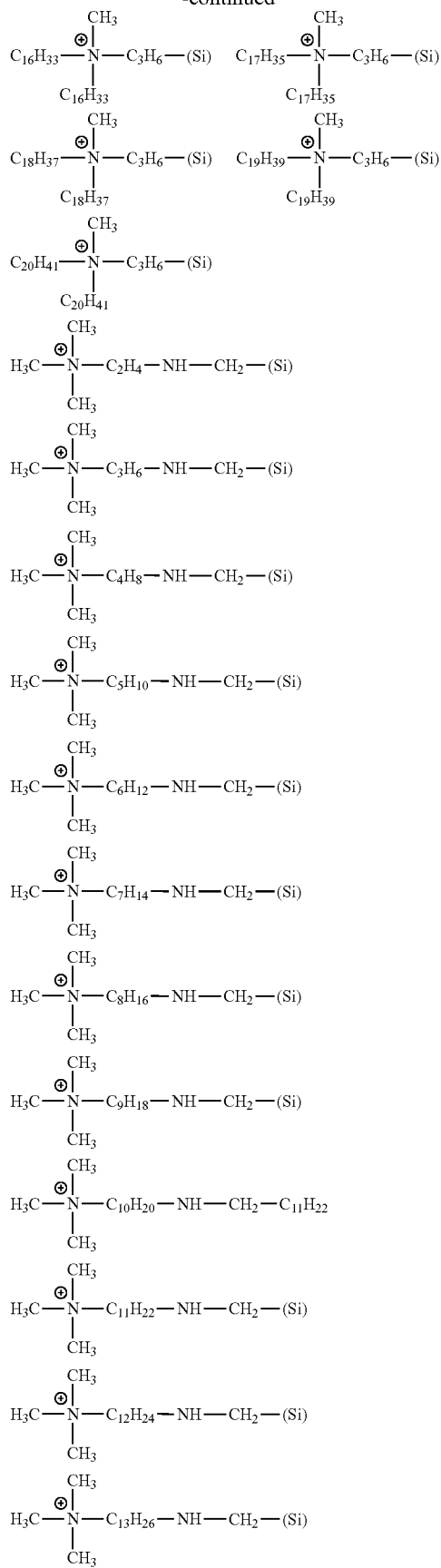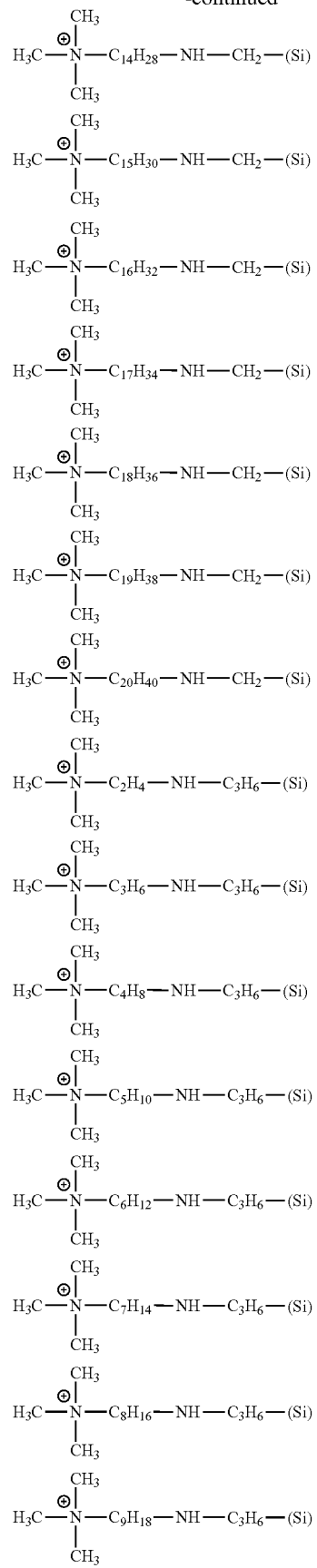

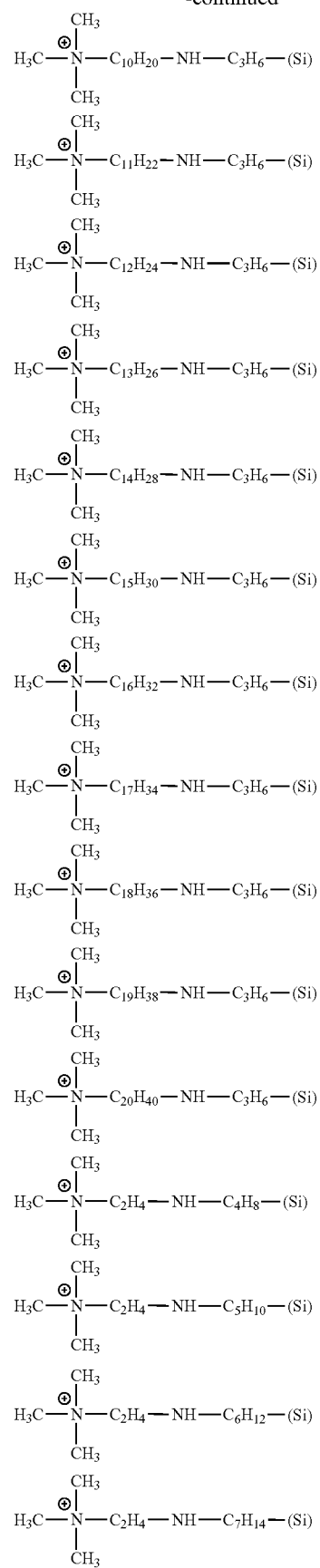
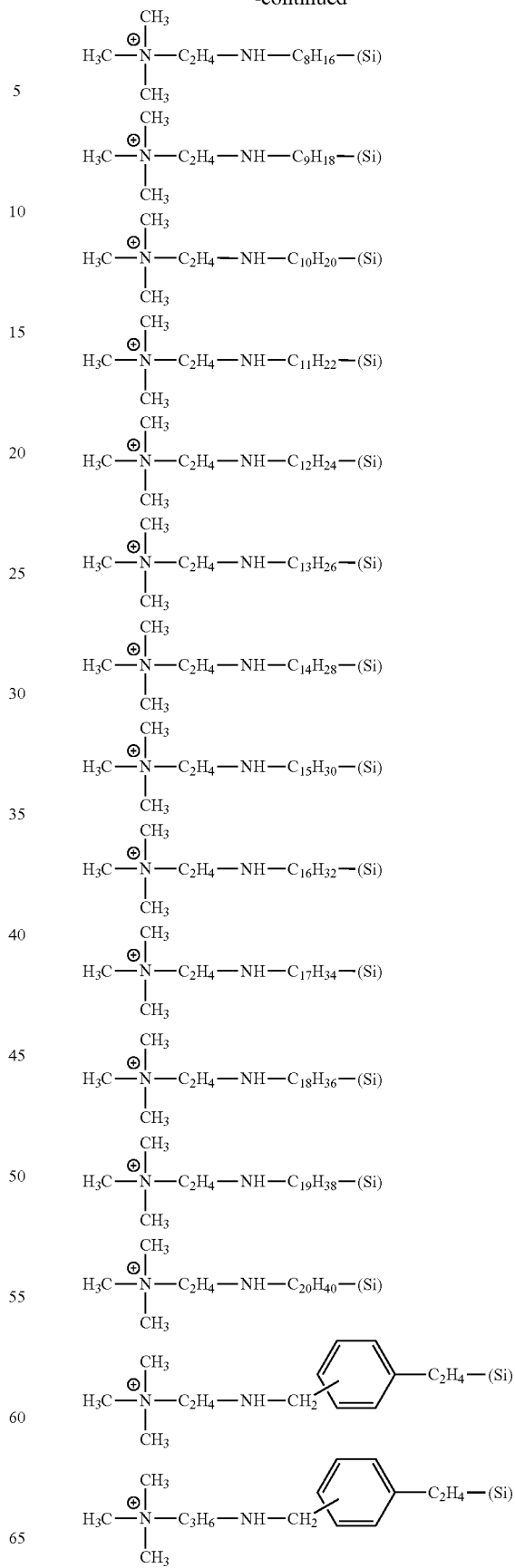

-continued $(CH_3)_3N^+$—$C_4H_8$—NH—$CH_2$—$C_6H_4$—$C_2H_4$—(Si)

$(CH_3)_3N^+$—$C_5H_{10}$—NH—$CH_2$—$C_6H_4$—$C_2H_4$—(Si)

$(CH_3)_3N^+$—$C_6H_{12}$—NH—$CH_2$—$C_6H_4$—$C_2H_4$—(Si)

$(CH_3)_3N^+$—$C_7H_{14}$—NH—$CH_2$—$C_6H_4$—$C_2H_4$—(Si)

$(CH_3)_3N^+$—$C_8H_{16}$—NH—$CH_2$—$C_6H_4$—$C_2H_4$—(Si)

$(CH_3)_3N^+$—$C_9H_{18}$—NH—$CH_2$—$C_6H_4$—$C_2H_4$—(Si)

$(CH_3)_3N^+$—$C_{10}H_{20}$—NH—$CH_2$—$C_6H_4$—$C_2H_4$—(Si)

$(CH_3)_3N^+$—$C_{11}H_{22}$—NH—$CH_2$—$C_6H_4$—$C_2H_4$—(Si)

$(CH_3)_3N^+$—$C_{12}H_{24}$—NH—$CH_2$—$C_6H_4$—$C_2H_4$—(Si)

$(CH_3)_3N^+$—$C_{13}H_{26}$—NH—$CH_2$—$C_6H_4$—$C_2H_4$—(Si)

$(CH_3)_3N^+$—$C_{14}H_{28}$—NH—$CH_2$—$C_6H_4$—$C_2H_4$—(Si)

$(CH_3)_3N^+$—$C_{15}H_{30}$—NH—$CH_2$—$C_6H_4$—$C_2H_4$—(Si)

$(CH_3)_3N^+$—$C_{16}H_{32}$—NH—$CH_2$—$C_6H_4$—$C_2H_4$—(Si)

-continued $(CH_3)_3N^+$—$C_{17}H_{34}$—NH—$CH_2$—$C_6H_4$—$C_2H_4$—(Si)

$(CH_3)_3N^+$—$C_{18}H_{36}$—NH—$CH_2$—$C_6H_4$—$C_2H_4$—(Si)

$(CH_3)_3N^+$—$C_{19}H_{38}$—NH—$CH_2$—$C_6H_4$—$C_2H_4$—(Si)

$(CH_3)_3N^+$—$C_{20}H_{40}$—NH—$CH_2$—$C_6H_4$—$C_2H_4$—(Si)

$(CH_3)_3N^+$—$CH_2$—$C_6H_4$—$C_2H_4$—(Si)

$(CH_3)_2(C_2H_5)N^+$—$CH_2$—$C_6H_4$—$C_2H_4$—(Si)

$(CH_3)_2(C_3H_7)N^+$—$CH_2$—$C_6H_4$—$C_2H_4$—(Si)

$(CH_3)_2(C_4H_9)N^+$—$CH_2$—$C_6H_4$—$C_2H_4$—(Si)

$(CH_3)_2(C_5H_{11})N^+$—$CH_2$—$C_6H_4$—$C_2H_4$—(Si)

$(CH_3)_2(C_6H_{13})N^+$—$CH_2$—$C_6H_4$—$C_2H_4$—(Si)

$(CH_3)_2(C_7H_{15})N^+$—$CH_2$—$C_6H_4$—$C_2H_4$—(Si)

$(CH_3)_2(C_8H_{17})N^+$—$CH_2$—$C_6H_4$—$C_2H_4$—(Si)

$(CH_3)_2(C_9H_{19})N^+$—$CH_2$—$C_6H_4$—$C_2H_4$—(Si)

-continued

[Chemical structures page - quaternary ammonium silane compounds]

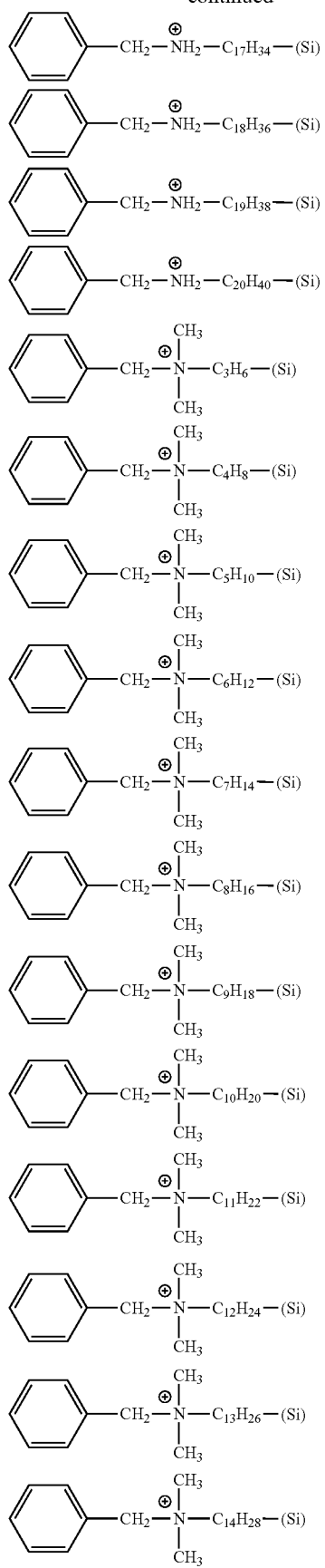
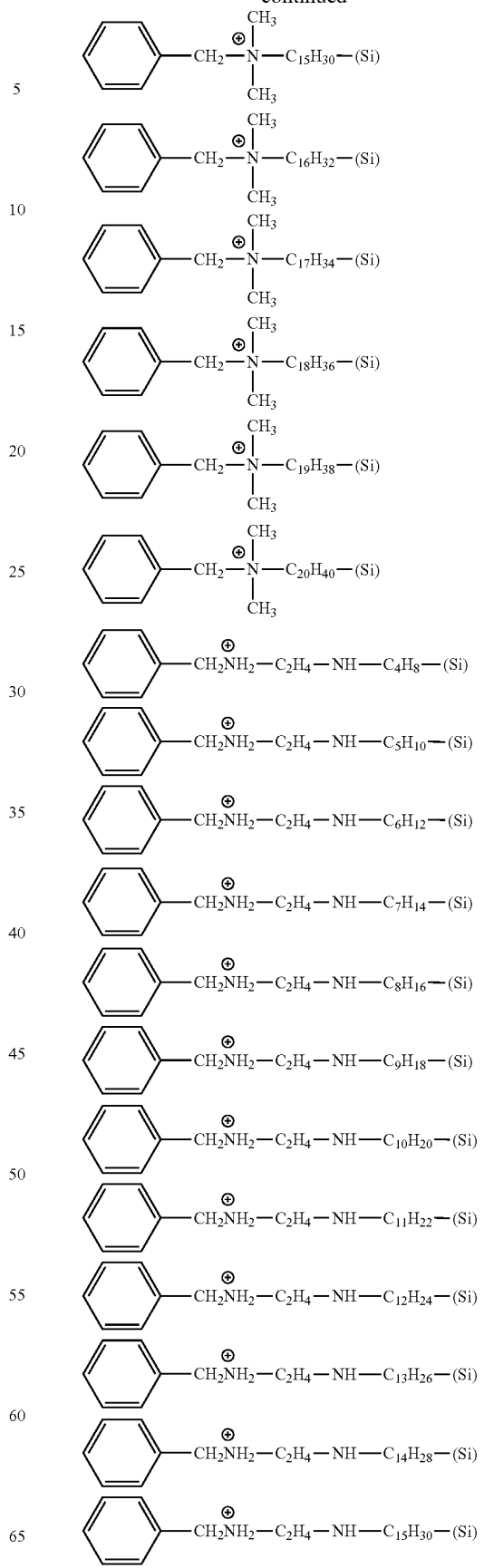

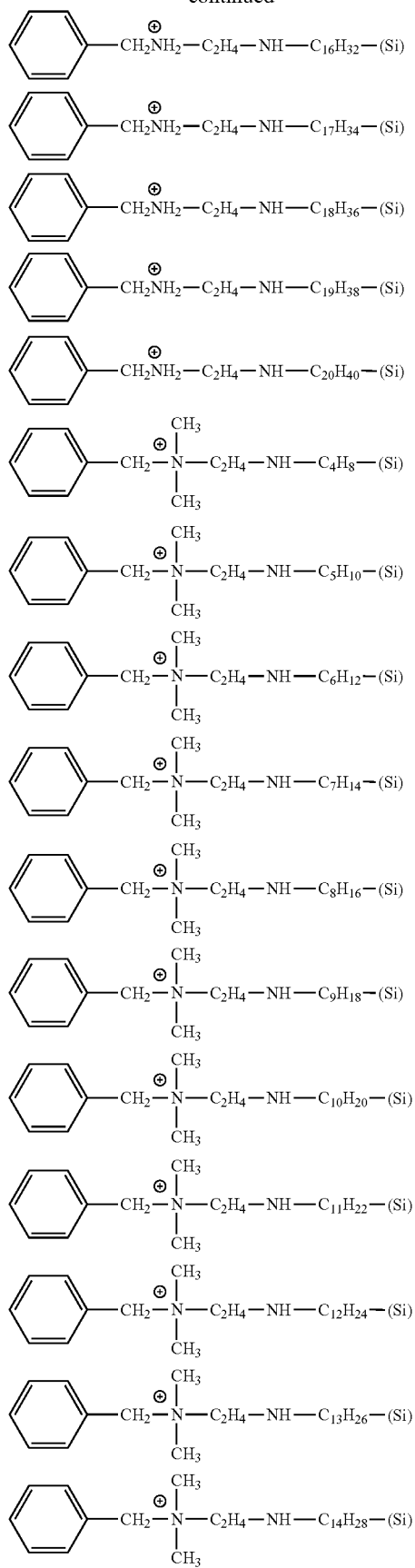
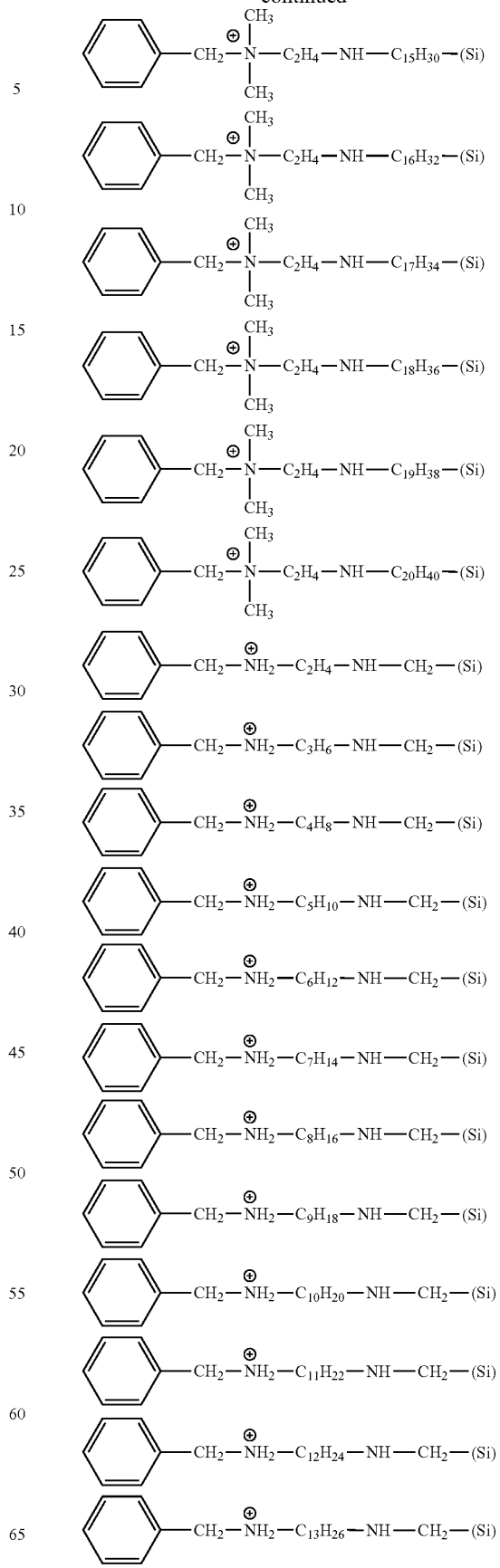

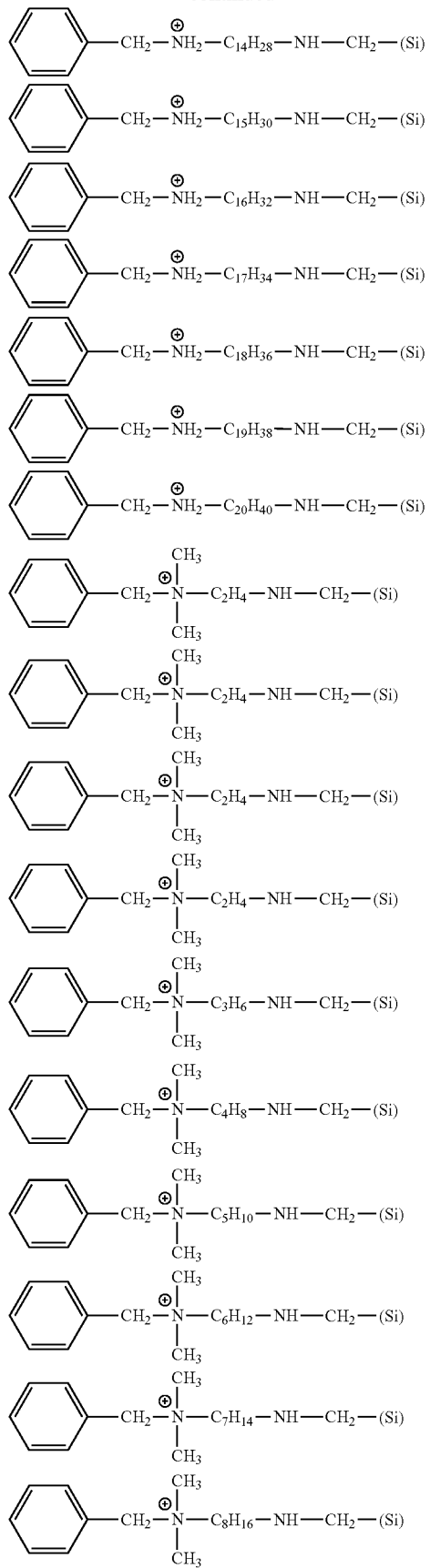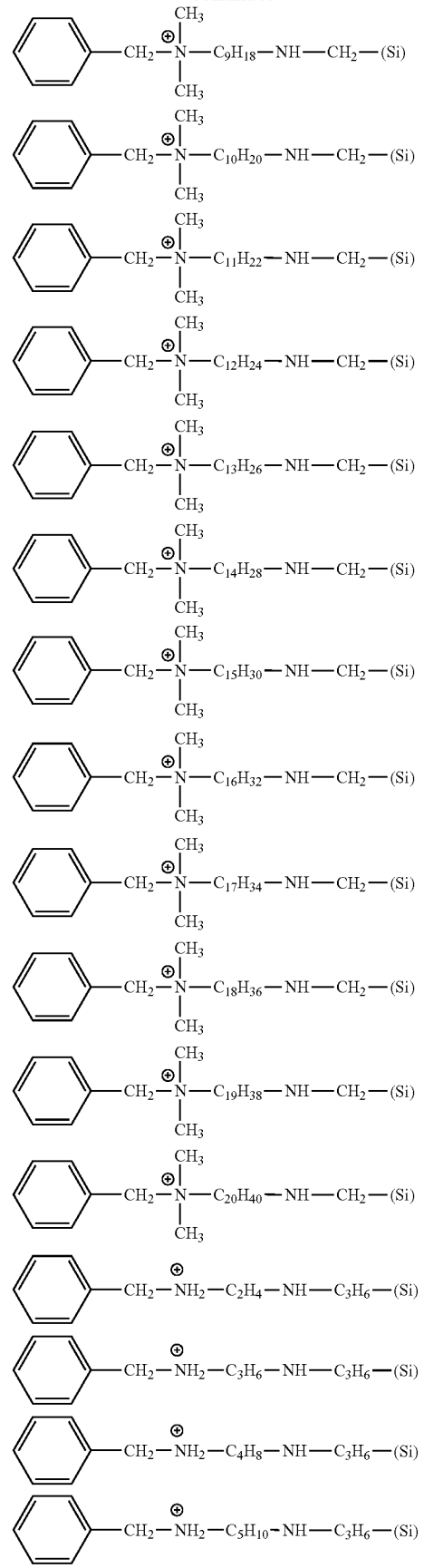

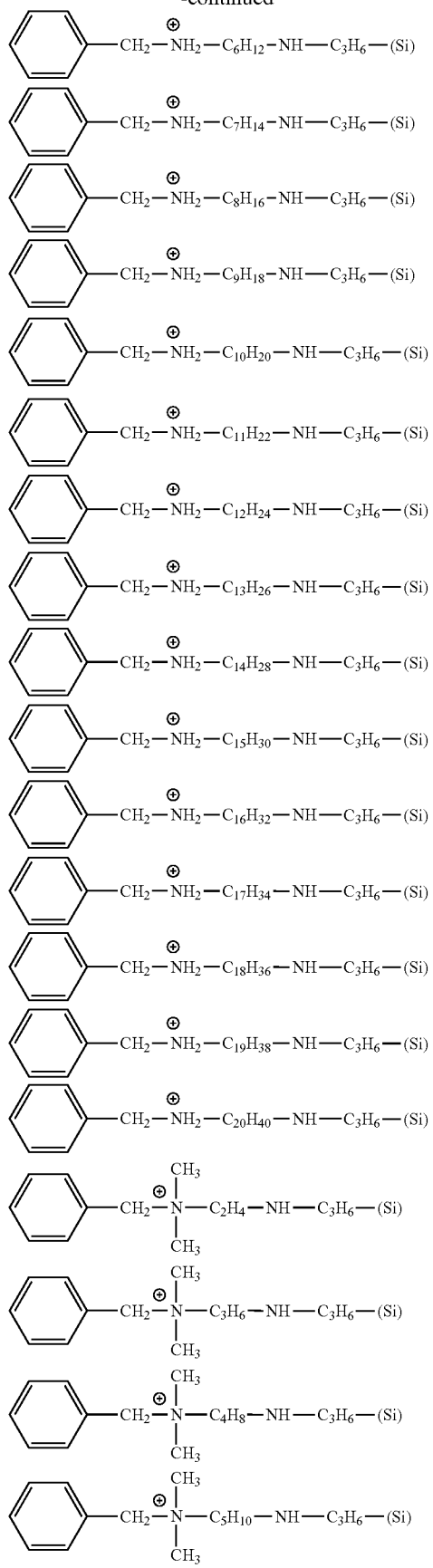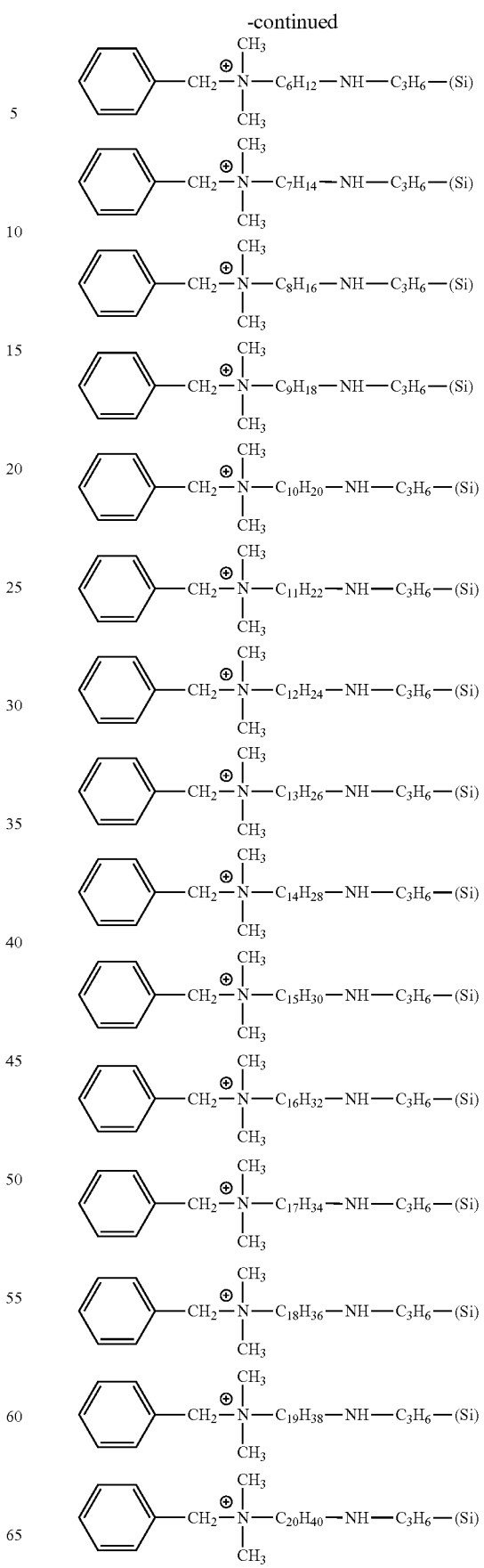

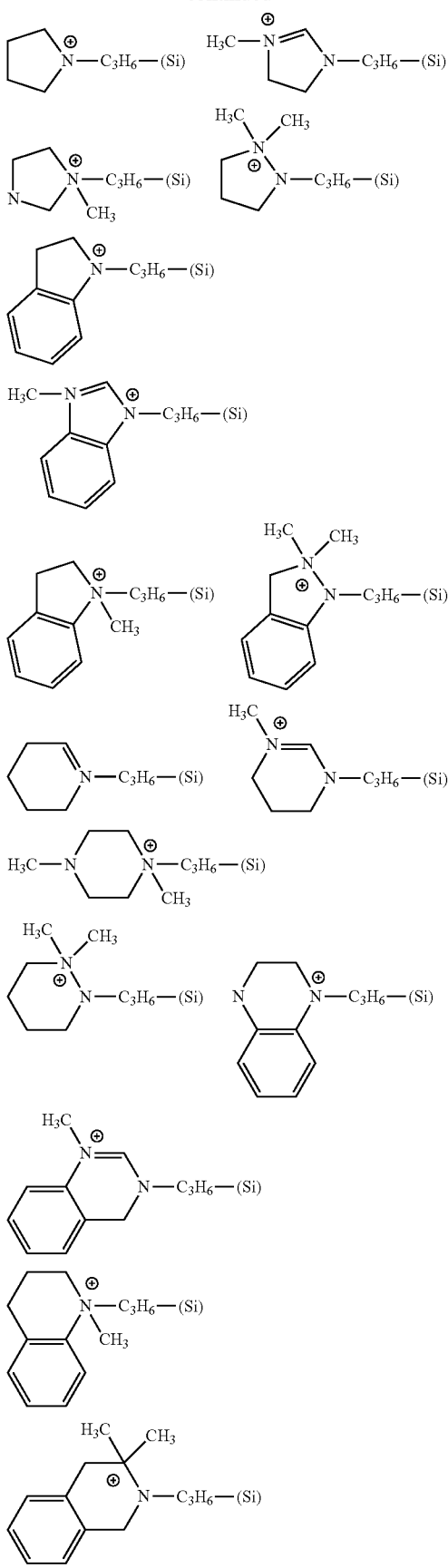

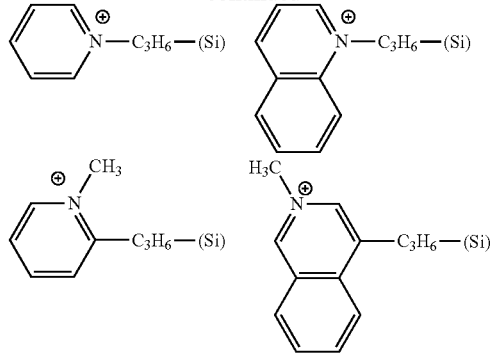

A hydrolysable silicon compound can be used simultaneously with (Xm-1), (Xm-2), (Xm-3), and (Xm-4) to produce (Xc-10). An example of such a hydrolysable silicon compound includes the above-described monomer (Sm).

A reaction raw material for forming (Xc-10) can be prepared by: selecting at least one of the monomers (Xm-1), (Xm-2), (Xm-3), and (Xm-4) in addition to at least one (Sm) described above; and mixing the selected monomers before or during the reaction. The reaction conditions may follow the same method as the method for synthesizing the silicon-containing compound (Sx).

The molecular weight of the silicon-containing compound (Xc-10) to be obtained can be adjusted not only through the selection of the monomers but also by controlling the reaction conditions during the polymerization. If a silicon-containing compound (Xc-10) having a weight average molecular weight of more than 100,000 is used, foreign matters or coating spots are generated in some cases. Thus, it is preferable to use the silicon-containing compound (Xc-10) having a weight average molecular weight of 100,000 or less, more preferably 200 to 50,000, further preferably 300 to 30,000. Regarding data on the weight average molecular weight, the molecular weight is expressed in terms of polystyrene which is obtained by gel permeation chromatography (GPC) using a refractive index (RI) detector, tetrahydrofuran as an eluent, and polystyrene as a reference substance.

Note that one of the crosslinking catalysts (Xc-1), (Xc-2), (Xc-3), (Xc-4), and (Xc-10) can be used alone, or two or more thereof can be used in combination. The amount of the crosslinking catalyst to be added is preferably 0.01 to 50 parts by mass, more preferably 0.1 to 40 parts by mass, based on 100 parts by mass of the base polymer (for example, the silicon-containing compound (Sx) obtained by the above method).

The inventive composition for forming a silicon-containing film can be further blended with the following raw materials, too.

(Organic Acid)

To improve the stability of the inventive composition for forming a silicon-containing film, it is preferable to add a monovalent, divalent, or more polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Particularly, oxalic acid, maleic acid, formic acid, acetic acid, propionic acid, citric acid, and the like are preferable. Moreover, a mixture of two or more acids may be used to keep the stability. The amount of the acid to be added may be 0.001 to 25 parts by mass, preferably 0.01 to 15 parts by mass, more preferably 0.1 to 5 parts by mass, based on 100 parts by mass of silicon contained in the composition.

Otherwise, the organic acid(s) may be blended based on the pH of the composition so as to satisfy preferably $0 \leq pH \leq 7$, more preferably $0.3 \leq pH \leq 6.5$, further preferably $0.5 \leq pH \leq 6$.

(Water)

In the present invention, water may be added to the composition. When water is added, the polysiloxane compound in the composition is hydrated, so that the lithography performance is improved. The water content in the solvent component of the composition may be more than 0 mass % and less than 50 mass %, particularly preferably 0.3 to 30 mass %, further preferably 0.5 to 20 mass %. When the amount of water added is less than 50 mass %, a silicon-containing middle layer film prepared using the inventive composition for forming a silicon-containing film has little risk of uniformity deterioration, and repelling will not occur, either. Meanwhile, when the amount of water added exceeds 0 mass %, the lithography performance will not be lowered.

The solvent including water is used in a total amount of preferably 100 to 100,000 parts by mass, particularly preferably 200 to 50,000 parts by mass, based on 100 parts by mass of the polysiloxane compound (the silicon-containing compound (Sx)), which is the base polymer.

(Photo-Acid Generator)

In the present invention, a photo-acid generator may be added to the composition. As the photo-acid generator used in the present invention, it is possible to add, specifically, the materials described in paragraphs (0160) to (0179) of Japanese Unexamined Patent Application Publication No. 2009-126940.

Besides, the inventive composition for forming a silicon-containing film (for example, composition for forming a silicon-containing resist underlayer film for EUV lithography) may contain one or more compounds (each of which has an anion moiety and a cation moiety in one molecule) shown by the following general formula (P-0):

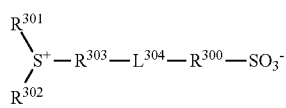
(P-0)

where $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom. $R^{303}$ represents a linear, branched, or cyclic divalent hydrocarbon group having 1 to 20 carbon atoms optionally substituted with a hetero atom or optionally containing a hetero atom. Moreover, $R^{301}$ and $R^{302}$, or $R^{301}$ and $R^{303}$, are optionally bonded to each other to form a ring with a sulfur atom in the formula. $L^{304}$ represents a single bond or a linear, branched, or cyclic divalent hydrocarbon group having 1 to 20 carbon atoms optionally substituted with a hetero atom or optionally containing a hetero atom.

In the general formula (P-0), $R^{300}$ is a divalent organic group having one or more fluorine atoms as a result of substitution. The divalent organic group represents, for example, a linear, branched, or cyclic divalent hydrocarbon group, such as an alkylene group, an alkenylene group, and an arylene group having 1 to 20 carbon atoms. Specific examples of $R^{300}$ include ones shown by the following formulae.

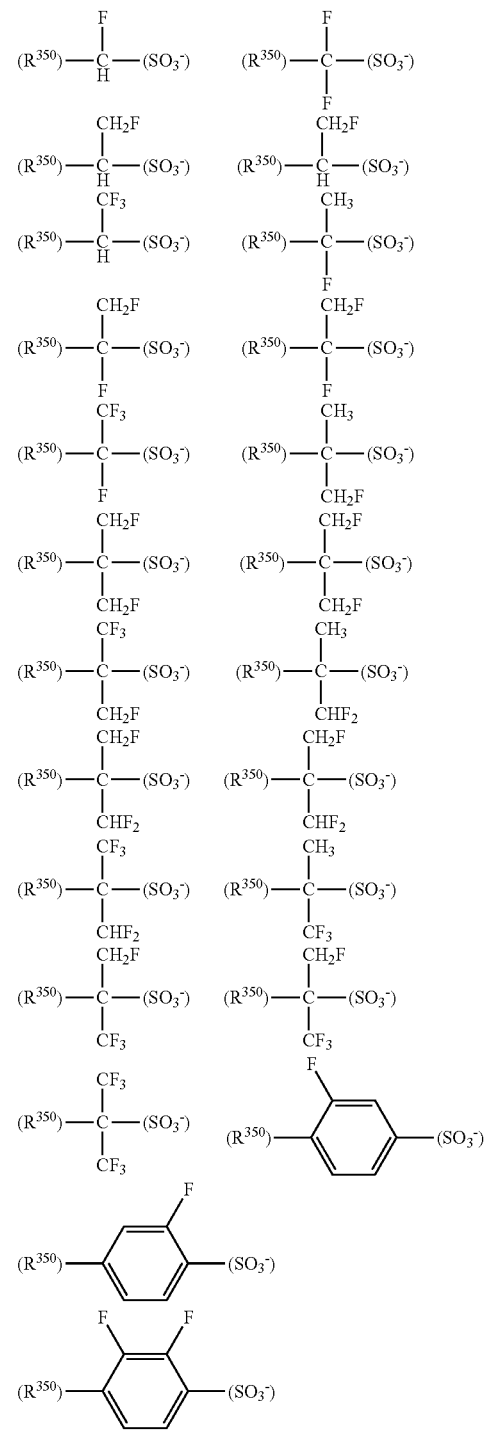

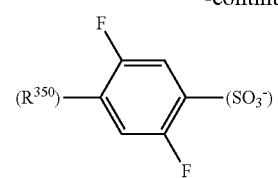
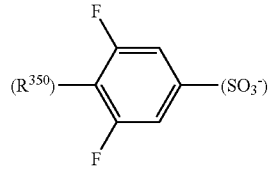
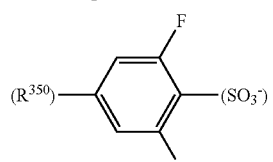
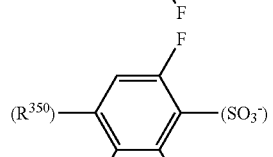
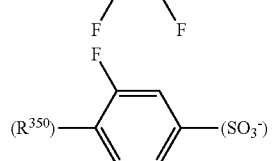
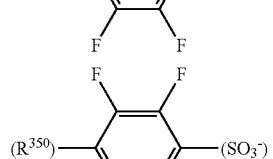
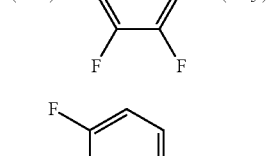
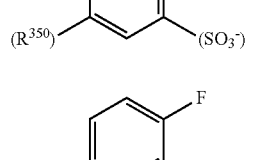
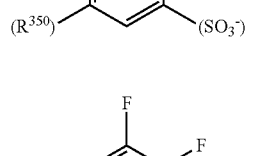
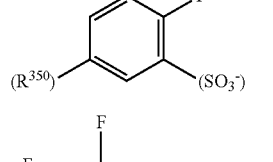
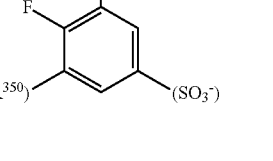
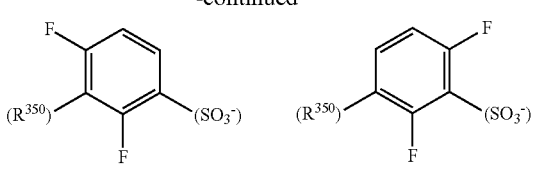
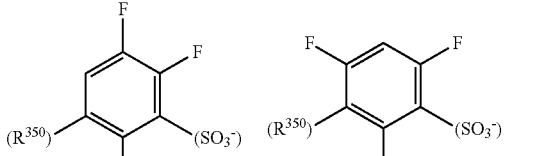
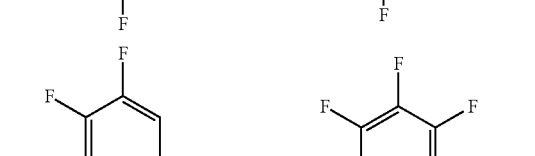
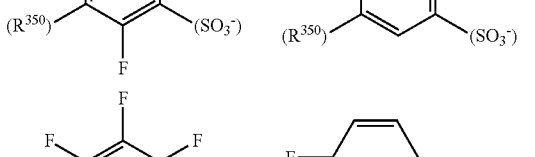
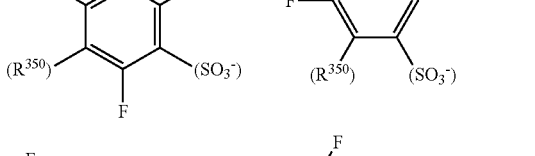
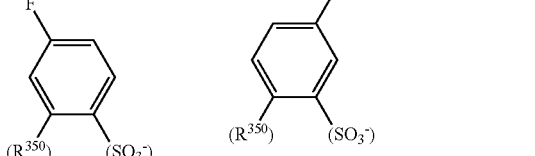
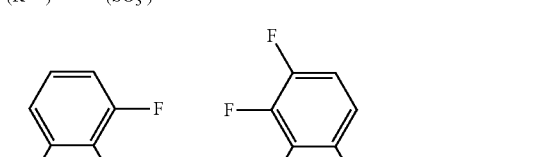
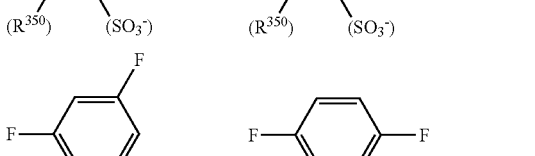
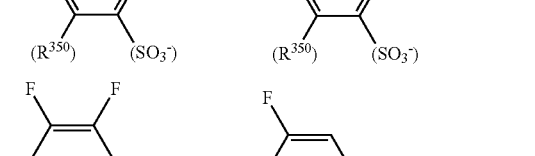
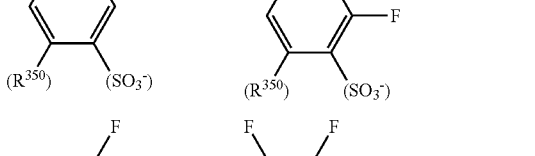
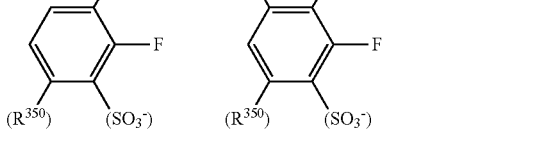

-continued

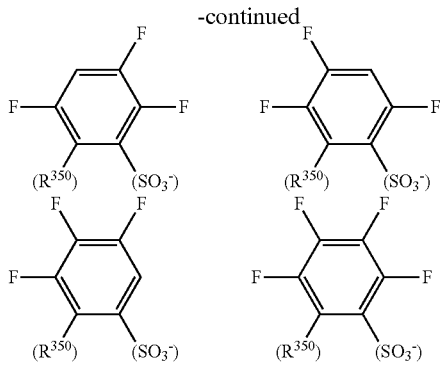

Note that, in the above formulae, $(SO_3^-)$ is depicted to show a bonding site to the $SO_3^-$ group in the general formula (P-0). Moreover, $(R^{350})$ is depicted to show a bonding site to a portion where the cation moiety in the general formula (P-0) bonds to $R^{300}$ via $L^{304}$.

$R^{301}$ and $R^{302}$ each independently represent a linear, branched, or cyclic monovalent hydrocarbon group, such as an alkyl group, an alkenyl group, an aryl group, an aralkyl group, having 1 to 20 carbon atoms optionally substituted with a hetero atom or optionally containing a hetero atom. Examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, a thienyl group, and the like; a 4-hydroxyphenyl group; alkoxyphenyl groups such as a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkylphenyl groups such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group; alkylnaphthyl groups such as a methylnaphthyl group and an ethylnaphthyl group; alkoxynaphthyl groups such as a methoxynaphthyl group, an ethoxynaphthyl group, an n-propoxynaphthyl group, and an n-butoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a 1-phenylethyl group, a 2-phenylethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like. Additionally, $R^{301}$ and $R^{302}$ may be bonded to each other to form a ring together with the sulfur atom in the formula; in this case, examples of the ring include groups shown by the following formulae.

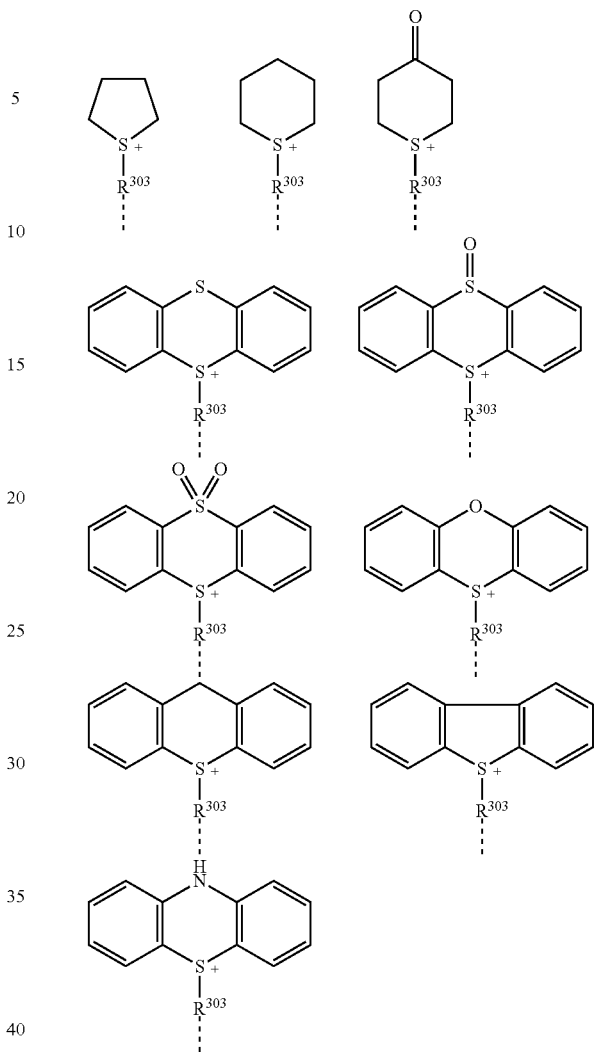

In the general formula (P-0), $R^{303}$ represents a linear, branched, or cyclic divalent hydrocarbon group having 1 to 20 carbon atoms optionally substituted with a hetero atom or optionally containing a hetero atom. Specific examples of $R^{303}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of hydrogen atoms of these groups may be substituted with an alkyl group such as a methyl group, an ethyl group, a propyl group, an n-butyl group, and a tert-butyl group. Alternatively, such hydrogen atoms may be substituted with a hetero atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed. Further, $R^{301}$ and $R^{303}$ may be bonded to each other to form a ring together with the sulfur atom in the formula; in this case, examples of the ring include groups shown by the following formulae.

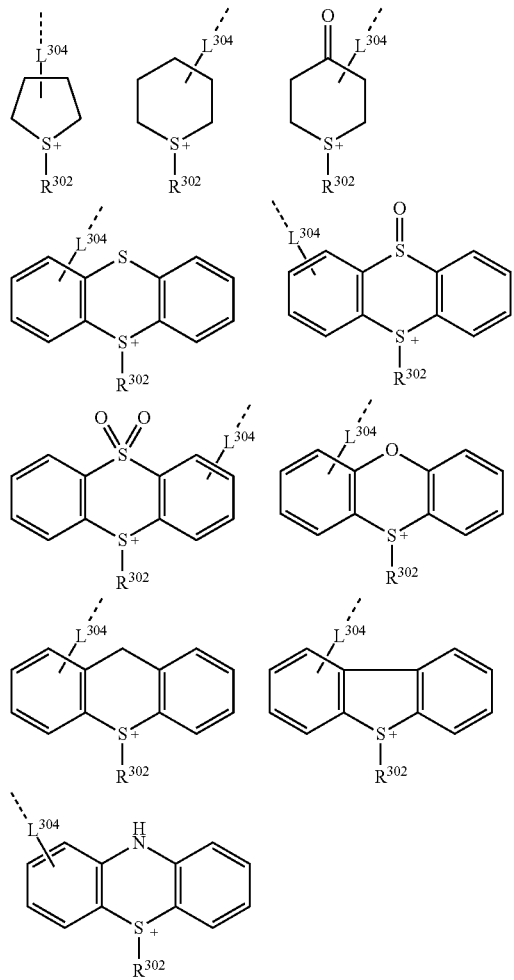

In the general formula (P-0), $L^{304}$ represents a single bond or a linear, branched, or cyclic divalent hydrocarbon group having 1 to 20 carbon atoms optionally substituted with a hetero atom or optionally containing a hetero atom. Specific examples of $L^{30}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of hydrogen atoms of these groups may be substituted with an alkyl group such as a methyl group, an ethyl group, a propyl group, an n-butyl group, and a tert-butyl group. Alternatively, such hydrogen atoms may be substituted with a hetero atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a suitone ring, carboxylic anhydride, a haloalkyl group, or the like may be formed.

The photo-acid generator shown by the general formula (P-0) is preferably shown by the following general formula (P-1):

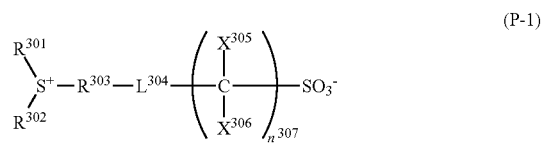

where $X^{305}$ and $X^{306}$ each independently represent a hydrogen atom, a fluorine atom, or a trifluoromethyl group, but not all of $X^{305}$'s and $X^{306}$'s are hydrogen atoms simultaneously; $n^{307}$ represents an integer of 1 to 4; and $R^{301}$, $R^{302}$, $R^{303}$, and $L^{304}$ are as defined above.

The photo-acid generator shown by the general formula (P-0) is more preferably shown by the following general formula (P-1-1).

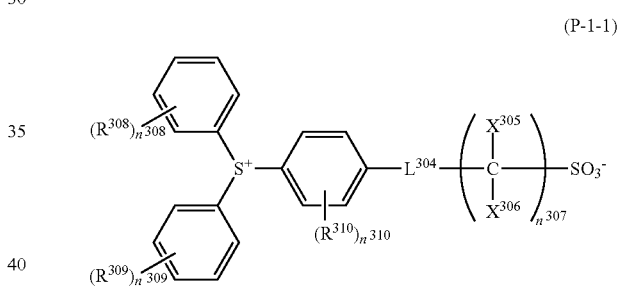

In the general formula (P-1-1), $R^{308}$, $R^{309}$, and $R^{310}$ each independently represent a hydrogen atom or a linear, branched, or cyclic monovalent hydrocarbon group having 1 to 20 carbon atoms optionally containing a hetero atom. Specific examples of the monovalent hydrocarbon group include a methyl group, an ethyl group, a propyl group, an isopropyl group, an n-butyl group, a sec-butyl group, a tert-butyl group, a tert-amyl group, an n-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo [5.2.1.0$^{2,6}$]decanyl group, an adamantyl group, and the like. Additionally, some of hydrogen atoms of these groups may be substituted with a hetero atom such as an oxygen atom, a sulfur atom, a nitrogen atom, and a halogen atom. The monovalent hydrocarbon group may contain a hetero atom such as an oxygen atom, a sulfur atom, and a nitrogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed or contained. The monovalent hydrocarbon group is preferably a methyl group, a methoxy group, a tert-butyl group, or a tert-butoxy group.

In the general formula (P-1-1), $n^{308}$ and $n^{309}$ each represent an integer of 0 to 5, preferably 0 or 1. $n^{310}$ represents an integer of 0 to 4, preferably 0 or 2. $L^{304}$, $X^{305}$, $X^{306}$, and $n^{307}$ are as defined above.

The photo-acid generator shown by the general formula (P-0) is further preferably shown by the following general formula (P-1-2).

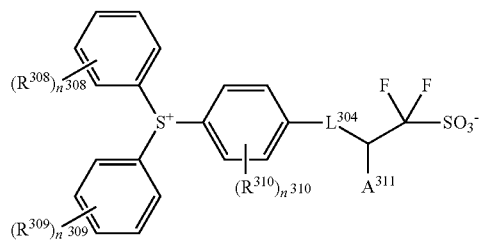

(P-1-2)

In the general formula (P-1-2), $A^{311}$ represents a hydrogen atom or a trifluoromethyl group. $R^{308}$, $R^{309}$, $R^{310}$, $n^{308}$, $n^{309}$, $n^{310}$, and $L^{304}$ are as defined above.

More specific examples of the photo-acid generators shown by the general formulae (P-0), (P-1), (P-1-1), and (P-1-2) include ones with structures shown below. Nevertheless, the photo-acid generator is not limited thereto.

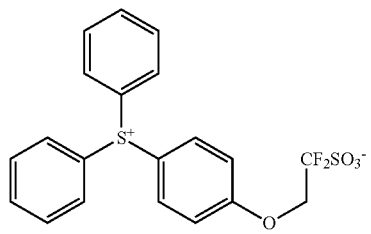

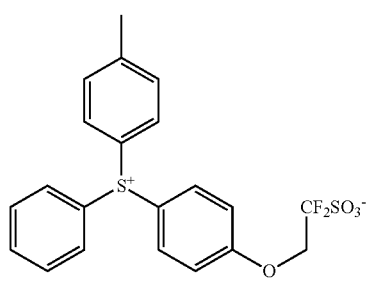

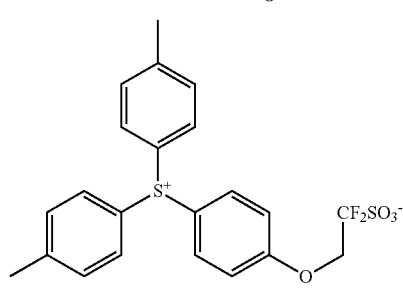

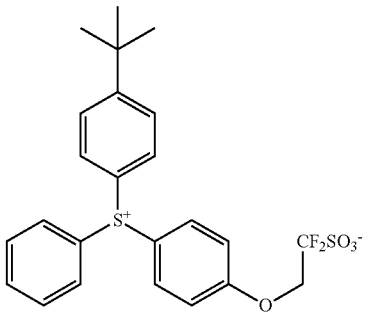

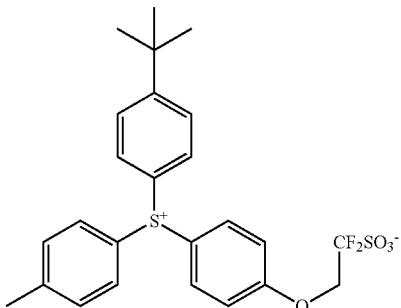

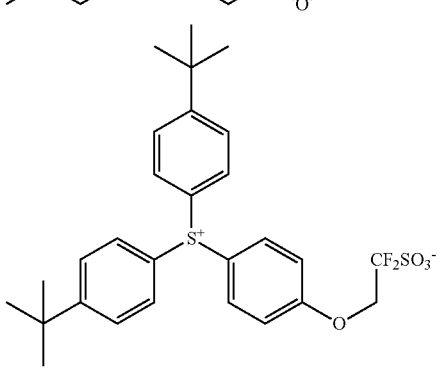

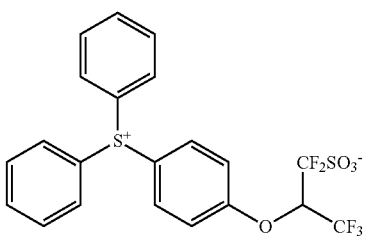

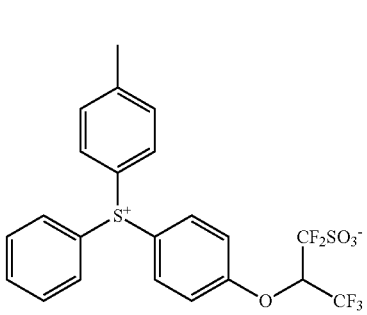

111
-continued
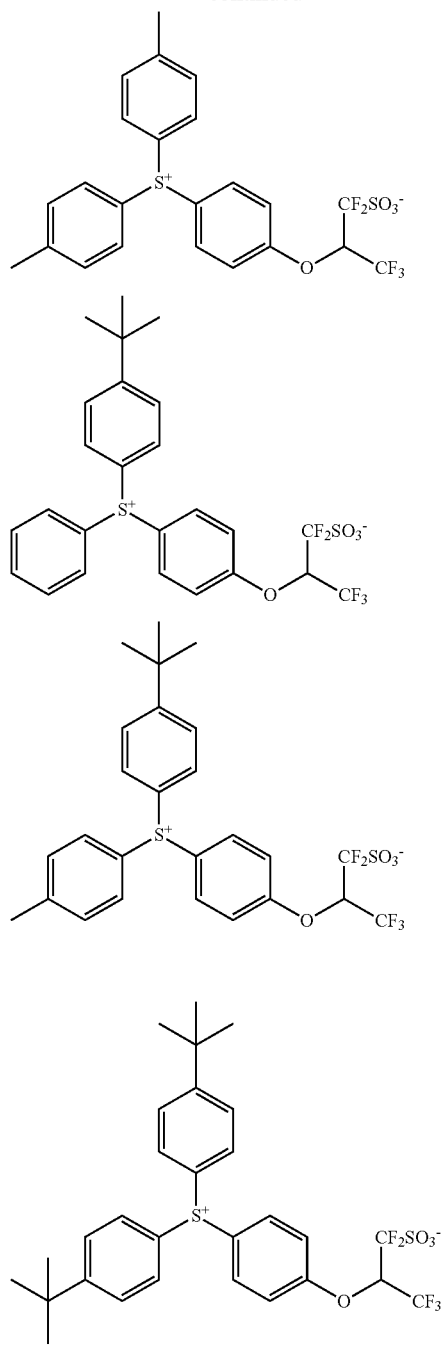
112
-continued
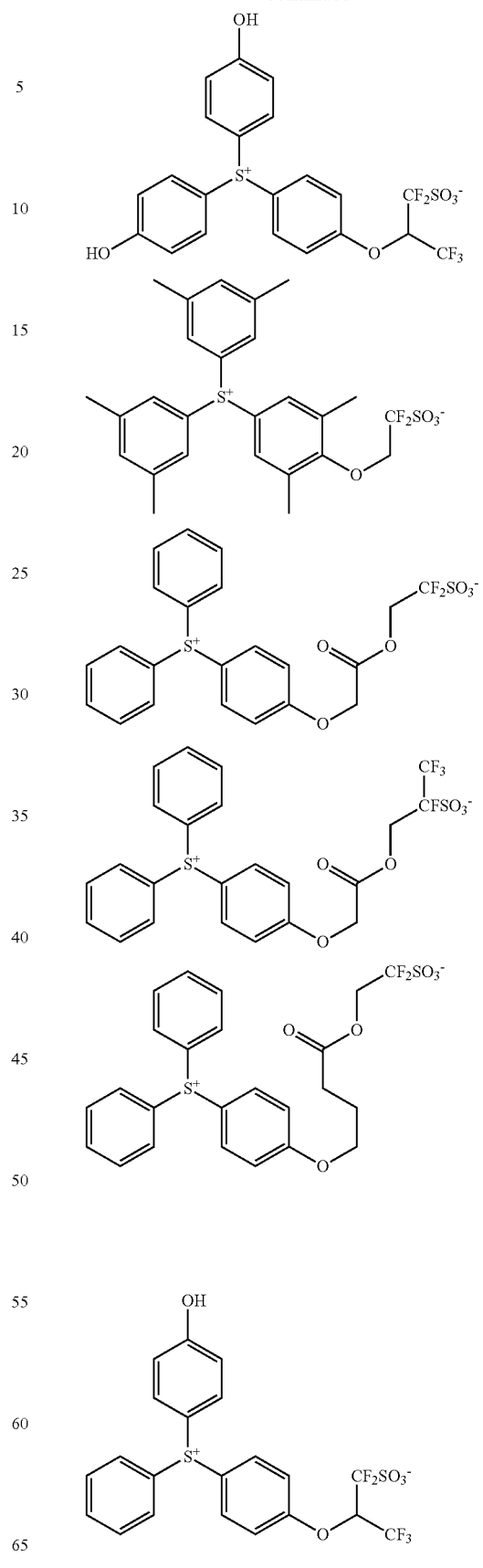

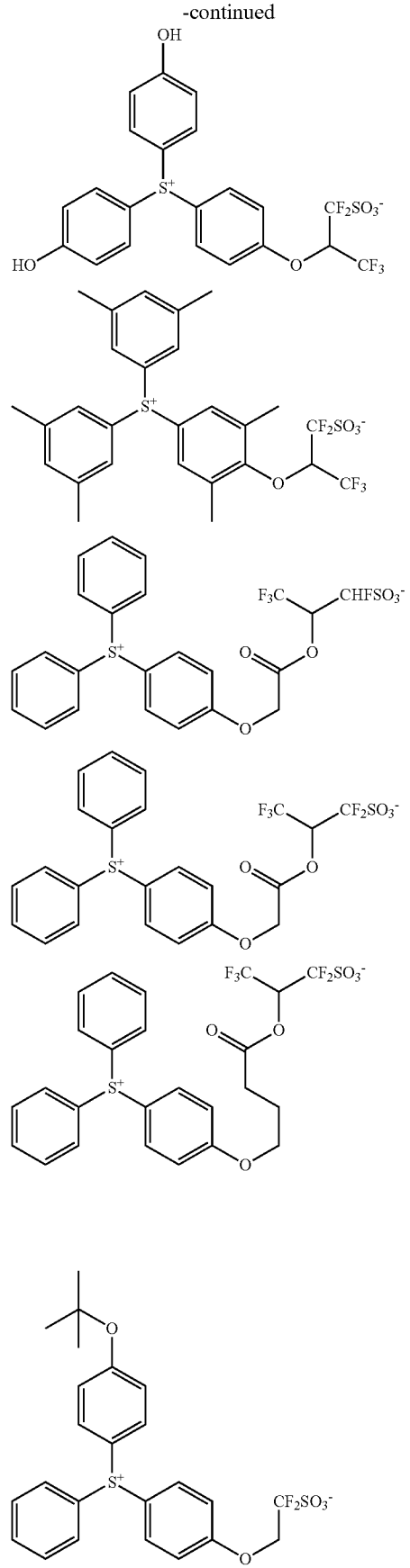
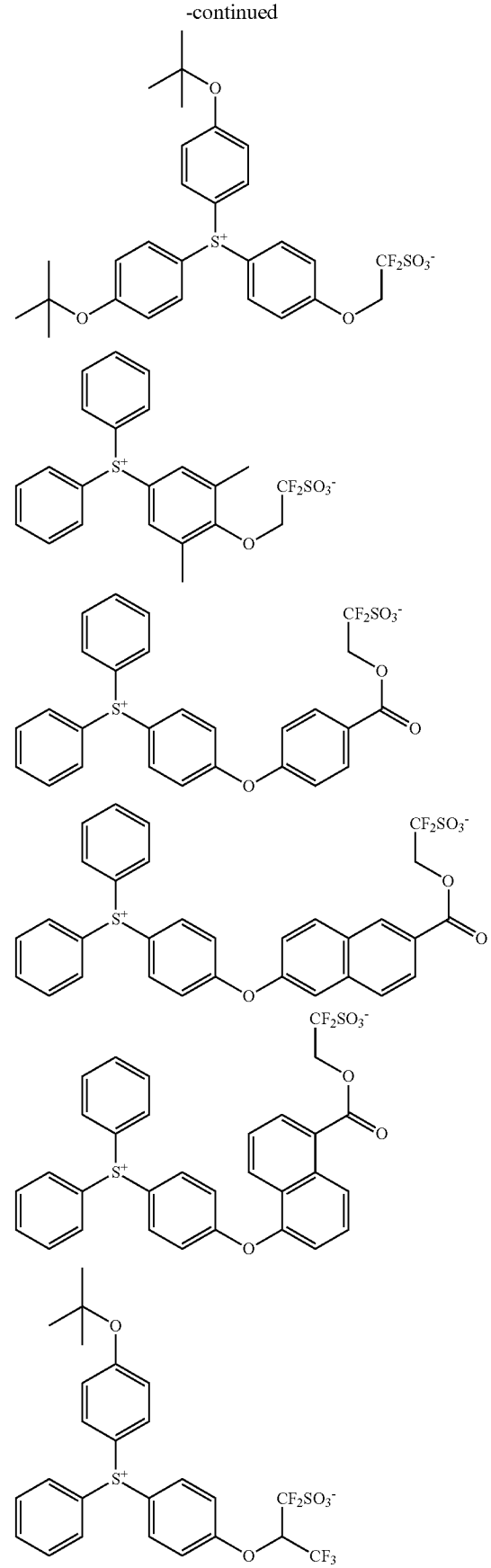

-continued
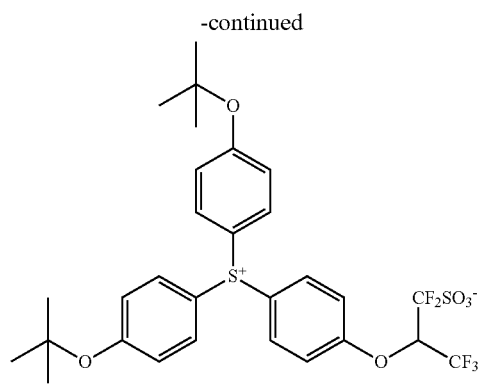
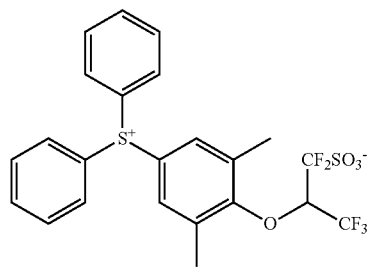
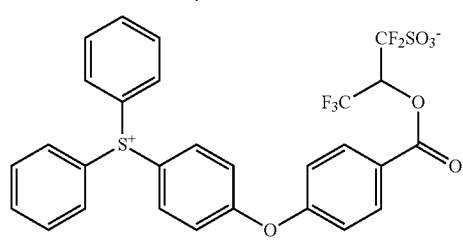
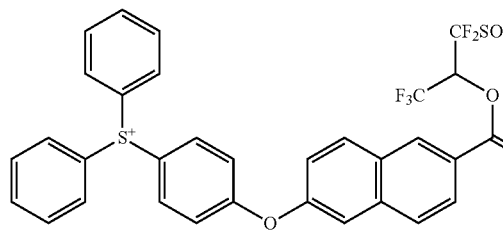
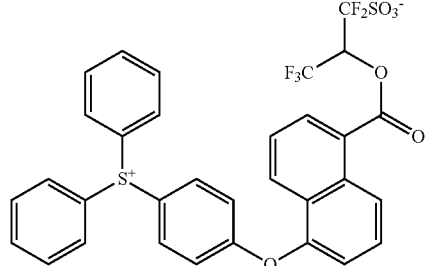
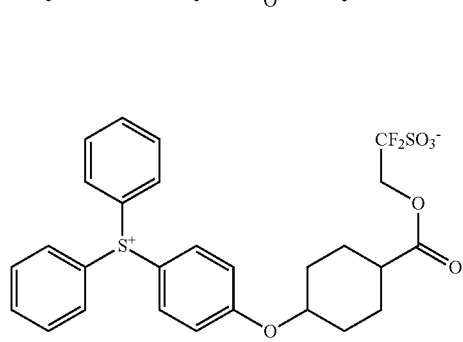
-continued
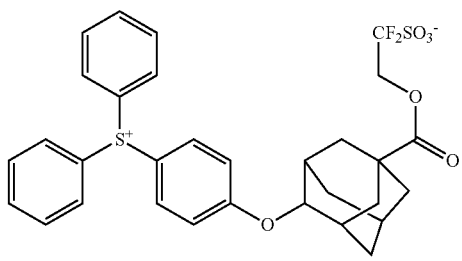
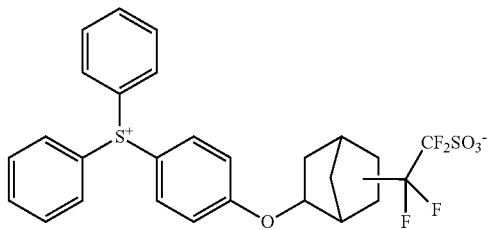
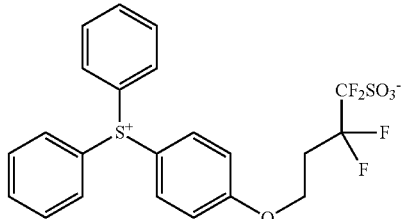
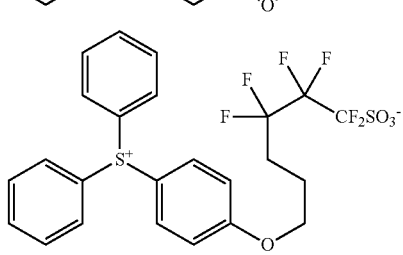
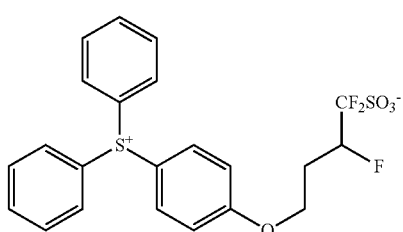
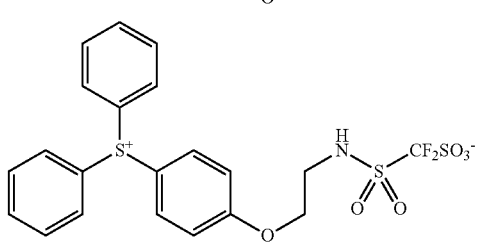
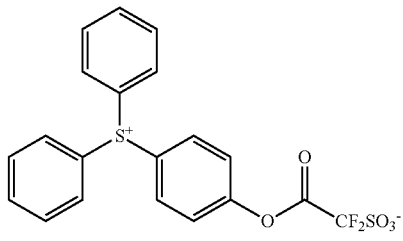

117
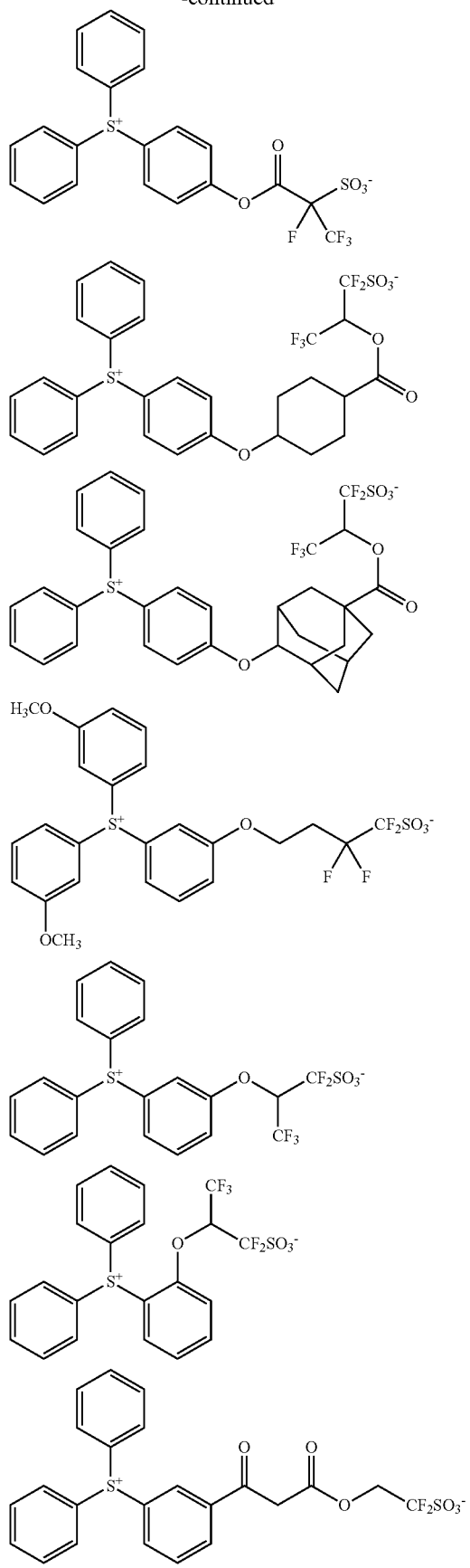
118
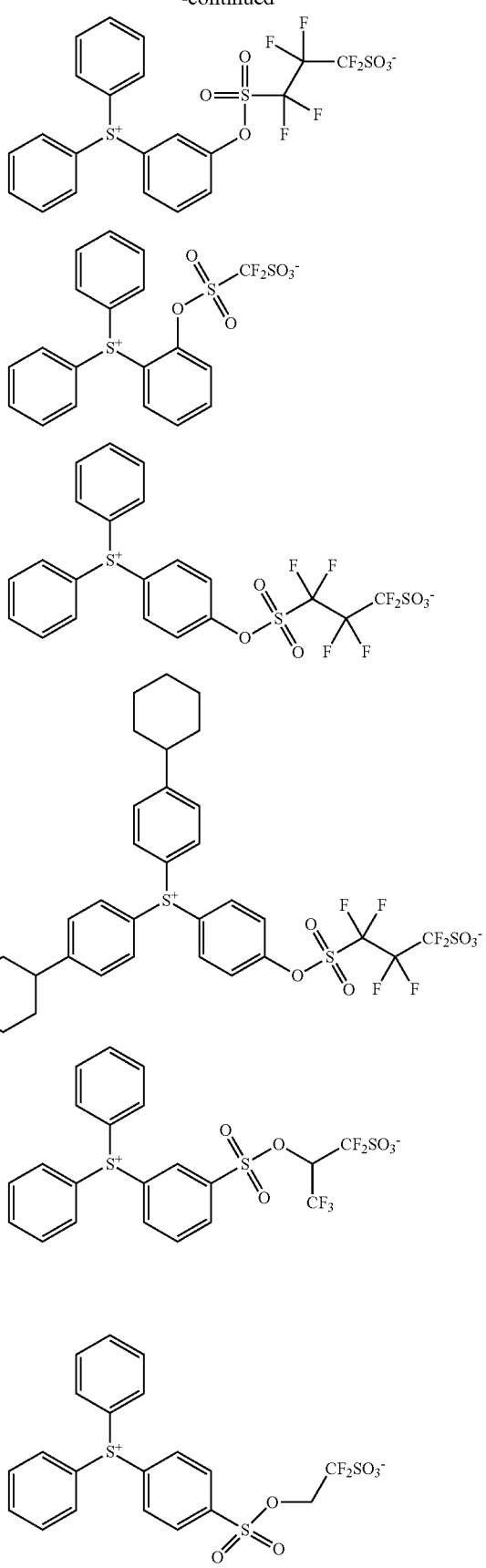

119
-continued
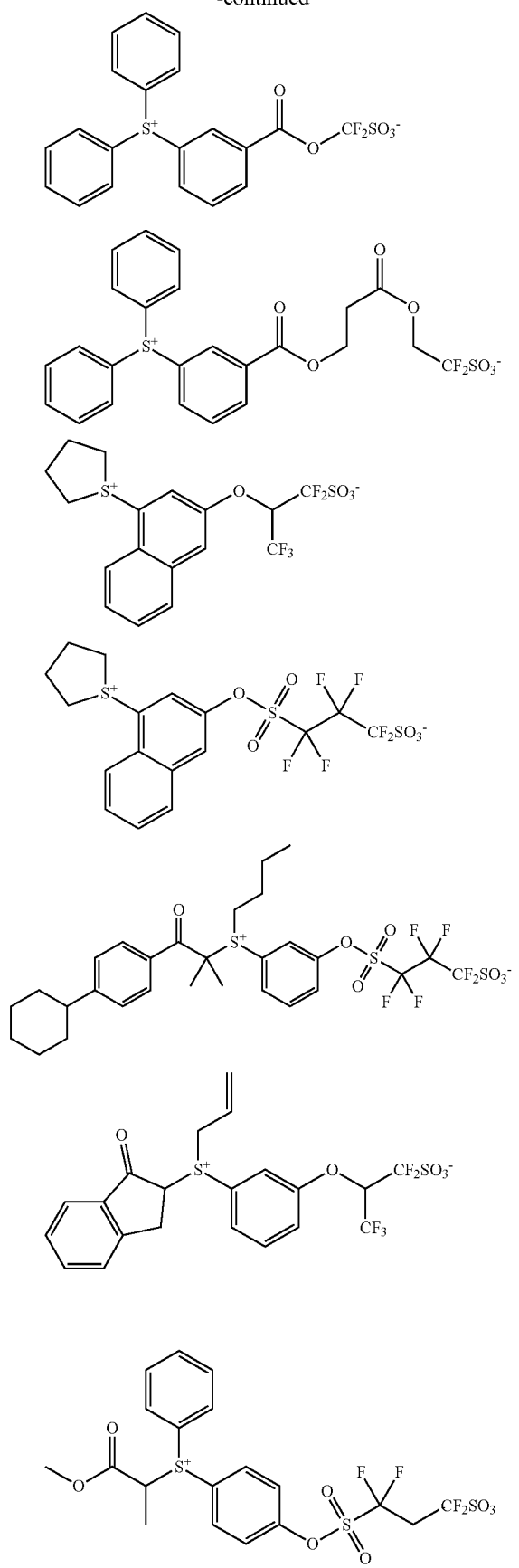
120
-continued
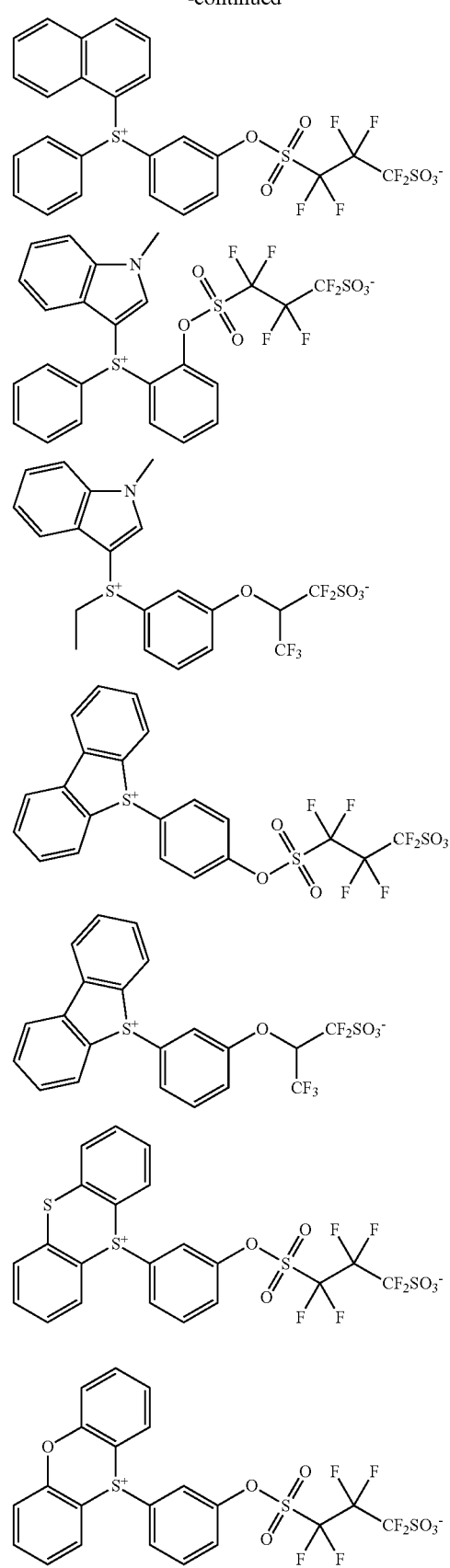

121
-continued
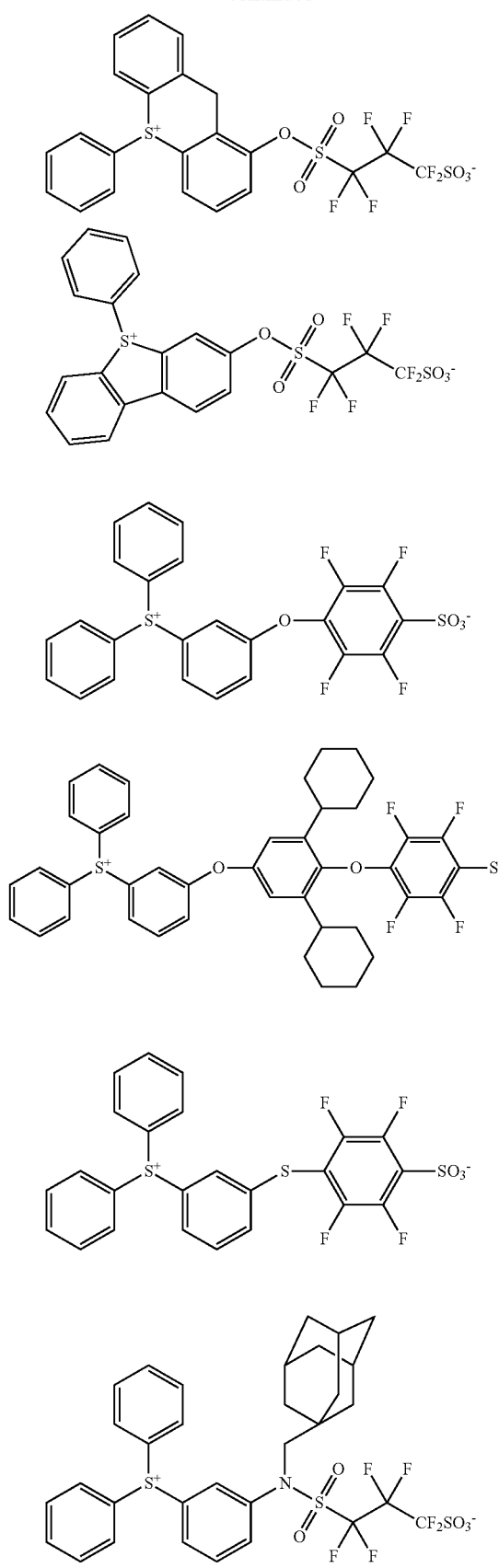
122
-continued
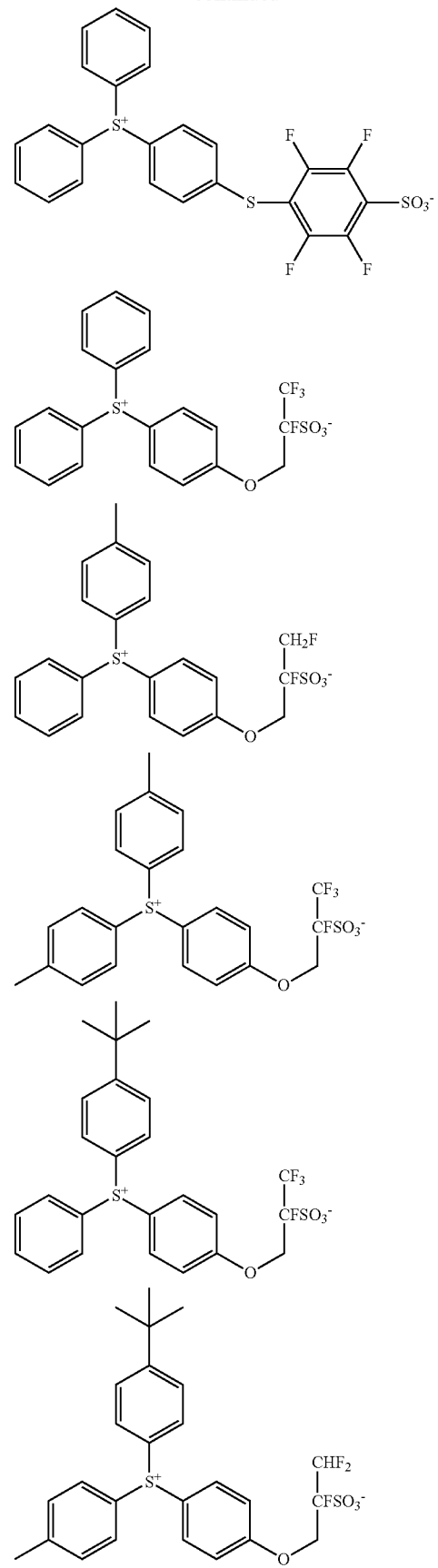

123
-continued
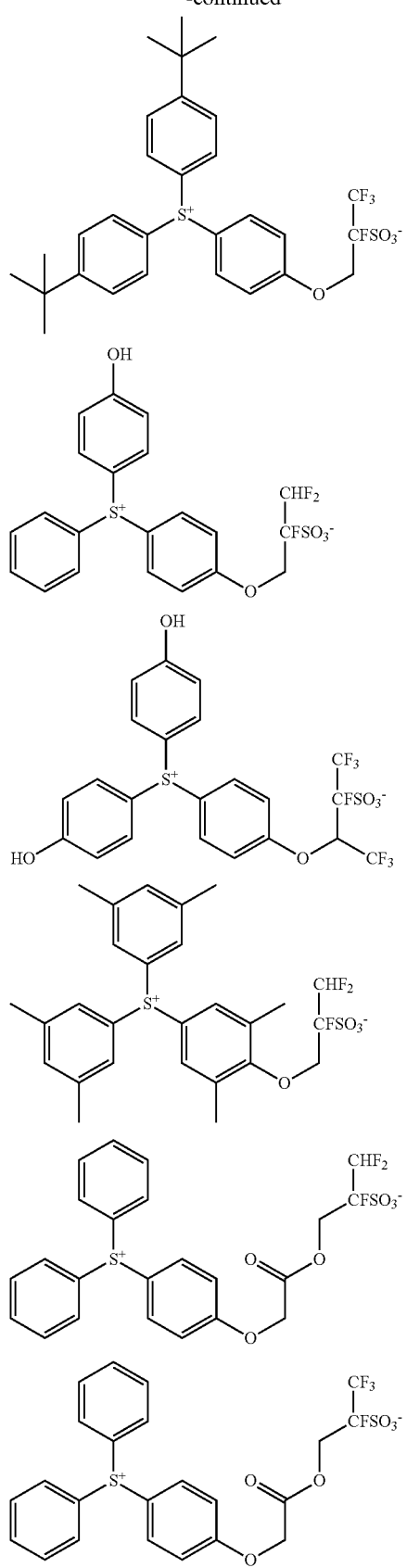
124
-continued
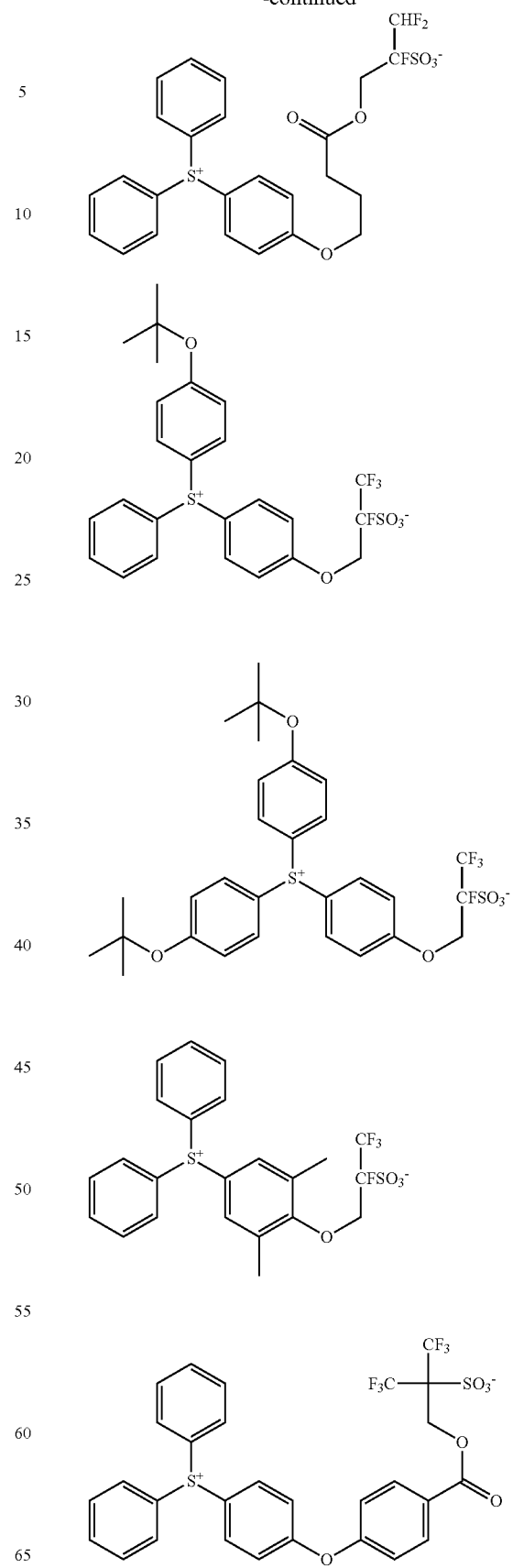

-continued

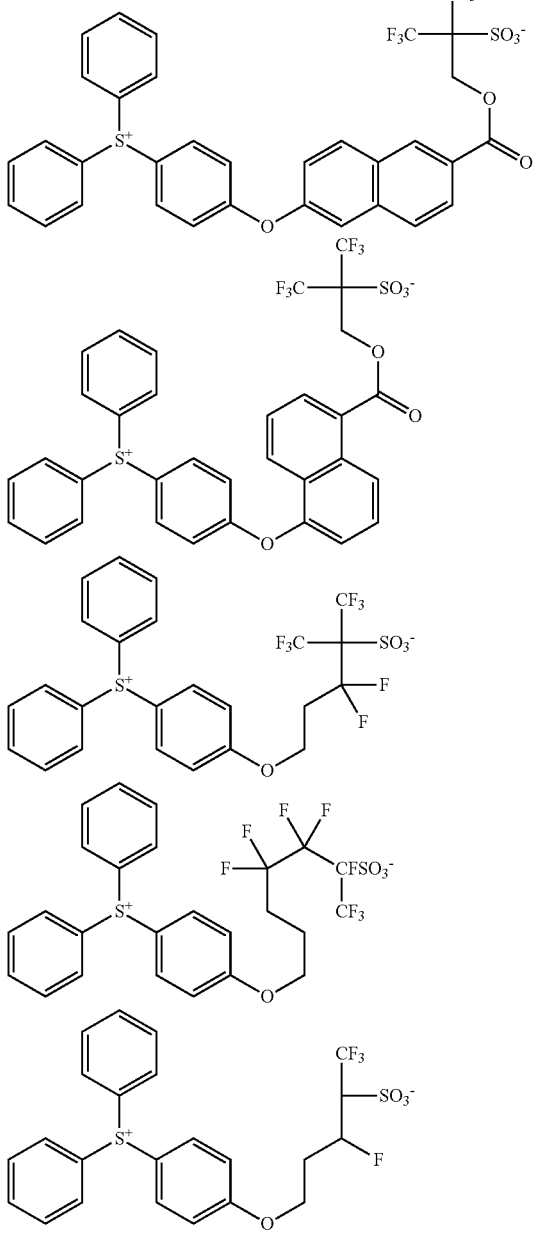

The compound shown by the general formula (P-0) can be added in an amount of 0.001 to 40 parts by mass, preferably 0.1 to 40 parts by mass, further preferably 0.1 to 20 parts by mass, based on 100 parts by mass of the thermosetting silicon-containing compound (thermally crosslinkable polysiloxane). By adding photo-acid generators as described above, the residue of an exposed part of an upper layer resist is reduced, so that a pattern with small LWR can be formed.

(Stabilizer)

Further, in the present invention, a stabilizer can be added to the composition. As the stabilizer, a monohydric, dihydric, or polyhydric alcohol having cyclic ether substituent can be added. Particularly, adding stabilizers shown in paragraphs (0181) to (0182) of Japanese Unexamined Patent Application Publication No. 2009-126940 enables stability improvement of the inventive composition for forming a silicon-containing film.

(Surfactant)

Further, in the present invention, a surfactant can be blended into the composition as necessary. Specifically, the materials described in paragraph (0185) of Japanese Unexamined Patent Application Publication No. 2009-126940 can be added as the surfactant.

(Other Component)

Further, in the present invention, a high-boiling-point solvent having a boiling point of 180° C. or more can also be added to the composition as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, and the like.

[Patterning Process]

The present invention further provides a patterning process including steps of:

(1) forming on a body to be processed, an organic underlayer film, a silicon-containing middle layer film made from the inventive composition for forming a silicon-containing film thereon, and further an upper layer resist film thereon;

(2) subjecting the upper layer resist film to exposure and development to form an upper layer resist pattern;

(3) transferring the upper layer resist pattern to the silicon-containing middle layer film by dry etching using the upper layer resist pattern as a mask, and further transferring the upper layer resist pattern to the organic underlayer film by dry etching using the silicon-containing middle layer film having the transferred upper layer resist pattern as a mask while a portion of the silicon-containing middle layer film is left on an upper portion of the organic underlayer film to form an organic underlayer film pattern;

(4) removing the silicon-containing middle layer film remaining on the upper portion of the organic underlayer film pattern with a stripping liquid;

(5) forming an inorganic silicon film made of polysilicon, amorphous silicon, silicon oxide, silicon nitride, silicon oxynitride, silicon carbide, or a composite material thereof by a CVD method or an ALD method to cover the organic underlayer film pattern;

(6) removing a portion of the inorganic silicon film by dry etching to expose the upper portion of the organic underlayer film pattern; and (7) removing the organic underlayer film pattern to form an inorganic silicon film pattern whose pattern pitch is ½ of that of the upper layer resist pattern.

In the step (4), the stripping liquid preferably contains one or both of a fluoride ion and a nitrogen-containing cation.

Moreover, the body to be processed is preferably a semiconductor device substrate, or the semiconductor device substrate coated with a metal film, an alloy film, a metal carbide film, a metal oxide film, a metal nitride film, a metal oxycarbide film, or a metal oxynitride film.

Further, the metal of the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

The inventive patterning process according to a 3-layer resist method is as follows (see FIG. 1). In this process, first, on a body 1 to be processed, an organic underlayer film 2 is formed by spin coating (FIG. 1(a), (b)). This organic underlayer film 2 acts as a mask when the body 1 to be processed is etched. Thus, the organic underlayer film 2 desirably has high etching resistance. Further, the organic underlayer film 2 is desirably crosslinked by heat or acid after formed by spin coating because the organic underlayer film 2 is supposed to not mix with a silicon-containing middle layer film to be formed thereon.

Then, such a silicon-containing middle layer film 3 is formed on the organic underlayer film 2 by spin coating using the inventive composition for forming a silicon-containing film (FIG. 1(c)). Subsequently, a photoresist film 4 is formed thereon by spin coating (FIG. 1(d)).

The photoresist film 4 is subjected to photolithography by a usual pattern exposure using, for example, ArF excimer laser beam. Thus, a pattern is formed in the photoresist film 4 (FIG. 1(e)). After heat treatment under a condition matching with the photoresist film, development with an alkaline developer and then, if necessary, rinsing are performed, so that a positive resist pattern (upper layer resist pattern) can be obtained (FIG. 1(f)).

Next, using this resist pattern as an etching mask, dry etching is performed, for example, with fluorine-based gas plasma under a dry etching condition where the etching speed of the silicon-containing middle layer film 3 is significantly high relative to the photoresist film. As a result, a silicon-containing middle layer film pattern can be obtained with little influence from pattern change due to the side etching of the resist film (FIG. 1(g)).

Next, the organic underlayer film 2 is etched under a dry etching condition where the etching speed of the organic underlayer film 2 is significantly high relative to the substrate having the silicon-containing middle layer film pattern obtained by transferring the upper layer resist pattern. The etching may be, for example, reactive dry etching with gas plasma containing oxygen, or reactive dry etching with gas plasma containing hydrogen and nitrogen. By this etching step, an organic underlayer film pattern is obtained (FIG. 1(h)). In this event, to keep the rectangular shape of the organic film pattern after the dry etching, a portion of the silicon-containing middle layer film is left on the organic film pattern.

The remaining of this silicon film is washed and removed by wet processing using a stripping liquid (FIG. 1(i)). The stripping liquid used in this event is preferably a stripping liquid containing a fluoride ion or a stripping liquid containing a nitrogen-containing cation. Generally, diluted hydrofluoric acid, an ammonium fluoride aqueous solution, SC1, a tetraalkylammonium aqueous solution, a tetraalkylammonium-containing organic solvent, a water-containing tetraalkylammonium-containing organic solvent, and the like are known, one of which is selected depending on the substrate material. A tetraalkylammonium aqueous solution and a tetraalkylammonium-containing organic solvent are most preferable because these allow wider selections of the substrate material. A fluoride ion-containing aqueous solution and SC1 can be used when substrate materials are appropriate.

Subsequently, a thin film made of polysilicon, amorphous silicon, silicon oxide, silicon nitride, silicon oxynitride, silicon carbide, a composite material thereof, or the like is formed by a CVD method or an ALD method to cover the resultant organic underlayer film pattern (FIG. 1(j)). The thin film is dry-etched to expose the upper portion of the organic film (FIG. 1(k)). The exposed organic film is removed by wet processing or dry etching, making it possible to form a pattern whose pitch is ½ of that of the exposure pattern (FIG. 1(l)). Using the obtained pattern as an etching mask, the body 1 to be processed is dry-etched, for example, by employing fluorine-based dry etching or chlorine-based dry etching. Thus, the body to be processed can be etched precisely, thereby transferring the pattern whose pitch is ½ of that of the exposure pattern to the body 1 to be processed (FIG. 1(m)).

Note that, in the above-described process according to the 3-layer resist method, an organic hard mask formed by a CVD method is also applicable in place of the organic underlayer film 2. In this case also, the body 1 to be processed can be processed by the same procedure as described above.

Moreover, the inventive composition for forming a silicon-containing film can also be used in the following patterning processes.

Embodiment 1

The present invention can provide a patterning process including:

forming an organic underlayer film on a body to be processed by using a coating-type organic underlayer film material;

forming a silicon-containing middle layer film on the organic underlayer film by using the inventive composition for forming a silicon-containing film;

forming a photoresist film on the silicon-containing middle layer film by using a chemically amplified resist composition;

after heat treatment, exposing the photoresist film to an EUV beam and dissolving an exposed portion of the photoresist film by using an alkaline developer to form a positive pattern;

transferring the pattern to the silicon-containing middle layer film by dry etching using the photoresist film having the formed positive pattern as a mask;

transferring the pattern to the organic underlayer film by dry etching using the silicon-containing middle layer film having the transferred pattern as a mask; and further transferring the pattern to the body to be processed by dry etching using the organic underlayer film having the transferred pattern as a mask (what is called "multilayer resist method").

Embodiment 2

The present invention can provide a patterning process including:

forming an organic hard mask mainly containing carbon on a body to be processed by a CVD method;

forming a silicon-containing middle layer film on the organic hard mask by using the inventive composition for forming a silicon-containing film;

forming a photoresist film on the silicon-containing middle layer film by using a chemically amplified resist composition;

after heat treatment, exposing the photoresist film to an EUV beam and dissolving an exposed portion of the photoresist film by using an alkaline developer to form a positive pattern;

transferring the pattern to the silicon-containing middle layer film by dry etching using the photoresist film having the formed positive pattern as a mask;

transferring the pattern to the organic hard mask by dry etching using the silicon-containing middle layer film having the transferred pattern as a mask; and further transferring the pattern to the body to be processed by dry etching using the organic hard mask having the transferred pattern as a mask (what is called "multilayer resist method").

When a pattern is formed by such methods, the combination with the CVD film or the organic underlayer film is optimized as described above, so that the pattern formed in the photoresist can be formed onto the substrate without changing the size during the transfer.

In a positive patterning process, after photoresist film formation and heat treatment, exposure and alkaline development with alkaline developer are carried out to obtain a positive resist pattern. In addition, it is preferable to perform post exposure bake (PEB) after the exposure.

As the alkaline developer, tetramethylammonium hydroxide (TMAH) can be used, for example.

EXAMPLE

Hereinafter, the present invention will be specifically described with reference to Synthesis Examples, Examples, and Comparative Examples. However, the present invention is not limited to these descriptions. Note that, in the following examples, % means mass %, and the molecular weight measurement was carried out by GPC.

Synthesis Example 1

To a mixture containing 120 g of methanol, 0.1 g of 10% nitric acid, and 60 g of deionized water, a mixture containing 20.4 g of Compound 2, 45.7 g of Compound 3, and 17.7 g of Compound 5 was added and maintained at 40° C. for 12 hours to perform hydrolysis condensation. After completion of the reaction, 500 g of propylene glycol ethyl ether (PGEE) was added thereto. Then, the water used for the hydrolysis condensation and by-produced alcohol were distilled off under reduced pressure. Thus, 450 g of PGEE solution of Polysiloxane Compound 1 was obtained (compound concentration: 10%). The molecular weight thereof was measured in terms of polystyrene and found Mw=2,700.

[Synthesis Example 2] to [Synthesis Example 10] were carried out under the same conditions as in Synthesis Example 1 by using monomers shown in Table 1 to obtain target products of Polysiloxane Compounds 2 to 10.

TABLE 1

| Synthesis Example | Raw materials for reaction | Mw |
|---|---|---|
| 1 | Compound 2: 20.4 g, Compound 3: 45.7 g, Compound 5: 17.7 g | 2700 |
| 2 | Compound 2: 20.4 g, Compound 3: 45.7 g, Compound 6: 18.3 g | 2600 |
| 3 | Compound 2: 20.4 g, Compound 3: 45.7 g, Compound 7: 19.2 g | 2300 |
| 4 | Compound 2: 20.4 g, Compound 3: 45.7 g, Compound 8: 20.1 g | 2200 |
| 5 | Compound 2: 20.4 g, Compound 3: 45.7 g, Compound 9: 19.9 g | 2200 |
| 6 | Compound 2: 20.4 g, Compound 3: 45.7 g, Compound 10: 20.5 g | 2400 |
| 7 | Compound 2: 17.0 g, Compound 3: 45.7 g, Compound 6: 18.3 g, Compound 11: 7.3 g | 2500 |
| 8 | Compound 2: 17.0 g, Compound 3: 45.7 g, Compound 6: 18.3 g, Compound 12: 8.3 g | 2500 |
| 9 | Compound 2: 17.0 g, Compound 3: 45.7 g, Compound 6: 18.3 g, Compound 13: 9.0 g | 2200 |
| 10 | Compound 1: 9.9 g, Compound 2: 20.4 g, Compound 3: 45.7 g | 2400 | compound 1: PhSi(OCH$_3$)$_3$
compound 2: CH$_3$Si(OCH$_3$)$_3$
compound 3: Si(OCH$_3$)$_4$
compound 5:

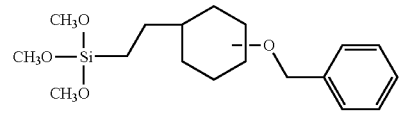

compound 6:

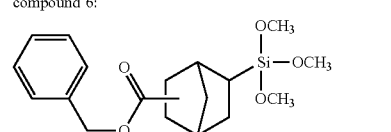

compound 7:

compound 8:

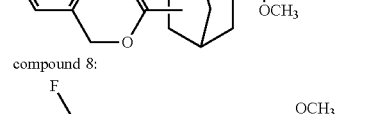

compound 9:

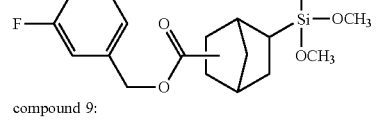

compound 10:

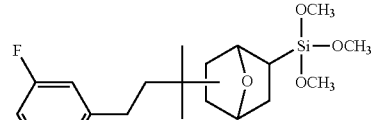

compound 11:

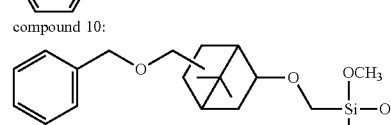

compound 12:

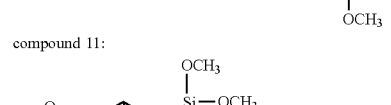

TABLE 1-continued

| Synthesis Example | Raw materials for reaction | Mw |
|---|---|---|
| compound 13: | (structure: cyclohexyl ester-norbornyl-Si(OCH3)3) | 5 |

Examples, Comparative Examples

Polysiloxane Compounds 1 to 10 obtained in Synthesis Examples, crosslinking catalysts, an acid, photo-acid generators, solvents, and water were mixed at ratios shown in Table 2. Each mixture was filtered through a 0.1-μm filter made of fluorinated resin. Thus, composition solutions for forming a polysiloxane underlayer film were prepared and referred to as Sols. 1 to 18, hereinbelow.

TABLE 2

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 1 | Compound 1 (1) | TPSNO$_3$ (0.01) | none | maleic acid (0.01) | PGEE (100) | water (10) |
| Sol. 2 | Compound 2 (1) | TMPANO$_3$ (0.01) | none | maleic acid (0.01) | PGEE (100) | water (10) |
| Sol. 3 | Compound 2 (1) | QMAMA (0.01) | none | maleic acid (0.01) | PGEE (100) | water (10) |
| Sol. 4 | Compound 2 (1) | QMATFA (0.01) | none | maleic acid (0.01) | PGEE (100) | water (10) |
| Sol. 5 | Compound 3 (1) | TPSNO$_3$ (0.01) | none | maleic acid (0.01) | PGEE (100) | water (10) |
| Sol. 6 | Compound 3 (1) | TPSMA (0.01) | none | maleic acid (0.01) | PGEE (100) | water (10) |
| Sol. 7 | Compound 3 (1) | QBANO$_3$ (0.01) | none | maleic acid (0.01) | PGEE (100) | water (10) |
| Sol. 8 | Compound 3 (1) | Ph$_2$ICl (0.01) | none | maleic acid (0.01) | PGEE (100) | water (10) |
| Sol. 9 | Compound 3 (1) | TPSNO$_3$ (0.01) | TPSNf (0.01) | maleic acid (0.01) | PGEE (100) | water (10) |
| Sol. 10 | Compound 3 (1) | TPSNO$_3$ (0.01) | TPSNf (0.01) | maleic acid (0.01) | PGEE (90) GBL (10) | water (10) |
| Sol. 11 | Compound 3 (1) | QBANO$_3$ (0.01) | TPSNf (0.01) | maleic acid (0.01) | PGEE (100) | water (10) |
| Sol. 12 | Compound 4 (1) | TPSNO$_3$ (0.01) | none | maleic acid (0.01) | PGEE (90) PGME (10) | water (10) |
| Sol. 13 | Compound 5 (1) | TMPANO$_3$ (0.01) | PAG-1 (0.01) | maleic acid (0.01) | PGEE (90) DAA (10) | water (10) |
| Sol. 14 | Compound 6 (1) | TPSNO$_3$ (0.01) | PAG-1 (0.01) | maleic acid (0.01) | PGEE (100) | water (10) |
| Sol. 15 | Compound 7 (1) | TPSNO$_3$ (0.01) | none | maleic acid (0.01) | PGEE (100) | water (10) |
| Sol. 16 | Compound 8 (1) | TPSNO$_3$ (0.01) | none | maleic acid (0.01) | PGEE (100) | water (10) |
| Sol. 17 | Compound 9 (1) | TPSNO$_3$ (0.01) | none | maleic acid (0.01) | PGEE (100) | water (10) |
| Sol. 18 | Compound 10 (1) | TPSNO$_3$ (0.01) | none | maleic acid (0.01) | PGEE (100) | water (10) |

The raw materials shown by abbreviations in Table 2 are as follows.

TPSNO$_3$ . . . triphenylsulfonium nitrate
TPSMA . . . mono(triphenylsulfonium)maleate
QMAMA . . . mono(tetramethylammonium)maleate
QMATFA . . . tetramethylammonium trifluoroacetate
QBANO$_3$ . . . tetrabutylammonium nitrate
Ph$_2$ICl . . . diphenyliodonium chloride
TMPANO$_3$ . . . trimethylphenylammonium nitrate
TPSNf . . . triphenylsulfonium nonafluorobutanesulfonate
PAG-1 . . . see the following formula
PGEE . . . propylene glycol ethyl ether
PGME . . . propylene glycol methyl ether
GBL . . . gamma-butyrolactone
DAA . . . diacetone alcohol

PAG-1

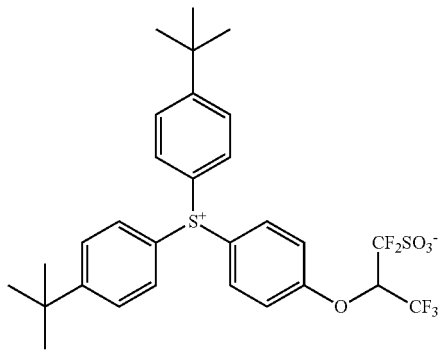

Reference Examples

[Patterning Test by Positive Development]

On a silicon wafer, a spin-on carbon film ODL-102 (carbon content: 89 mass %) manufactured by Shin-Etsu Chemical CO., Ltd. was formed to have a film thickness of 200 nm. The spin-on carbon film was coated with one of the composition Sols. 1 to 18 for forming a polysiloxane film prepared as above, and heated at 240° C. for 60 seconds. In this way, polysiloxane films each having a film thickness of 20 nm were prepared as Films 1 to 18.

Subsequently, the polysiloxane films were each coated with an ArF resist solution (PR-1) for positive development shown in Table 3, and baked at 110° C. for 60 seconds to form a photoresist layer having a film thickness of 100 nm. Further, the resulting photoresist film was coated with a liquid immersion top coat (TC-1) shown in Table 4, and baked at 90° C. for 60 seconds. In this way, top coats each having a film thickness of 50 nm were formed.

Next, these were exposed by using an ArF liquid immersion exposure apparatus (manufactured by ASML; XT-1900i, NA: 1.35, σ: 0.97/0.77, 35° polarized dipole illumination), followed by baking (PEB) at 100° C. for 60 seconds, and development with a 2.38 mass % tetramethylammonium hydroxide (TMAH) aqueous solution for 30 seconds. In this way, 40-nm 1:1 positive line-and-space patterns were obtained.

Each dimension was observed with an electron microscope (CG5000) manufactured by Hitachi High-Technologies Corporation to check pattern collapse, and the sectional profile was observed with an electron microscope (S-9380) manufactured by Hitachi, Ltd. (Table 5).

TABLE 3

| No. | Polymer (parts by mass) | Acid generator (parts by mass) | Base (parts by mass) | Water-repellent polymer (parts by mass) | Solvent (parts by mass) |
|---|---|---|---|---|---|
| PR-1 | ArF resist polymer 1 (100) | PAG1 (7.0) | Quencher (1.0) | none | PGMEA (2,500) |

ArF resist polymer 1:
Molecular weight (Mw) = 7,800
Dispersity (Mw/Mn) = 1.78

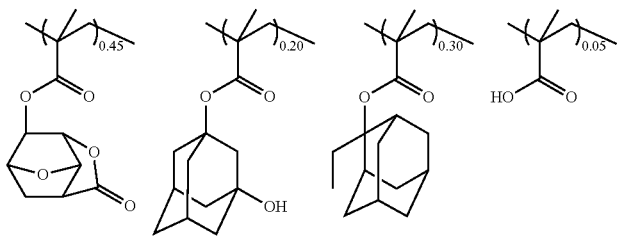

Acid generator: PAG1

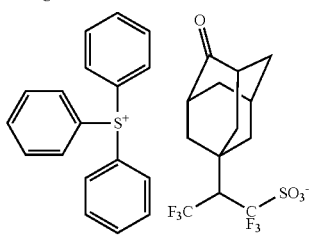

TABLE 3-continued

| No. | Polymer (parts by mass) | Acid generator (parts by mass) | Base (parts by mass) | Water-repellent polymer (parts by mass) | Solvent (parts by mass) |
|---|---|---|---|---|---|

Base: Quencher

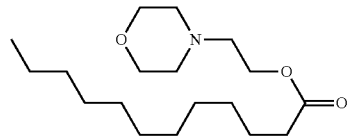 [SMILES: CCCCCCCCCCCC(=O)OCCN1CCOCC1]

TABLE 4

| | Polymer (parts by mass) | Organic solvent (parts by mass) |
|---|---|---|
| TC-1 | top coat polymer (100) | diisoamyl ether (2700) 2-methyl-1-butanol (270) |

Top coat polymer

Molecular weight (Mw) = 8,800

Dispersity (Mw/Mn) = 1.69

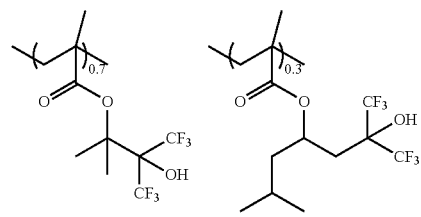

TABLE 5

| Example | Polysiloxane film | Pattern sectional profile after development | Pattern collapse |
|---|---|---|---|
| Reference Example 1 | Film 1 | vertical profile | none |
| Reference Example 2 | Film 2 | vertical profile | none |
| Reference Example 3 | Film 3 | vertical profile | none |
| Reference Example 4 | Film 4 | vertical profile | none |
| Reference Example 5 | Film 5 | vertical profile | none |
| Reference Example 6 | Film 6 | vertical profile | none |
| Reference Example 7 | Film 7 | vertical profile | none |
| Reference Example 8 | Film 8 | vertical profile | none |
| Reference Example 9 | Film 9 | vertical profile | none |
| Reference Example 10 | Film 10 | vertical profile | none |
| Reference Example 11 | Film 11 | vertical profile | none |
| Reference Example 12 | Film 12 | vertical profile | none |
| Reference Example 13 | Film 13 | vertical profile | none |
| Reference Example 14 | Film 14 | vertical profile | none |
| Reference Example 15 | Film 15 | vertical profile | none |
| Reference Example 16 | Film 16 | vertical profile | none |
| Reference Example 17 | Film 17 | vertical profile | none |
| Reference Example 18 | Film 18 | vertical profile | none |

As shown in Table 5, when the polysiloxane films were used as resist underlayer films, the vertical resist cross sections were obtained in the positive development. Moreover, no pattern collapse was found.

Examples, Comparative Examples

[Wet Etching Test on Coated Films]

A silicon wafer was spin-coated with one of the composition Sols. 1 to 18 for forming a polysiloxane film, and heated at 240° C. for 60 seconds for film formation. In this way, polysiloxane films each having a film thickness of 20 nm were prepared as Films 1 to 18, and measured with a high-speed spectroscopic ellipsometer M-2000 manufactured by J.A. Woollam Co. These films were soaked in a 2.38% tetramethylammonium aqueous solution, which is an alkaline developer for resist, at 23° C. for 1 minute. The film thicknesses of the resulting polysiloxane films were measured in the same manner. Table 6 shows the result.

TABLE 6

| No. | Film thickness (A) before treatment | Change (A) after treatment |
|---|---|---|
| Film 1 | 197.3 | 0.4 |
| Film 2 | 200.7 | 0.1 |
| Film 3 | 204.7 | 0.2 |
| Film 4 | 198.8 | 0.2 |
| Film 5 | 202.2 | 0.4 |
| Film 6 | 201.9 | 0.3 |
| Film 7 | 197.9 | 0.3 |
| Film 8 | 200.7 | 0.5 |
| Film 9 | 202.7 | 0.4 |
| Film 10 | 202.7 | 0.3 |
| Film 11 | 197.1 | 0.4 |
| Film 12 | 198.3 | 0.2 |
| Film 13 | 202.6 | 0.4 |
| Film 14 | 202.0 | 0.3 |
| Film 15 | 201.1 | 0.4 |
| Film 16 | 197.3 | 0.2 |
| Film 17 | 196.8 | 0.1 |
| Film 18 | 197.6 | 0.2 |

It was found that the polysiloxane films Films 1 to 18 formed from the composition Sols. 1 to 18 for forming a polysiloxane film has resistance to the alkaline developer.

[Wet Etching Test on Coated Films after Dry Etching]

A silicon wafer was spin-coated with one of the composition Sols. 1 to 18 for forming a polysiloxane film, and heated at 240° C. for 160 seconds for film formation. In this way, polysiloxane films each having a film thickness of 40 nm were prepared as Films 1 to 18. Then, dry etching was performed under the following conditions using an etching apparatus Telius manufactured by Tokyo Electron Limited.

Chamber pressure: 2.0 Pa

RF power: 500 W

Ar gas flow rate: 75 sccm $O_2$ gas flow rate: 45 sccm

Time: 120 sec

The resulting films were soaked in a 0.5% tetramethylammonium aqueous solution at 50° C. for 3 minutes. The resultant film thicknesses were measured with a high-speed spectroscopic ellipsometer M-2000 manufactured by J.A. Woollam Co. Table 7 shows the result.

TABLE 7

| Example | No. | Film thickness (A) before treatment | Film thickness (A) after dry etching treatment | Film thickness (A) after alkaline aqueous solution treatment |
|---|---|---|---|---|
| Example 1 | Film 1 | 197.3 | 194.2 | <5.0 |
| Example 2 | Film 2 | 200.7 | 193.6 | <5.0 |
| Example 3 | Film 3 | 204.7 | 192.3 | <5.0 |
| Example 4 | Film 4 | 198.8 | 191.3 | <5.0 |
| Example 5 | Film 5 | 202.2 | 191.4 | <5.0 |
| Example 6 | Film 6 | 201.9 | 192.7 | <5.0 |
| Example 7 | Film 7 | 197.9 | 195.4 | <5.0 |
| Example 8 | Film 8 | 200.7 | 190.5 | <5.0 |
| Example 9 | Film 9 | 202.7 | 196.7 | <5.0 |
| Example 10 | Film 10 | 202.7 | 194.9 | <5.0 |
| Example 11 | Film 11 | 197.1 | 191.1 | <5.0 |
| Example 12 | Film 12 | 198.3 | 194.3 | <5.0 |
| Example 13 | Film 13 | 202.6 | 194.0 | <5.0 |
| Example 14 | Film 14 | 202.0 | 196.9 | <5.0 |
| Example 15 | Film 15 | 201.1 | 194.6 | <5.0 |
| Example 16 | Film 16 | 197.3 | 193.3 | <5.0 |
| Example 17 | Film 17 | 196.8 | 194.0 | <5.0 |
| Comparative Example 1 | Film 18 | 197.6 | 196.6 | 119.0 |

When the polysiloxane films Films 1 to 17 formed from the inventive composition Sols. 1 to 17 for forming an alicyclic organic group-containing polysiloxane film were dry-etched and then treated with the alkaline aqueous solution, it was verified that Films 1 to 17 were separable by washing. Meanwhile, it was found that Film 18 containing no alicyclic structure had resistance to the alkaline aqueous solution.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A thermosetting silicon-containing compound comprising one or more of structural units shown by the following general formulae (Sx-1), (Sx-2), and (Sx-3):

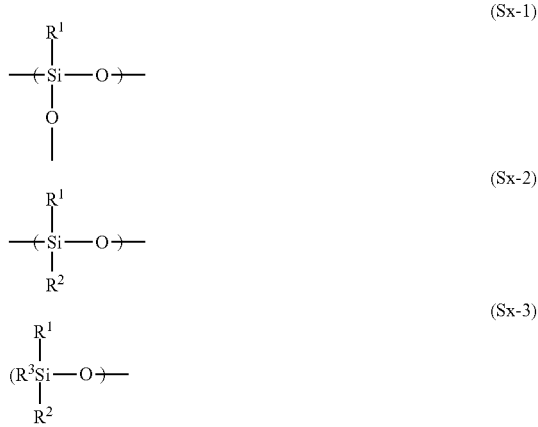

wherein $R^1$ represents a monovalent organic group shown by the following general formula (Sx-R1); and $R^2$ and $R^3$ each represent the R or a monovalent organic group having 1 to 30 carbon atoms, $$—R^1 \text{ is } —R^1\text{-}R^{12}\text{-}R^1\text{-}R^{14}\text{-}R^1 \quad (Sx\text{-}R^1)$$

wherein $R^{11}$ represents a single bond or any of structures shown by the following formula (1): $R^{12}$ represents any of structures having rings shown by the following formula (2): $R^{13}$ represents a single bond or any of structures shown by the following formula (3): $R^{14}$ represents a single bond or any of structures shown by the following formula (4): $R^{15}$ represents any of structures shown by the following formula (T): given that when both $R^{13}$ and $R^{14}$ are single bonds, $R^{15}$ is directly bonded to $R^{12}$: when $R^{14}$ is a single bond, a part of $R^{13}$ bonded to $R^{15}$ is only a carbon atom (but not carbon of a carbonyl group) or a silicon atom, $$(Si)—CH_2—(R^{12})(Si)—CH_2O—(R^{12})(Si)—CH_2CH_2—(R^{12}) \quad (1)$$

wherein (Si) and $(R^{12})$ do not constitute $R^{11}$,

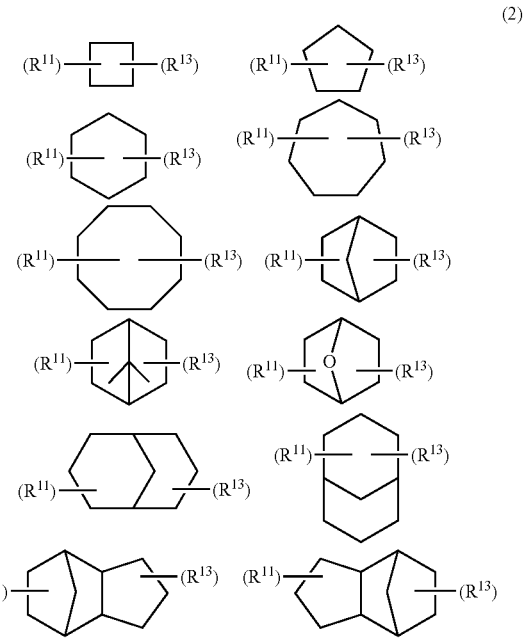

-continued

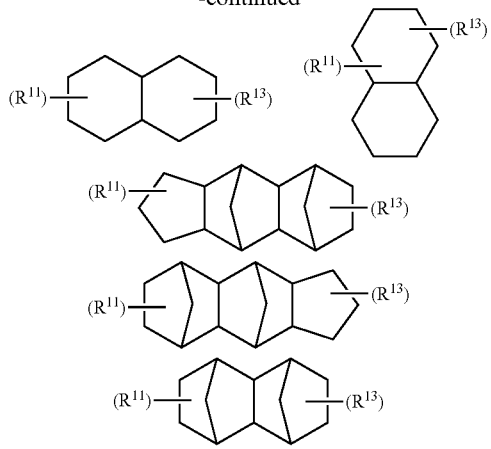

wherein (R$^{11}$) and (R$^{13}$) do not constitute R$^{12}$,

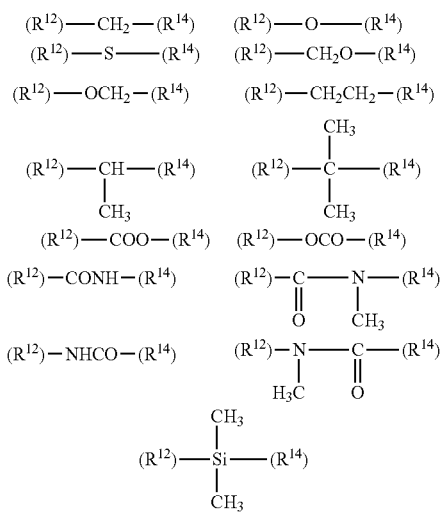

wherein (R$^{12}$) and (R$^{14}$) do not constitute R$^{13}$, and

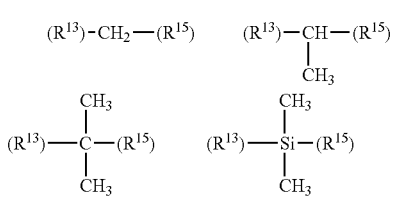

wherein (R$^{13}$) and (R$^{15}$) do not constitute R$^{14}$,

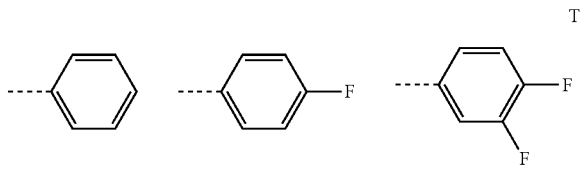

-continued

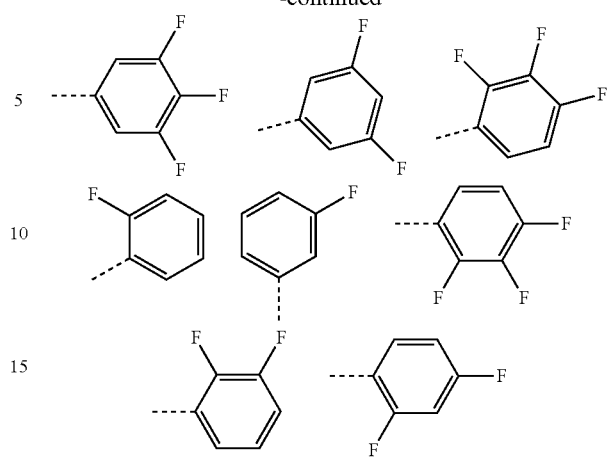

wherein dashed lines in the formula (T) represents a bonding arm with R$^{14}$.

2. A composition for forming a silicon-containing film, comprising:

a thermosetting silicon-containing compound comprising one or more of structural units shown by the following general formulae (Sx-1), (Sx-2), and (Sx-3):

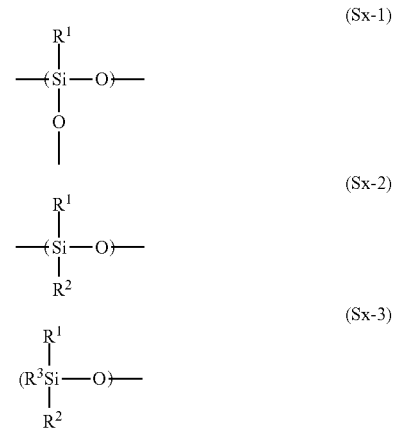

wherein R$^1$ represents a monovalent organic group shown by the following general formula (Sx-R1):

—R$^1$ is —R$^{11}$-R$^{12}$-R$^{13}$-R$^{14}$-R$^{15}$ (Sx-R1)

wherein R$^{11}$ represents a single bond or any of structures shown by the following formula (1); R$^{12}$ represents any of structures having rings shown by the following formula (2); R$^{13}$ represents a single bond or any of structures shown by the following formula (3); R$^{14}$ represents a single bond or any of structures shown by the following formula (4); R$^{15}$ represents a phenyl group optionally having a substituent; given that when both R$^{13}$ and R$^{14}$ are single bonds, R$^{15}$ is directly bonded to R$^{12}$; when R$^{14}$ is a single bond, a part of R$^{13}$ bonded to R$^{15}$ is only a carbon atom (but not carbon of a carbonyl group) or a silicon atom,

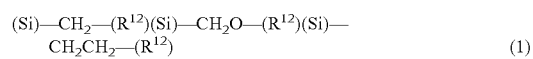
(1)

wherein (Si) and ($R^{12}$) do not constitute $R^{11}$, (2)
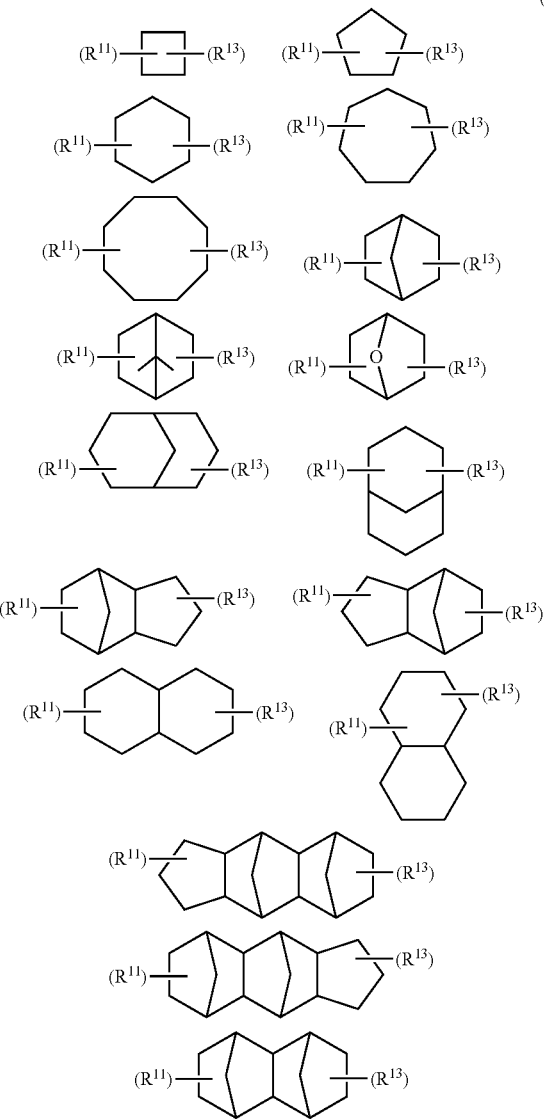

wherein ($R^{11}$) and ($R^{13}$) do not constitute $R^{12}$, (3)
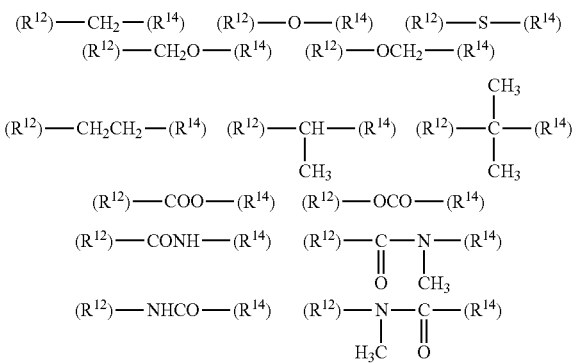

-continued
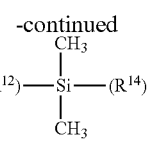

wherein ($R^{12}$) and ($R^{14}$) do not constitute $R^{13}$, and (4)
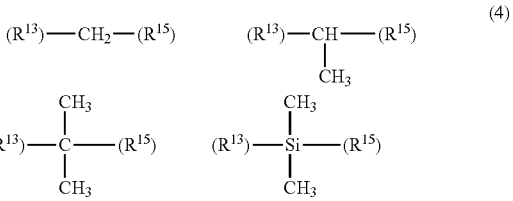

wherein ($R^{13}$) and ($R^{15}$) do not constitute $R^{14}$;
$R^2$ and $R^3$ each represent $R^1$ or a monovalent organic group having 1 to 30 carbon atoms; and
a crosslinking catalyst, wherein the crosslinking catalyst is a sulfonium salt, an iodonium salt, a phosphonium salt, an ammonium salt, an alkaline metal salt, or a polysiloxane having a structure partially containing any of a sulfonium salt, an iodonium salt, a phosphonium salt, and an ammonium salt.

3. The composition for forming a silicon-containing film according to claim 2, further comprising at least one compound shown by the following general formula (P-0):

(P-0)
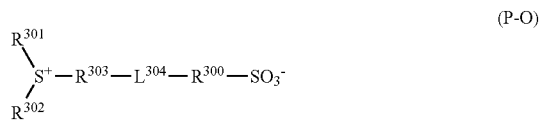

wherein $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom; $R^{303}$ represents a linear, branched, or cyclic divalent hydrocarbon group having 1 to 20 carbon atoms optionally substituted with a hetero atom or optionally containing a hetero atom; $R^{301}$ and $R^{302}$, or $R^{301}$ and $R^{303}$, are optionally bonded to each other to form a ring with a sulfur atom in the formula; and $L^{304}$ represents a single bond or a linear, branched, or cyclic divalent hydrocarbon group having 1 to 20 carbon atoms optionally substituted with a hetero atom or optionally containing a hetero atom.

4. The composition for forming a silicon-containing film according to claim 3, wherein the compound shown by the general formula (P-0) is a compound shown by the following general formula (P-1):

(P-1)
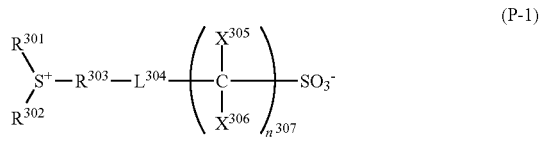

wherein $X^{305}$ and $X^{306}$ each independently represent a hydrogen atom, a fluorine atom, or a trifluoromethyl group, but not all of $X^{305}$'s and $X^{306}$'s are hydrogen atoms simultaneously; $n^{307}$ represents an integer of 1 to 4; and $R^{301}$, $R^{302}$, $R^{303}$, and $L^{304}$ are as defined above.

5. A patterning process comprising steps of:

(1) forming on a body to be processed, an organic underlayer film, a silicon-containing middle layer film made from the composition for forming a silicon-containing film according to claim 2, thereon, and further an upper layer resist film thereon;

(2) subjecting the upper layer resist film to exposure and development to form an upper layer resist pattern;

(3) transferring the upper layer resist pattern to the silicon-containing middle layer film by dry etching using the upper layer resist pattern as a mask, and further transferring the upper layer resist pattern to the organic underlayer film by dry etching using the silicon-containing middle layer film having the transferred upper layer resist pattern as a mask while a portion of the silicon-containing middle layer film is left on an upper portion of the organic underlayer film to form an organic underlayer film pattern;

(4) removing the silicon-containing middle layer film remaining on the upper portion of the organic underlayer film pattern with a stripping liquid;

(5) forming an inorganic silicon film made of polysilicon, amorphous silicon, silicon oxide, silicon nitride, silicon oxynitride, silicon carbide, or a composite material thereof by a CVD method or an ALD method to cover the organic underlayer film pattern;

(6) removing a portion of the inorganic silicon film by dry etching to expose the upper portion of the organic underlayer film pattern; and (7) removing the organic underlayer film pattern to form an inorganic silicon film pattern whose pattern pitch is ½ of that of the upper layer resist pattern.

6. The patterning process according to claim 5, wherein, in the step (4), the stripping liquid contains one or both of a fluoride ion and a nitrogen-containing cation.

7. The patterning process according to claim 5, wherein the body to be processed is a semiconductor device substrate, or the semiconductor device substrate coated with a metal film, an alloy film, a metal carbide film, a metal oxide film, a metal nitride film, a metal oxycarbide film, or a metal oxynitride film.

8. The patterning process according to claim 5, wherein the metal of the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

* * * * *